(12) United States Patent
End, III

(10) Patent No.: US 6,624,762 B1
(45) Date of Patent: Sep. 23, 2003

(54) HARDWARE-BASED, LZW DATA COMPRESSION CO-PROCESSOR

(75) Inventor: Joseph H End, III, Malvern, PA (US)

(73) Assignee: Unisys Corporation, Blue Bell, PA (US)

(*) Notice: Subject to any disclaimer, the term of this patent is extended or adjusted under 35 U.S.C. 154(b) by 0 days.

(21) Appl. No.: 10/120,467

(22) Filed: Apr. 11, 2002

(51) Int. Cl.⁷ .......................... G06F 7/00; G06F 15/00; H03M 7/34; H03M 7/38
(52) U.S. Cl. ........................................ 341/51; 708/203
(58) Field of Search ................................. 341/51, 55, 63, 341/67, 79, 95, 106, 107, 50, 87; 358/1.15; 382/232; 707/10, 101; 708/203

(56) References Cited

U.S. PATENT DOCUMENTS

| | | | |
|---|---|---|---|
| 4,464,650 A | 8/1984 | Eastman et al. | 341/51 |
| 4,558,302 A | 12/1985 | Welch | 341/51 |
| 4,701,745 A | 10/1987 | Waterworth | 341/63 |
| 4,814,746 A | 3/1989 | Miller et al. | 341/95 |
| 4,876,541 A | 10/1989 | Storer | 341/95 |
| 4,906,991 A | 3/1990 | Fiala et al. | 341/51 |
| 5,001,478 A | 3/1991 | Nagy | 341/67 |
| 5,003,307 A | 3/1991 | Whiting et al. | 341/51 |
| 5,016,009 A | 5/1991 | Whiting et al. | 341/67 |
| 5,051,745 A | 9/1991 | Katz | 341/51 |
| 5,126,739 A | 6/1992 | Whiting et al. | 341/106 |
| 5,140,321 A | 8/1992 | Jung | 341/55 |
| 5,155,484 A | 10/1992 | Chambers, IV | 341/55 |
| 5,179,378 A * | 1/1993 | Ranganathan et al. | 341/51 |
| 5,243,341 A * | 9/1993 | Seroussi et al. | 341/51 |
| 5,412,384 A | 5/1995 | Chang et al. | 341/79 |
| 5,452,405 A | 9/1995 | Vondran, Jr. | 358/1.15 |
| 5,455,576 A * | 10/1995 | Clark et al. | 341/50 |
| 5,469,161 A * | 11/1995 | Bezek | 341/51 |
| 5,475,388 A | 12/1995 | Gormish et al. | 341/107 |
| 5,532,693 A | 7/1996 | Winters et al. | 341/51 |
| 5,838,264 A | 11/1998 | Cooper | 341/106 |
| 5,870,497 A | 2/1999 | Galbi et al. | 382/232 |
| 5,903,230 A | 5/1999 | Masenas | 341/51 |
| 5,951,623 A * | 9/1999 | Reynar et al. | 708/203 |
| 6,040,790 A | 3/2000 | Law | 341/65 |

\* cited by examiner

*Primary Examiner*—Patrick Wamsley
(74) *Attorney, Agent, or Firm*—Lise A. Rode; Mark T. Starr; Woodcock Washburn LLP

(57) ABSTRACT

The present invention is directed to an improved system for creating LZW compressed files by executing the LZW data compression algorithm on a plurality of special-purposed pipelined processing units, each of which contains hardware-embedded control algorithms. The data paths of the plurality of processors, together with the state machines that control the flow of data through them, provide pipelined execution of the LZW algorithm. For example, at the same instant, processor three can be processing a first input byte, processor two can be processing a second input byte, and processor one can be processing a third input byte.

35 Claims, 30 Drawing Sheets

LZW COMPRESSION GENERAL FLOW

LZW Manager Processor Control States

HASH TABLE CONTROLLER
DETAILED DATA PATH BLOCK DIAGRAM

HASH TABLE CONTROLLER
DETAILED DATA PATH BLOCK DIAGRAM
Highlight -- Clearing Hash Table entries to 1FFFh

*HASH TABLE CONTROLLER
DETAILED DATA PATH BLOCK DIAGRAM
Highlight – Loading Prehashed Roots into Hash Table*

HASH TABLE CONTROLLER
DETAILED DATA PATH BLOCK DIAGRAM
Highlight – New Prefix Write Path HASH TABLE PROCESSOR
MAJOR DATA PATH BLOCK DIAGRAM
Figure 14 Clock Cycle 1 of 2

**HASH TABLE PROCESSOR
MAJOR DATA PATH BLOCK DIAGRAM
Clock Cycle 2 of 2**

Hash Table Processor
Hash Address Calculator States

Hash Table Processor
Hash Table Controller States

*HASH TABLE CONTROLLER*
*DETAILED DATA PATH BLOCK DIAGRAM*
*Highlight – Hash Table READ Path (String Compare)*

LZW DICTIONARY PROCESSOR
DATA PATH BLOCK DIAGRAM
Figure 21 - New Prefix Write

Figure 22 - CLOSE FILE sequence, Last Code Word alternatives.

LZW DICTIONARY PROCESSOR DATA PATH BLOCK DIAGRAM
Figure 23 - OPEN DICTIONARY LZW Dictionary Processor Control State Diagram LZW Code Word Assembly Processor
9 Bit Code Word Size State Sequence NOTE: THE STATE NUMBER CORRESPONDS TO THE CODE
BYTE FIELD ALIGNMENT SELECT VALUE.

*LZW CODE WORD ASSEMBLY PROCESSOR
10 BIT CODE WORD SIZE STATE SEQUENCE*

**LZW Code Word Assembly Processor
11 Bit Code Word Size State Sequence

Note: The state number corresponds to the Code Byte field alignment select value.

LZW Code Word Assembly Processor
12 Bit Code Word Size State Sequence

Note: The state number corresponds to the Code Byte field alignment select value.

LZW Code Word Assembly Register
Code Word and Code Byte Field Alignment Diagram

HARDWARE-BASED, LZW DATA COMPRESSION CO-PROCESSOR

FIELD OF THE INVENTION

This invention relates to the field of data compression and in particular to a hardware implementation of an LZW compression algorithm that comprises a plurality of independent, special-purpose cascaded processors.

BACKGROUND

It is frequently necessary or helpful for large quantities of information to be quickly transmitted over a network using limited bandwidth. Often servers accomplish this task with software compression, whereby the quantity of data that is transferred is reduced. One such software compression algorithm is the LZW algorithm named for the inventors of the algorithm, Lempel, Ziv and Welch.

The LZW algorithm is widely used in industry and government to reduce the amount of storage space needed to store computer data files. The LZW algorithm is also used on low bandwidth data links such as V.42 modems to improve effective bandwidth by reducing the amount of physical (compressed) information transmitted over a communications link required to transfer a much larger amount of logical (uncompressed) information. Typically, the LZW algorithm is implemented in software executed by a single, general-purpose processor that is not optimized for LZW processing. There is a need in the art for an improved implementation of the LZW algorithm.

SUMMARY OF THE INVENTION

According to the present invention, the LZW data compression algorithm is implemented in hardware comprising a plurality of special-purpose, cascaded processors coordinated by a managing processor. Each processor includes hardware-embedded control algorithms specific to its specialized function. These algorithms are in the form of state sequences which collectively perform the LZW compression algorithm. At any instant, three processing steps of the LZW algorithm may be performed simultaneously, one step in each of the independent processors. According to one aspect of the invention, separate physical devices are used for certain data structures, enabling simultaneous access to each data structure during processing. In accordance with the invention, the processing overhead required to create an LZW compressed file is significantly reduced in terms of both component cost and computing time.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF THE INVENTION

I. Definitions

Figure 1:
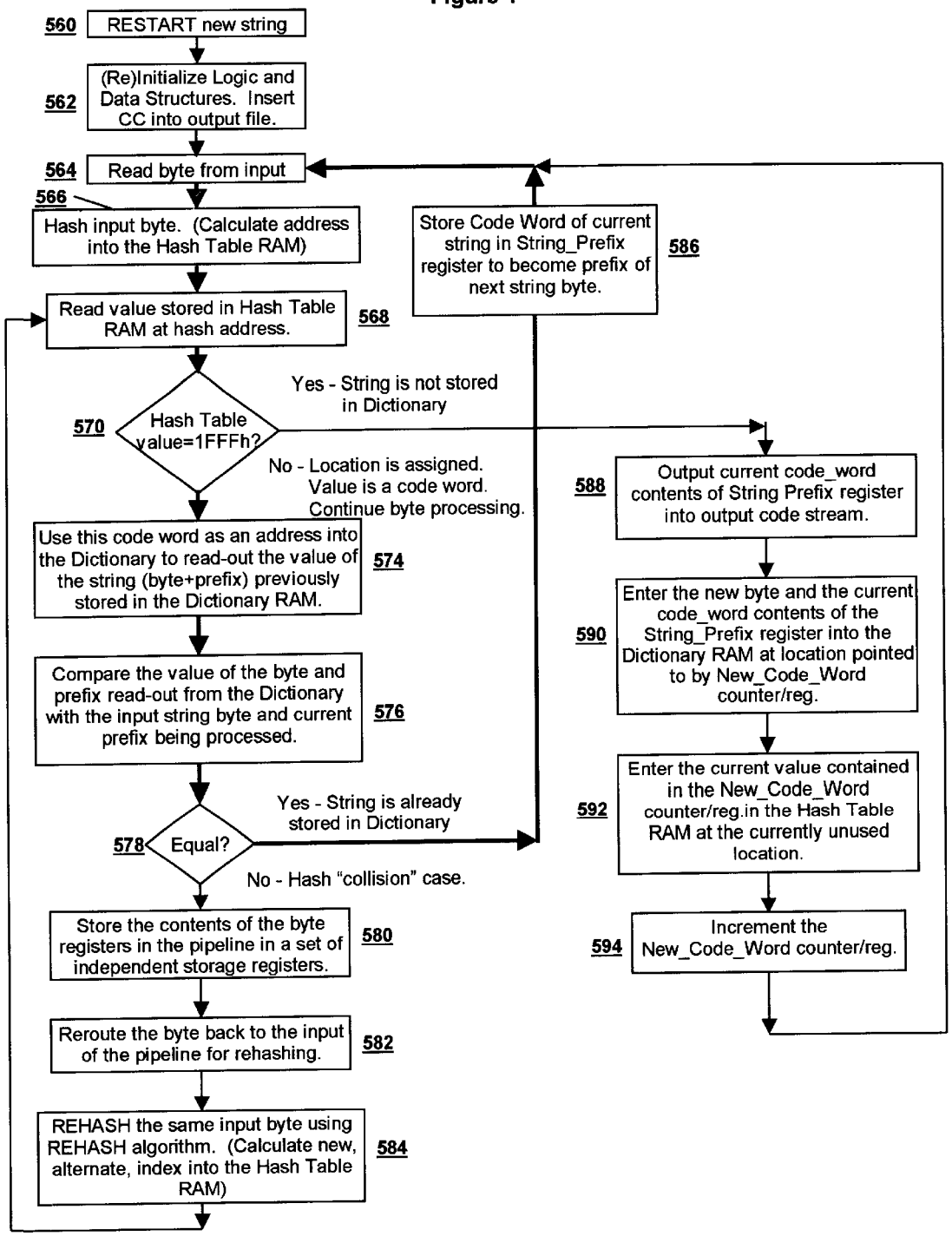
FIG. 1 is a flow diagram generally illustrating the LZW compression algorithm.

"K": When used in this document in the context of being appended to a decimal number, the term "K" is a multiplier having a decimal value of 1024. Thus, 16K is shorthand for 16*1024 and represents a decimal 16 multiplied by a decimal 1024 resulting in a decimal value of 16384.

'0':—unless otherwise indicated, a '0' when associated with a logic signal value, is equivalent to a logical FALSE.

'1':—unless otherwise indicated, a '1' when associated with a logic signal value, is equivalent to a logical TRUE.

Byte: when viewed in the specific context of a string, where a string is defined as "prefix+byte", a byte is any character from the input file. In all other contexts, a byte from the input file is termed a character. (Also, see "string" and "prefix".)

Character: any arbitrary byte from the input file. The byte may take on any one of 256 possible values of 8 bits. An unprocessed input file may be viewed as a large concatenation of ordered characters. "Character" is intended to refer to any byte other than the byte that is appended to the prefix to form a string in the Dictionary. The term "character" does not imply any form of encoding of the byte into text or graphic information.

Code_word: a word which represents an encoded character string from the input file. Concatenated code words comprise the compressed output file. Physically, it is the value of an index into the Dictionary data structure. A code_word is a pointer (link) to another location in the Dictionary. Each entry in the Dictionary contains a data byte representing a byte from a stored string from the input file, and a code_word linking it to its successor string byte. These links extend all the way back to the root and thus define a unique string of characters from the input file as previously stored in the Dictionary as a result of execution of the LZW algorithm. Each additional link to another code_word adds a character to the string represented by the assigned code_word. A single code_word in the encoded output byte stream represents a complete string because the code_word is used as an entry point into the Dictionary and the entire string of characters linked back to the root is defined by that particular code_word entry.

Compression_session: Block of compressed output data bounded by codes such as but not limited to a Clear_Code at the beginning and an End_of_Information (EOI) at the end. It represents the compression of a contiguous block of input characters from the input data file and may comprise the complete input data file. A compression session comprises a concatenated number of Dictionary sessions. In general, there will be multiple Dictionary sessions within a compression_session. Typically the last Dictionary session will be terminated prematurely because the input file has reached the end before the Dictionary has been filled. In one embodiment, a compression session is closed out with the ending of the final byte of the input file and an End-of-Information EOI code word having a value of 101h.

Dictionary: a Dictionary is a data structure comprising a set of linked lists of all strings discovered in the input file up to the current location in the input file of the byte currently being processed. Each entry in the data structure, which in one embodiment is a table, may comprise two fields: a) byte-value and b) pointer-value. The byte-value field may contain the actual value of the byte as it appears in the input file. The pointer-value may be a link to another location in the Dictionary containing the byte value of the preceding byte in the input string. The location of the preceding byte similarly may comprise a pointer-value to the byte preceding it and so on. This linking may continue until it reaches the string root that is the first character in a string. Thus the pointer value field is termed the prefix of the string since starting with the byte value and linking from the prefix value back to the root reconstructs the entire string. The root, in one embodiment, does not have an entry in the pointer-value field.

The Dictionary physical address values in one embodiment are also the value of the LZW code-words output into the encoded output file.

In one embodiment of the present invention, the Dictionary is implemented by a dedicated, discrete physical SRAM electrical component, completely independent of the Hash Table SRAM. In other embodiments, however, other components may be used to implement the Dictionary.

Dictionary_Session: Block of compressed output data bounded by delimiters such as but not limited to Clear_Code, "CC", which is a code word having a value of "100"h, at the beginning and at the end. A Dictionary Session represents the compression of a contiguous block of input characters from the input data file. The size of the compressed data block is directly related to the size of the Dictionary data structure.

Hash Address: A value, the output of a hash address calculator, used as a physical address into a Hash Table. In one embodiment, the Hash Address is a 14-bit value, requiring a 16 k address space.

Hash Collision: Case in which a hash calculation on bytes having different values produces the same hash address. A Hash Collision arises from the basic nature of hashing, in which an essentially infinite space of values is mapped onto a finite space of values, (e.g., an infinite space of string byte sequence values is mapped onto a finite set of Hash Table locations). In one embodiment a collision is detected when the Hash Table indicates that the byte has been assigned a code_word, but upon looking up the byte stored in the Dictionary at the code_word location, the bytes do not match.

Hash Index: A value obtained by executing a recursive hash calculation on a succession of string bytes presented as input data for compression. The value of the Hash Index calculated for any given byte is dependent upon all bytes that preceded it in the current string. In one embodiment, the hash index is a 16-bit value, and the Hash Index is reset to a default value of FFFFh upon starting the processing of the root of a new string. This occurs after a SW_RESTART or NEW_PFX_WR command. The Hash Index may be assigned any one of 64K values.

Hash Table: In one embodiment described more fully below, the hash table is a data base of the code words which have been assigned thus far in a Dictionary session. It is accessed by means of a hash calculation on the input character string being presented as input for compression. The calculation yields an address into the table and the table provides either the code word assigned to that string or a value indicating the string has not yet been assigned. Note that the code word in the hash table represents the entire string, up to and including the byte that resulted in a hash to the location in the hash table.

In one embodiment of the present invention, the Hash Table is implemented by a dedicated, discrete physical SRAM electrical component, completely independent of the Dictionary. In other embodiments, however, other components may be used to implement the Hash Table.

Hash Table Address: the value presented to the Hash Table data structure for accessing information stored in the Hash Table. In one embodiment, the Hash Table Address is the result of a MOD 9973 calculation on a combinational logical transformation of the 16-bit Hash Index value, limiting the size of the logical, accessible, Hash Table Data structure to 9973d locations.

Prefix: a portion of a character string represented by a code_word. It includes the root and all characters in the string except the rightmost, least significant, character, or byte. The smallest prefix is a root. Thus, the smallest unit of compressed output data represented by a code word is also a root. It should be noted that all prefixes other than roots are also strings. Furthermore, it should be noted that a code word for a prefix that represents a root actually is an expansion of the input data, since a root is an 8 bit value and its code word representation is from 9 bits to 12 bits in width. (Also, see "string".)

Root: the most significant (leftmost) character of all strings stored in the Dictionary. In the embodiment described more fully below, all roots and the two control codes are pre-loaded into the Dictionary at Initialization of each RESTART or OPEN_DICTIONARY sequence. A root entry in the Dictionary differs from other entries in that a root does not contain an associated code_word for a prefix. The reason is that the root entry is not linked to any other preceding string data value (prefix) because the root is the "head end" of a string and thus a termination point of the linked list defining the string.

Additionally, in the embodiment described below, a root is the only character of a string that is hashed using the default Hash Index value of FFFFh. All other characters use a recursive value of the Hash Index. Roots and the two control codes are also pre-hashed and loaded into the Hash Table at Initialization of each dictionary_session.

SRAM: static RAM, SRAM or S-RAM is a memory device which is capable of storing and retrieving binary values. Static RAMs do not require refresh circuitry as do dynamic RAMs.

String: an ordered group of characters from the input file to be compressed. This definition only applies to strings entered into the Dictionary. As a convention for discussion purposes only (but not in any way intended to be limiting), a string of characters is oriented such that the first character read from the file is to the left and the most recent character read from the file is on the right. All strings in the context of the LZW algorithm are represented and defined as the concatenation of a string prefix plus byte (prefix+byte), the prefix being all the characters in the string from the root up to but not including the byte, and byte being the rightmost character of the string. The distinction is important because the LZW code_words only encode and represent the prefix portion of the string and do not include the byte. The byte is encoded in the output stream as the root of the next string entered into the Dictionary. An input file, then, comprises a set of concatenated, linked, string prefixes as defined by LZW. Both the code_word for the prefix and the associated byte are contained in each Dictionary entry.

Note that when an entry is made in the Dictionary, the complete string consisting of prefix+byte is entered. The address of the Dictionary entry is the code word of the string. However, the code_word for the prefix of the string is what is inserted into the output file, not the code_word for the string, itself. This detail is what causes the Dictionary to grow as compression proceeds. Although the string is processed and entered into the Dictionary from left to right, preferably, the prefix represented by a Dictionary entry is linked right to left, terminating at a root. The shortest string is two bytes in length and comprises a 1 byte root+byte.

II. LZW Hardware Data Compression Co-Processor

Figure 2:
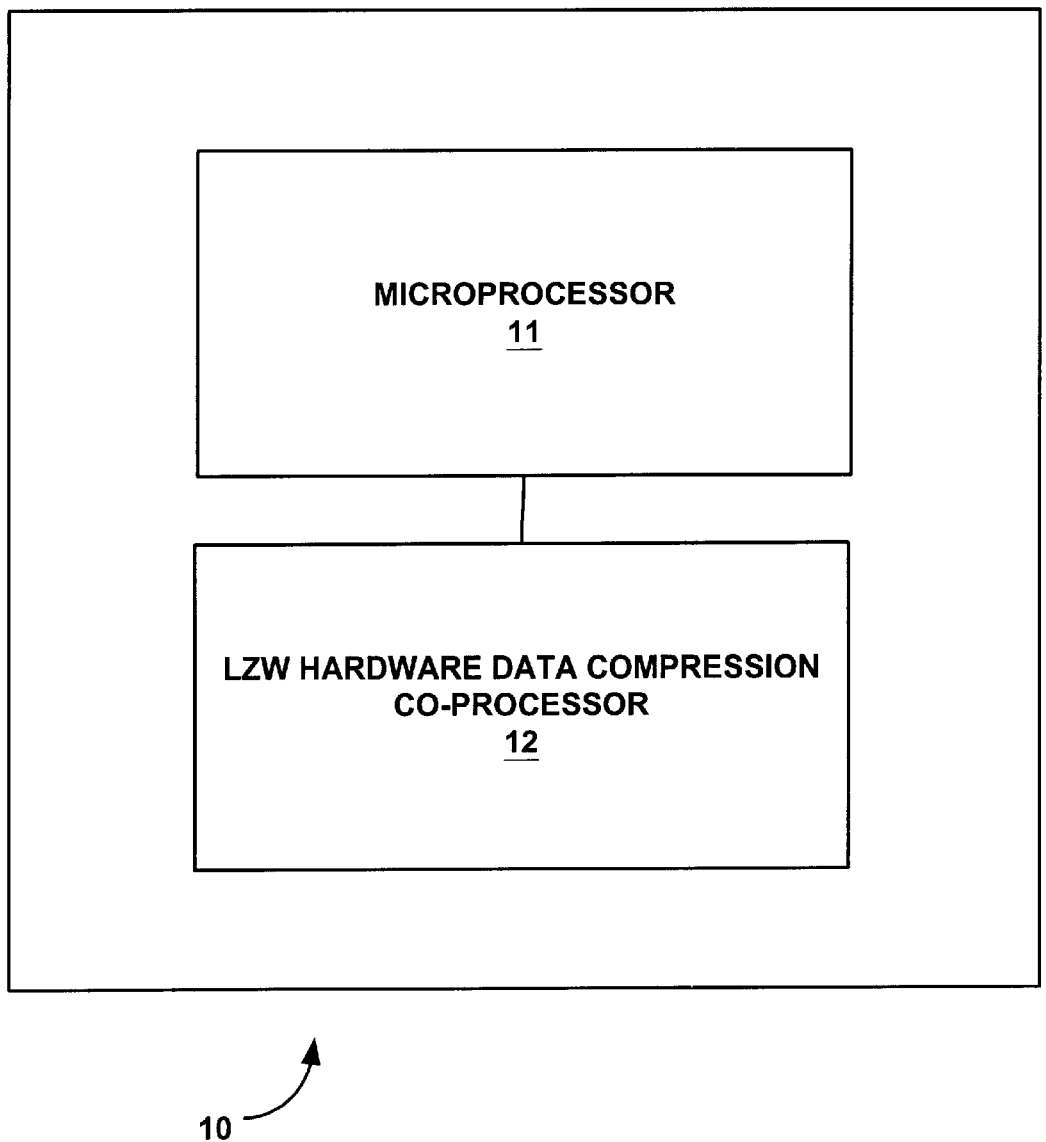
FIG. 2 illustrates an exemplary micro-processing environment in which one embodiment of the invention may be implemented.

FIG. 2 illustrates a microprocessor system environment in which one embodiment of the invention may be implemented. Microprocessor environment 10 comprises a microprocessor 11 and LZW Hardware (HW) Data Compression Co-Processor 12. Microprocessor 11 typically initiates activity by LZW HW Data Compression Co-Processor 12 and supplies input data to and receives compressed output from LZW HW Data Compression Co-Processor 12. For example, LZW HW Data Compression Co-Processor 12 may receive a RUN/STOP command from the associated microprocessor 11 and may report a BUSY/IDLE status to the associated microprocessor 11.

Figure 3:
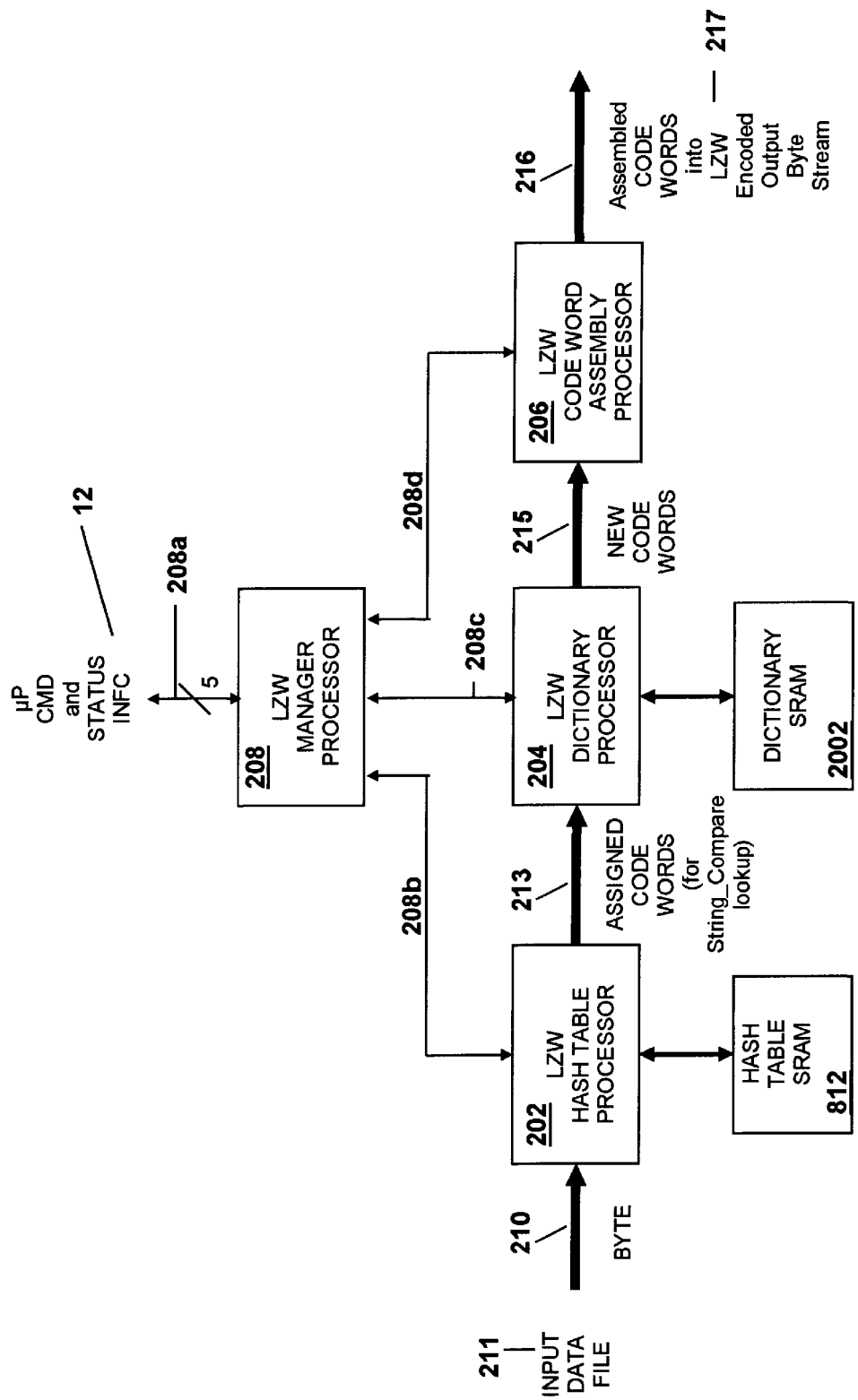
FIG. 3 is a block diagram of an LZW Hardware Data Compression Co-processor in accordance with the present invention.

FIG. 3 is a block diagram of an LZW HW Data Compression Co-Processor 12 in accordance with one embodiment of the present invention. The LZW HW Data Compression Co-Processor 12 performs a specialized data compression processing function within a microprocessor system environment, such as the one illustrated in FIG. 2. In one embodiment, LZW HW Data Compression Co-Processor 12 includes three independent processors, LZW Hash Table Processor 202, LZW Dictionary Processor 204 and LZW Code Word Assembly Processor 206 communicatively coupled with a fourth, managing processor, LZW Manager Processor 208. Hash Table SRAM 812 is associated with LZW Hash Table Processor 202 and is used to update and store a Hash Table data structure therein. In one embodiment of the invention, a size of 9973d is chosen for the Hash Table data structure, although any suitably sized Hash Table may be used. Increasing the size of the Hash Table may result in some improvement in performance because the number of hash collisions may be reduced, given a fixed dictionary size. Also associated with an increase in the Hash Table size is an increase in initialization time. To minimize the impact of initialization time, the present invention may be implemented using two Hash Table structures, one of which is initialized by the independent Hash Table initialization state machine while the other Hash Table structure is in active use.

Dictionary SRAM 2002 is associated with LZW Dictionary Processor 204 and is used to store and update a Dictionary data structure therein. The Dictionary may be of any suitable size.

An interface 208a comprising commands and status exists between LZW Manager Processor 208 and microprocessor 11. The microprocessor interface on the LZW manager may be optimized for a specific processor or another hardware or software controlled source of the SW_RESTART pulse required to trigger the start of compression. The interface may even be as primitive as a manual device such as a push-button switch interfaced by means of a switch contact debouncing and pulse generation circuit.

An interface 208b comprising commands and status exists between LZW Manager Processor 208 and LZW Hash Table Processor 202. An interface 208c comprising commands and status exists between LZW Manager Processor 208 and LZW Dictionary Processor 204, and an interface 208d comprising only commands exists between LZW Manager Processor 208 and LZW Code Word Assembly Processor 206.

An interface 210 comprising bytes of data exists between an input file 211 and LZW Hash Table Processor 202. Any suitable external logic may be applied to the input interface. For example, a DMA controller may be appended to the input so that a range of memory addresses can be automatically accessed to obtain the input data. An interface 213 comprising assigned code words exists between LZW Hash Table Processor 202 and LZW Dictionary Processor 204. An interface 215 comprising new code words exists between LZW Dictionary Processor 204 and LZW Code Word Assembly Processor 206. An interface 216 comprising assembled code words exists between LZW Code Word Assembly Processor 206 and an output file 217. Any external logic may be attached to the output interface. For example, a combination of DMA and microprocessor FIFO interfaces may be attached to the interface to assist in moving the compressed output data to its intended destination.

LZW Manager Processor 208 controls the overall flow of data through the lower level processors 202, 204 and 206 by monitoring status reported from processors 202, 204 and 206 and by issuing individual commands to each of the lower level processors 202, 204, and 206, in response to the reported status. LZW Manager Processor 208 does not process any data from the input file to be compressed. LZW Manager Processor 208 performs an oversight and management function by issuing instructions (commands) to processors 202, 204, and 206 based upon status values received by LZW Manager Processor 208 from processors 202, 204 and 206. Hence, LZW HW Data Compression Co-Processor 12 comprises in one embodiment four major functional blocks:

a) LZW Manager Processor (LMP) 208
b) LZW Hash Table Processor (HP) 202
c) LZW Dictionary Processor (DP) 204; and
d) LZW Code Word Assembly Processor (AP) 206.

SRAMs 812 and 2002 are associated with LZW Hash Table Processor 202 and LZW Dictionary Processor 204, respectively, to store and update the Hash Table and Dictionary data structures, respectively.

LZW Hash Table Processor 202, LZW Dictionary Processor 204, and LZW Code Word Assembly Processor 206 are collectively termed "String Data Processors" and are all on the same functional hierarchy level. Each performs an independent, sequential step in the processing flow of the input data file to be compressed. The processors are preferably optimized for the function of looking up strings from the input file in the Dictionary data structure and comparing them against strings already entered into the Dictionary data structure to determine if the string already exists in the Dictionary data structure. When in the STRING COMPARE mode, the processors perform their functions autonomously and coordinate their interfaces automatically. No code words are output in this mode of operation.

The ability to perform independent processing steps simultaneously and automatically is one of the properties that enables the invention to achieve its high level of performance. Also contributing to the high performance of the invention are the following hardware architectural features:

a) Preferably, all algorithms are hard-coded in hardware. The control algorithms for each of the String Data Processors 202, 204 and 206 and LZW Manager Processor 208 are hard-coded into specialized state machines for each processor. Although the aggregate processing of String Data Processors 202, 204 and 206 and LZW Manager Processor 208 results in LZW encoded output, the algorithms for each hardware processor are unique to this invention and are not merely the LZW algorithm implemented in hardware.

b) Preferably, independent SRAM devices 812 and 2002 are provided for each of the Hash Table and Dictionary data structures. This enables simultaneous access to both structures by different String Data Processors 202, 204 and 206, which in turn enables parallel, simultaneous processing of successive elements of string input data.

c) Preferably, the highest utilized processing function, STRING COMPARE, is optimized for highest performance. When input string data is compressing efficiently, after some amount of processing time, a significant number of strings will already have been entered into the Dictionary data structure. Thus a major processing function quickly becomes verifying matches between incoming string data and strings already stored in the Dictionary data structure.

d) Preferably, the multiple processors are not programmable. Hard-coding the control algorithms into each processor eliminates the Instruction Fetch overhead (e.g., additional processing time, additional cost for instruction fetch, decode and execute hardware) typically associated with all programmable processors. Of course, in other embodiments, some degree of programmability may be employed.

e) Preferably, the data path hardware architecture is also customized for the LZW processing function and is optimized for the input data STRING COMPARE function. Storage registers and data routing hardware are provided for several bytes of input string data to be actively in process simultaneously. In addition, simultaneous register storage for all expired data processing items which could possibly be required to complete the processing of the current string data bytes undergoing processing is provided, whether used at a particular time or not. This architectural feature arises from the pipelining of the data processing which can result in temporary "wrong" answers requiring reprocessing of previously processed input string data items. This characteristic is not inherent to the LZW algorithm, but is a by-product of the pipelined architecture solution employed in the invention. In addition the architecture allows these items to be accessed within one processor clock cycle at any point in the processing flow. Examples of such items are: previous values of Hash Index which are required in the event a REHASH operation of the input string byte is necessary and previous values of input string byte, also required in the event a REHASH or NEWHASH operation of the input string byte is necessary.

f) Preferably, initialization of Hash Table and Dictionary data structures are performed simultaneously, in parallel, by two independent hardware state machines. This significantly reduces the overhead required when the Dictionary data structure fills to capacity, is closed and a new Dictionary data structure is opened. All of the initialization data is pre-processed and stored in independent ROMs associated with each data structure.

g) Preferably, a unique, high-speed, method and circuit for calculating the result of the Modulo 9973d division of the Hash Index is used in the Hashing algorithm, as described in co-pending, commonly assigned U.S. patent application Ser. No. 09/971,949, filed Oct. 5, 2001, entitled "CIRCUIT AND METHOD FOR HIGH-SPEED EXECUTION OF MODULO DIVISION," which is hereby incorporated by reference in its entirety.

A. LZW Manager Processor

1. Structure and Function

Figure 4:
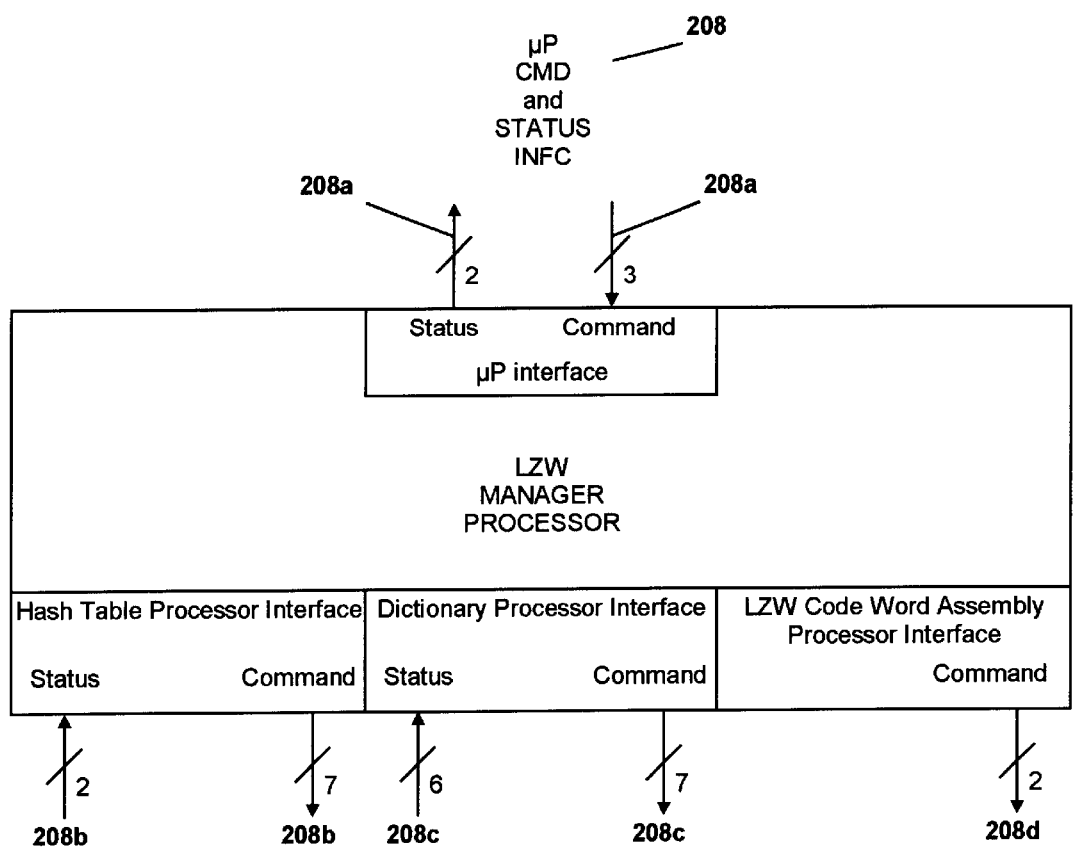
FIG. 4 is a block diagram of an LZW Manager Processor in accordance with one embodiment of the invention.

FIG. 4 is a block diagram of an LZW Manager Processor 208 in accordance with one embodiment of the invention. LZW Manager Processor 208 comprises an interface with microprocessor 11, interface 208a, an interface with LZW Hash Table Processor 202, interface 208b, an interface with LZW Dictionary Processor 204, interface 208c and an interface with LZW Code Word Assembly Processor 206, interface 208d. The interface between LZW Manager Processor 208 and processors 202, 204 is several bits of status and command to each processor and several bits of only command to processor 206.

2. Microprocessor Interface

LZW Manager Processor 208 interfaces between associated microprocessor 11 that initiates data compression activity and the lower level String Data Processing Processors 202, 204, and 206. Associated microprocessor 11 may initiate the following commands to LZW Manager Processor 208 via input channel 208a:

| μP 11 COMMAND INPUTS | DESCRIPTION |
| --- | --- |
| SW_RESTART | Software controlled RESTART command. Essentially a RUN command. |
| LZW_STAT_CLR | CLEAR the latched status within the LZW Manager 208. |
| CMD_MODE | '1' = SW_RESTART-controlled. '0' = STRING_BYTE_REQ-controlled. |

LZW Manager Processor 208 in one embodiment provides the following status outputs to the associated microprocessor 11 via channel 208a:

| LZW Mgr 208 STATUS OUTPUTS | DESCRIPTION |
| --- | --- |
| LZW_IDLE | LZW Compression Co-processor 12 is IDLE. |
| UNEXPECTED_ RESTART | Error status indicating a SW_RESTART occurred while LZW Compression Co-processor 12 was BUSY. This may be due to an intentional abort of a compression session. |

3. String Data Processors Interface

Preferably, LZW Manager Processor 208 directs and configures processors 202, 204 and 206 to perform their functions when major changes are required in the processing flow. The commands issued by the LZW Manager Processor 208 may be considered instructions issued to the lower level processors 202, 204 and 206. If the instruction is included in the "instruction set" of that processor, the command signal is physically connected to that processor. If the instruction is not included in the "instruction set" of that processor, the signal is not connected. Note that the same command/instruction to different processors does not cause the same actions across all processors responding to the command. Each processor responds to the same command uniquely, according to its specialized function in the processing flow.

LZW Manager Processor 208 in one embodiment may output the following command signals to the String Data Processors 202, 204 and 206 via channel 208b, 208c and 208d respectively:

| LZW MANAGER 208 COMMAND | DESCRIPTION |
| --- | --- |
| RESTART | RESTART a new string input file after completion of current file. May also be used as an abort of compression session in progress. |
| STRING_CMP | Compare string byte/code word with that stored in Dictionary. |
| NEW_PFX_WR | Write new string prefix into Dictionary. (Assign new code word). |
| NEWHASH | Byte new string hash (root) after NEW PREFIX WRITE Sequence. |
| PRI_HASH | Resume PRIMARY HASH after REHASH results in a successful string compare. |
| REHASH | Byte REHASH after STRING COMPARE fails. |
| OPEN_DICT | Close current filled Dictionary and open a new empty one. |

The signals are preferably broadcast to all String Data Processors 202, 204 and 206 but are connected only to those processors needing the command. Thus only targeted String Data Processors 202, 204 or 206 receive specific required subsets of all the command signals. The command signals are assigned one-per-command and are mutually exclusive. Therefore, preferably only one command signal is TRUE at a time. A condition of all command signals being FALSE may be allowed and may occur for a small number of clocks while LZW Manager Processor 208 is executing a sequence to determine the appropriate next command output.

Preferably, each String Data Processor 202, 204 or 206 is capable of executing the command if it is connected to that processor. The following table indicates a set of LZW Manager Processor 208 Commands that may be received by each of the String Data Processors 202, 204 and 206. "Y" indicates that the specified String Data Processor 202, 204 or 206 receives the command, while "N" indicates that the specified String Data Processor 202, 204 or 206 does not receive the command.

| LZW<br>MANAGER 208<br>COMMAND | HASH<br>TABLE<br>PROC<br>202 | DICT<br>PROC<br>204 | CODE<br>WORD<br>ASSY<br>PROC 206 |
|---|---|---|---|
| RESTART | Y | Y | Y |
| STRING_CMP | Y | Y | N |
| NEW_PFX_WR | Y | Y | N |
| NEWHASH | Y | Y | N |
| PRI_HASH | Y | Y | N |
| REHASH | Y | Y | N |
| OPEN_DICT | Y | Y | Y |

RESTART COMMAND

In one embodiment of the invention, the RESTART command is used to initiate processing of an input data string file 211. The RESTART command may be issued as part of the LZW Manager Processor 208 RESTART sequence described below. RESTART can be considered conceptually as a run or start command. If issued while a file is being processed, it is generally equivalent to an abort followed by a RESTART. LZW Manager Processor 208 preferably issues a RESTART command to String Data Processors 202, 204 and 206, in response to microprocessor 11 setting the SW_RESTART bit on microprocessor interface 208*a*. In response, all String Data Processors 202, 204 and 206 reset their logic to initial states and LZW Hash Table Processor 202 and LZW Dictionary Processor 204 then perform their respective data structure initialization sequences.

STRING_CMP COMMAND

In one embodiment of the present invention, a STRING COMPARE sequence initiated by the STRING_CMP command preferably places String Data Processors 202, 204, and 206 in their optimized mode of reading and comparing input string data to strings stored in the Dictionary data structure. STRING_CMP is issued in the LZW Manager Processor 208 single-state STRING COMPARE sequence described below. In STRING COMPARE mode, String Data Processors 202, 204, and 206 preferably execute the flow path highlighted in bold in the "LZW GENERAL FLOW" in FIG. 1 and make full use of the pipeline architecture by processing successive operations on two successive bytes of input string data simultaneously. In STRING COMPARE mode, preferably LZW Hash Table Processor 202 inputs a string byte, performs a hash calculation on it, discovers that the hash location is assigned, looks up the corresponding code word for the string stored at the Hash Table data structure location and presents the code word along with the byte as a data pair to LZW Dictionary Processor 204. LZW Dictionary Processor 204 preferably uses the code word as an index representing the current string to look up the byte and code word for the string prefix values stored at the index and compare them against the byte, presented by LZW Hash Table Processor 202, and the prefix of the current string, presented by LZW Hash Table Processor 202 on the preceding pipeline cycle and stored in Code Word(n−2) register 2106. If the byte and prefix values are equal, the string is already stored in the Dictionary data structure and this pipeline flow continues until one of the following conditions occurs:

1. Hash Table location is "Unassigned". This indicates that the current byte represents a new string. If the Dictionary has available space, LZW Manager Processor 208 responds by entering the NEW PREFIX WRITE sequence and issuing a NEW_PFX_WR command. If the Dictionary is full, the LZW Manager Processor 208 responds by entering the OPEN DICTIONARY sequence and issuing an OPEN_DICT command.

2. Hash Table location is already assigned but the subsequent Dictionary compare fails. This indicates that a hash collision has occurred and a REHASH of the current input byte is required. LZW Manager Processor 208 responds by issuing a REHASH command. REHASH continues until either a successful compare occurs, in which case String Compare is resumed, or an "Unassigned" location is encountered in the hash table which case has been previously described.

NEW_PFX_WR COMMAND

In one embodiment of the present invention, the NEW_PFX_WR command preferably is used to command LZW Hash Table Processor 202 and LZW Dictionary Processor 204 to make a code word entry in the Hash Table data structure and to enter a new string into the Dictionary data structure. LZW Dictionary Processor 204 also preferably outputs the code word for the current string prefix, contained in Code Word(n−2) register 2106, to the LZW Code Word Assembly Processor 206 for insertion into the output code stream 217. The command is issued as part of the LZW Manager Processor 208 NEW PREFIX WRITE sequence described below. Executing a NEW_PFX_WR command terminates processing of a current string and begins processing of a new string. The NEW PREFIX WRITE sequence is immediately followed by the NEWHASH sequence as part of the new string processing.

NEWHASH COMMAND

In one embodiment of the invention, the NEWHASH command preferably is issued as part of the single-state NEWHASH sequence. NEWHASH is used to command LZW Hash Table Processor 202 to calculate the Hash Index of the next input byte using a default value of FFFFh as the initial Hash Index. A default value is necessary because this is the first byte, or root, of the new string to be processed and thus no preceding Hash Index has been calculated. Other than the default value of the initial Hash Index, the NEWHASH algorithm preferably is identical to the PRIMARY HASH algorithm. The NEWHASH command preferably is issued unconditionally after a NEW_PFX_WR command.

REHASH COMMAND

In one embodiment of the invention, the REHASH command is issued as part of the single-state REHASH sequence. REHASH preferably is used to command LZW Hash Table Processor 202 to calculate the Hash Index of the next input byte using a REHASH algorithm rather than the PRIMARY HASH algorithm. A REHASH is issued in response to a Hash Collision event. A REHASH sequence is repeated until the Hash Collision is resolved.

PRI_HASH COMMAND

In one embodiment of the invention, the PRI_HASH command is issued as part of the single-state PRIMARY HASH sequence. PRI_HASH is preferably used to command LZW Hash Table Processor 202 to resume calculating the Hash Index of the next input byte using the PRIMARY HASH algorithm. A PRI_HASH is issued after resolving a Hash Collision event in the case where the byte was eventually found to be stored in the Dictionary data structure after performing one or more REHASHes.

OPEN_DICT COMMAND

In one embodiment of the invention, the OPEN_DICT command is issued as part of the two-state OPEN DICTIONARY sequence. It is preferably used to first command LZW Dictionary Processor 204 to output a code word value of 100h to the AP 206, which is a CLEAR Code. This code serves as a delimiter between dictionary sessions in the output file. The OPEN_DICT command also causes LZW Hash Table Processor 202 and LZW Dictionary Processor 204 to reinitialize their control logic and data structures and the LZW Code Word Assembly Processor to change its code word width setting from 12 bits back to 9 bits.

a. LZW Manager Processor 208 Status Inputs From LZW Hash Table Processor 202

In one embodiment of the invention, the following status signals preferably are supplied by LZW Hash Table Processor 202 to LZW Manager Processor 208 via channel 208b:

| LZW HASH TABLE PROCESSOR 202 STATUS | DESCRIPTION |
| --- | --- |
| HASH_ADDR_IDLE | HASH_ADDR_CTL is in the IDLE state and ready to accept a command. |
| HASH_RAM_IDLE | Hash MGR CTL is idle. | b. LZW Manager Processor 208 Status Inputs From LZW Dictionary Processor 204

In one embodiment of the invention, the following status signals are supplied by LZW Dictionary Processor 204 to LZW Manager Processor 208 via channel 208c:

| LZW DICTIONARY PROCESSOR 204 STATUS | DESCRIPTION |
| --- | --- |
| LMGR_DICT_RQ | Request to LZW Manager Processor 208 for help. |
| DICT_FULL | "Dictionary_Full" status. |
| HSH_LOC_UNUSED | "Hash Location Unused" status. |
| STRING_FOUND | Status: Input String was Found in Dictionary. |
| LZW_COMP_CMPL | "LZW_compression complete" status. |
| PL_FLUSH_CMPL | "Upper pipeline flush complete" status. |
| REHASHING_FF | "REHASHING in progress" status. |
| LMGR_DICT_ACK | Dictionary ACK of LZW Manager Processor 208 command to LZW Manager Processor 208. | c. LZW Manager Processor 208 Status Inputs From LZW Code Word Assembly Processor 206

In one embodiment of the invention, there is no status input from LZW Code Word Assembly Processor 206. LZW Code Word Assembly Processor 206 is always ready to respond to LZW Manager Processor 208 commands and has no status to report.

4. LZW Manager State Sequence Diagram

Figure 5:
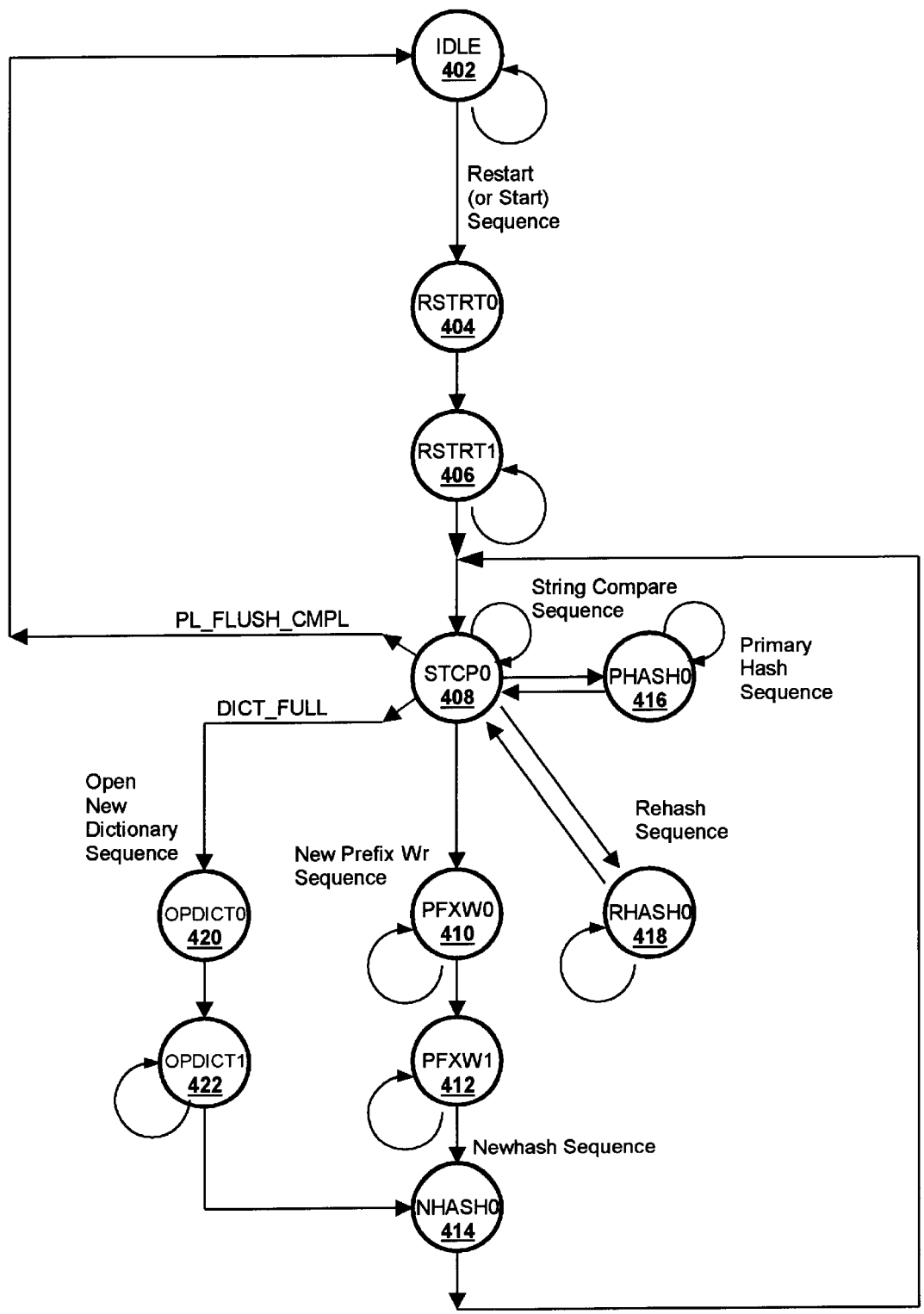
FIG. 5 is an exemplary state sequence diagram of an LZW Manager Processor in accordance with one embodiment of the invention.

FIG. 5 illustrates a state diagram of LZW Manager Processor 208 in accordance with one embodiment of the invention.

The following is a legend for the state names in FIG. 5.

| STATE NAME | STATE DESCRIPTION |
| --- | --- |
| IDLE | IDLE state. 402 |
| RSTRT0 | RESTART sequence, state 0. 404 |
| RSTRT1 | RESTART sequence, state 1. 406 |
| STCP0 | Input STRING COMPARE sequence, state 0. 408 |
| PFXW0 | New Prefix WR sequence, state 0. 410 |
| PFXW1 | New Prefix WR sequence, state 1. 412 |
| NHASH0 | NEWHASH sequence, state 0. 414 |
| PHASH0 | PRIMARY HASH sequence, state 0. 416 |
| RHASH0 | REHASH sequence, state 0. 418 |
| OPDICT0 | OPEN DICTIONARY sequence, state 0. 420 |
| OPDICT1 | OPEN DICTIONARY sequence, state 1. 422 |

IDLE State 402

In one embodiment of the invention, IDLE state 402 is a state in which the LZW Manager Processor 208 "parks" when no data compression activity is in progress. All command outputs are FALSE. The LZW Manager Processor 208 may accept a SW_RESTART that is essentially a GO trigger command from microprocessor 11 in this state. Upon receipt of this trigger, LZW Manager Processor 208 commences the RESTART sequence.

RESTART Sequence RSTRT0 404, RSTRT1 406

In one embodiment of the invention, the RESTART sequence comprises ordered states RSTRT0 404 and RSTRT1 406.

RSTRT0, RESTART sequence, state 0 404.

In RSTRT0 404, preferably LZW Manager Processor 208 outputs a one clock wide RESTART command pulse to the String Data Processors 202, 204 and 206 and proceeds to RSTRT1 state 406. The RESTART command preferably initiates an initialization sequence in LZW Hash Table Processor 202 and LZW Dictionary Processor 204 and resets the logic to an initial state in the Code Word Assembly Processor 206.

RSTRT1, RESTART sequence, state 1 406.

In RSTRT1 406, preferably LZW Manager Processor 208 waits for the initialization sequence in LZW Hash Table Processor 202 and LZW Dictionary Processor 204 to complete. The Hash Table initialization typically is the longest sequence, therefore LZW Manager Processor 208 preferably only looks at the HASH_ADDR_IDLE status. When HASH_ADDR_IDLE status becomes TRUE, a STRING COMPARE sequence, STCP0 408 is initiated.

STRING COMPARE Sequence 408

In one embodiment of the invention, the STRING COMPARE sequence comprises a single state, STCP0 408.

In STCP0 408, LZW Manager Processor 208 preferably issues a STRING_CMP command. The STRING_CMP command causes String Data Processors 202, 204 and 206 to run in their optimized mode of comparing the input string data with strings stored in the Dictionary data structure. This continues until LZW Dictionary Processor 204 is unable to continue and signals this event by driving the LMGR_DICT_RQ (LZW Manager Processor 208 Request from LZW Dictionary Processor 204) status signal to a TRUE level. The set of possible logic conditions that may exist at this time and the signal levels indicating these conditions is described below.

Condition: HSH_LOC_UNUSED='1' and DICT_FULL='0'

Description: The current byte has hashed to an unused, available location in the Hash Table data structure and the Dictionary data structure is not full. This enables a new code word to be assigned. It also indicates that the byte represents the root of a new string and a new code word should be assigned and the code word for the current string prefix should be output to LZW Code Word Assembly Processor 206.

LZW Manager Processor 208 Response: The LZW Manager Processor 208 responds by issuing a NEW_PFX_WR command and executing the NEW PREFIX WRITE sequence.

Condition: HSH_LOC_UNUSED='1' and DICT_FULL='1'

Description: The current byte has hashed to an unused, available location in the Hash Table data structure and the Dictionary data structure is full. No space exists in the Dictionary data structure for a new code word to be assigned. It also indicates that the byte represents a new string, a new code word should be assigned and the code word for the current string prefix should be output to LZW Code Word Assembly Processor 206.

LZW Manager Processor 208 Response: LZW Manager Processor 208 responds by issuing an OPEN_DICT command and entering the OPEN DICTIONARY Sequence.

Condition: PL_FLUSH_CMPL='1'

Description: The byte tagged as the last byte in the input file 211 has entered the pipeline and has been flushed (processed) through the pipeline. The LZW Dictionary Processor 204 has also output the code word value of 101h which is the EOI (End of Information) code to LZW Code Word Assembly Processor 206 for insertion into the compressed output stream, terminating LZW compression of the current input file 211.

LZW Manager 208 Processor Response: The LZW Manager Processor 208 responds by entering the IDLE 402 state. It will stay in IDLE 402 until receipt of the next SW_RESTART command from microprocessor 11.

NEW PREFIX WRITE Sequence

In one embodiment of the invention the NEW PREFIX WRITE sequence comprises states PFXW0 410 and PFXW1 412.

PFXW0, NEW PREFIX WRITE sequence, state 0 410.

In one embodiment of the invention, in PFXW0 410, the LZW Manager Processor 208 preferably first waits for LZW Hash Table Processor 202 to go IDLE 402, then outputs a one clock wide NEW_PFX_WR command pulse to String Data Processors 202, 204 and 206 and proceeds to PFXW1 412 state. The NEW_PFX_WR command initiates a NEW PREFIX WRITE sequence in LZW Hash Table Processor 202 and LZW Dictionary Processor 204 and the processing of an LZW code word by LZW Code Word Assembly Processor 206.

PFXW1, NEW PREFIX WRITE sequence, state 1 412.

In PFXW1 412, LZW Manager Processor 208 preferably first waits for both the LZW Hash Table Processor 202 and the LZW Dictionary Processor 204 to go IDLE 402 after performing their respective NEW PREFIX WRITE sequences, and then proceeds to NHASH0 state 414.

NEWHASH Sequence

In one embodiment of the invention, the NEWHASH sequence comprises a single state, NHASH0 414.

NHASH0, NEWHASH sequence, state 0 414.

In NHASH0 414, LZW Manager Processor 208 preferably issues a one clock wide NEWHASH command pulse to String Data Processors 202, 204, and 206 and proceeds to STCP0 408 state. The NEWHASH command initiates a NEWHASH sequence in LZW Hash Table Processor 202 and resets all valid bits in the pipeline registers in LZW Dictionary Processor 204.

PRIMARY HASH Sequence

In one embodiment of the invention, the PRIMARY HASH sequence comprises a single state, PHASH0 416.

PHASH0, PRIMARY HASH sequence, state 0 416.

In PHASH0, 416 LZW Manager Processor 208 preferably first waits for LZW Hash Table Processor 202 to go IDLE 402 then issues a one clock wide PRI_HASH command pulse to String Data Processors 202, 204 and 206 and then proceeds to the STCP0 408 state. The PRI_HASH command initiates a PRIMARY HASH sequence in LZW Hash Table Processor 202 and facilitates the transition from REHASH to PRI_HASH in LZW Dictionary Processor 204.

REHASH Sequence

In one embodiment of the invention, the REHASH sequence comprises a single state, RHASH0 418.

RHASH0, REHASH sequence, state 0 418.

In RHASH0 418, preferably LZW Manager Processor 208 first waits for LZW Hash Table Processor 202 to go IDLE 402, issues a one clock wide REHASH command pulse to String Data Processing Processors 202, and 204 and then proceeds to the STCP0 408 state. The REHASH command preferably initiates a REHASH sequence in LZW Hash Table Processor 202 and causes LZW Dictionary Processor 204 to invalidate pipeline level 3 to clear the pipeline for the non-pipelined REHASH to occur.

OPEN DICTIONARY Sequence

In one embodiment of the invention, the OPEN DICTIONARY Sequence comprises two states, OPDICT0 420 and OPDICT1 422.

OPDICT0, OPEN DICTIONARY Sequence, state 0 420.

In OPDICT0 420, LZW Manager Processor 208 preferably outputs a one clock wide OPEN_DICT command pulse to String Data Processors 202, 204 and 206 and proceeds to the OPDICT1 422 state. Entrance into the OPDICT1 422 state preferably causes LZW Dictionary Processor 204 to output a code word value of 100h which is a CLEAR Code to LZW Code Word Assembly Processor 206 for output into the encoded output stream. Output of a CLEAR Code 100h serves as a delimiter between dictionary sessions in the output file. The OPEN_DICT command also causes LZW Hash Table Processor 202 and LZW Dictionary Processor 204 to reinitialize their control logic and data structures and the LZW Code Word Assembly Processor to change its code word width setting from 12 bits back to 9 bits. LZW Dictionary Processor 204 then assigns a new code word to the current byte at code word value 102h, the first entry in a new Dictionary data structure.

OPDICT1, OPEN DICTIONARY Sequence, state 1 422.

In OPDICT1 422, LZW Manager Processor 208 preferably waits for String Data Processors 202, 204 and 206 to complete the activities previously described. The HASH_ADDR_IDLE status from LZW Hash Table Processor 202 going TRUE indicates that the activities have completed. LZW Manager Processor 208 then preferably enters the NEWHASH sequence.

B. The Data Processing Pipeline

In one embodiment of the present invention, different, simultaneous processing steps are preferably performed on multiple, sequential characters of the input string by different processors operating simultaneously in parallel. This process is called pipelining. In one embodiment of the invention, the pipeline has 6 pipeline levels, classified into two major subsections: the upper 4 pipeline levels and lower 2 pipeline levels. The upper pipeline levels comprise LZW Hash Table Processor 202 and LZW Dictionary Processor 204. The lower levels comprise LZW Code Word Assembly Processor 206. The upper 4 pipeline levels are not deterministic in their algorithm. Because of this, the processing flow of the upper pipeline is intermittently disrupted by such events as REHASH, NEWHASH, NEW PREFIX WRITE and other "flow disrupting" operations. Because of this, the upper pipeline preferably retains some of the results of previous processing steps in the event they are needed for reprocessing by re-flowing through the pipeline. The lower pipeline is preferably a unidirectional flow pipeline and is never disrupted and does not require the retention of any previous processing results.

Level 1 in the pipeline, L2 refers to Level 2 and so on. The pipeline levels apply from the output of the named register, through any combinational data path, to the input of the next register in the pipeline. Note that the register sourcing Byte_In is an external device. Thus L1 is a pipeline register input level, not a register output level. Note also that not all data items are present at all pipeline levels.

| PPL LVL | BYTE in PROCESS | SAVED BYTES | HASH INX/ HASH ADDR | CODE WORD | PROCESSOR |
|---|---|---|---|---|---|
| L1 | BYTE_IN | — | HASH_INX_D | — | Hash Table 202 |
| L2 | HASH_BYTE(n) 1402 | BYTE(n) 606 | HASH_INX(n) 1104 | HSH_CODE_WD 512* | Hash Table 202 |
| L3 | HASH_BYTE(n-1) 2102 | BYTE(n-1) 607 | HASH_ADDR(n-1) 1002 | CODE_WORD(n-1) 2104 | Dictionary 204 |
| L4 | — | — | — | CODE—WORD(n-2) 2106 | Dictionary 204 |
| L5 | — | — | — | ASSY—REG 2608 bits 18 to 7 only. Code Size L5 2602 | Code Word Assy 206 |
| L6 | — | — | — | ASSY—REG 2608 bits 6 to 0 and CODE_BYTE reg 2604 | Code Word Assy 206 |

A pipeline level comprises a set of all the associated information necessary to define a step in the processing flow. Thus, if reprocessing of an input character is required, this complete set of information must be routed back to the top of the upper pipeline. In general, this set of information is the following: byte with Last Byte flag (LB), Hash Index, hash address and hash code word. At different levels, only subsets of this information may be required. In the lower pipeline levels, only the current values stored in data registers, along with the current control state may be necessary to define their processing flow.

The interfaces between each String Data Processor 202, 204 and 206 represent major pipeline levels. There are also additional pipeline levels within some of the processors.

In one embodiment of the invention, LZW Hash Table Processor 202 requires two clocks to perform its calculation. This is the pacing item in the pipeline. Thus, the minimum time in which data may be moved from one pipeline level to the next is once for every two clocks.

1. Pipeline Boundaries

In one embodiment of the invention, because data can only move from one register to another in a clock cycle, the boundaries of the pipeline levels are also registers. A pipeline level generally represents all the logic paths between the output of one register/flip-flop level and the input of the next/same register/flip-flop. In the case of LZW Hash Table Processor 202, it requires two clocks to process data from input to output. Thus some registers and flip-flops within LZW Hash Table Processor 202 do not represent pipeline levels, but rather, represent intermediate processing data and control storage within a single pipeline level. The registers at the pipeline boundaries are only updated at a maximum rate of once per two clock cycles. Thus a pipeline cycle comprises a minimum of two clock cycles. Note that the pipeline registers and saved byte registers are only updated at a maximum rate of once per pipeline cycle.

The following table relates the various register names with pipeline levels within the architecture. L1 refers to

*—Output of Hash Table, not a register output.

Note the distinction between the BYTE in PROCESS and SAVED BYTES.

The saved bytes preferably are simply stored values of a few bytes from the input file in the order in which they appear in the input file. This ordering never changes. These bytes are reinserted into the pipeline when some event occurs that causes a pipeline stall condition that necessitates the re-flowing of previous byte values through the processing pipeline. These bytes are not strictly in the pipeline. When in the Flowing state, the values in the Saved Byte registers will agree with the corresponding BYTE in PROCESS registers. When in other pipeline states, the values do not correspond.

The BYTE in PROCESS is processed in the data processing pipeline. There are two such bytes when the pipeline is in the Flowing state.

2. Pipeline States

In one embodiment of the invention, there are five generalized pipeline states: empty, flowing, stalled, flushed and non-pipelined.

a. Empty

In one embodiment of the invention, the Empty state occurs after HW_RST or RESTART. In this state, all the registers in pipeline levels L1–L6 in the table above are undefined. The process of filling the pipeline may be viewed conceptually as "priming" the pipeline. This preferably begins in LZW Hash Table Processor 202 INIT0→NHASH1 state sequence. Upon completion of this sequence, pipeline levels 1 and 2 are validated. After a single subsequent PRIMARY HASH, the pipeline will have all three levels, 1, 2 and 3 validated and is in the Flowing state. This state is sustained through a STRING_CMP command.

b. Flowing

In one embodiment of the invention, in the Flowing state, the registers in pipeline levels L1, L2 and L3 in the table above are loaded and defined. Each time a new BYTE_IN is accepted by LZW Hash Table Processor 202, all the pipeline registers in L2 and L3 are updated on the same clock. In addition, the saved byte registers, Byte(n) and Byte(n-1) are also updated. This generally occurs on every second clock cycle. The remaining registers in levels L4 to L6 may or may not get updated on this same clock depending upon the processing results at the time. This flow continues until it is stalled by some event.

c. Stalled

In one embodiment of the invention, the Stalled state is entered because of suspending pipeline flow through a NEW_PFX_WR, REHASH or OPEN_DICT command. The regular simultaneous updating of the pipeline registers halts in this state. The values in these registers are required for use in processing one of the commands that caused the flow suspension. Among other actions, such as entering data into the data structures, the bytes stored in Byte(n−1) and Byte(n) registers must be re-flowed and reprocessed. Upon completion of the re-flow operations, the Flowing state is resumed after the Stall is processed.

d. Flushed

In one embodiment of the invention, the Flushed state is the final state of the pipeline when the EOI code is inserted into output file 217 and the compression session is completed. Ending the compression session is brought about by the process of Flushing the pipeline. Flushing the pipeline is initiated by the Last Byte (LB) flag being set by the external input. Normally, the STRING_BYTE_REQ command causes a new byte to be input from the input file, causing the entire pipeline to flow. Once the last byte enters the pipeline, no more new bytes can be input, and the pipeline is required to flush itself, that is, to continue to process all the bytes that exist within the pipeline, until all byte registers are empty and the EOI code word is inserted into the output file 217.

e. Non-Pipelined

In one embodiment of the invention, the non-pipelined state exists while the REHASH sequence is in progress. In this state, only one byte is being processed and the byte/code word pair flows isolated from LZW Hash Table Processor 202 to LZW Dictionary Processor 204. No other byte/code word pair is being processed in these two pipeline levels. Thus pipelining of data does not exist in this state. The pipeline notation of (n) and (n−1) is irrelevant for data items in the Hash Address, Hash Byte(n−1), and Code Word(n−1) registers. All processed items and results are regarded as being current and at a single processing level. Pipeline flow must be reestablished after the Non-Pipelined state by performing NEWHASH or PRIMARY HASH sequences.

3. Pipeline Valid Control

In one embodiment of the invention, there is a valid bit associated with the data registers in each of the pipeline levels. When events occur which disrupt pipeline flow, the pipeline levels are tagged as invalid. If a single byte/code word pair is processed in isolation, as in the REHASH case, the valid bit follows the pair as it flows through the pipeline. After the disruption is cleared, each pipeline level is tagged as valid as the data flow is restored.

4. Basic Pipeline Function

In one embodiment of the invention, the data processing pipeline is set up to operate in two basic functional modes: a) STRING COMPARE mode and b) Logical Data Structure Update mode. In this embodiment, pipelining only occurs in STRING COMPARE mode and then only when the pipeline is in the Flowing state. During STRING COMPARE mode the fundamental operations are data retrieval from the data structures and compare with current values of byte and prefix. During Logical Structure Update mode, the fundamental operations are writing updated information into the Hash Table and the Dictionary data structures. Although not pipelined, the Logical Structure Update mode takes advantage of parallelism in the hardware allowing both the Hash Table and the Dictionary data structures to be updated simultaneously.

C. LZW Hash Table Processor 202

1. Structure and Function

Figure 6:
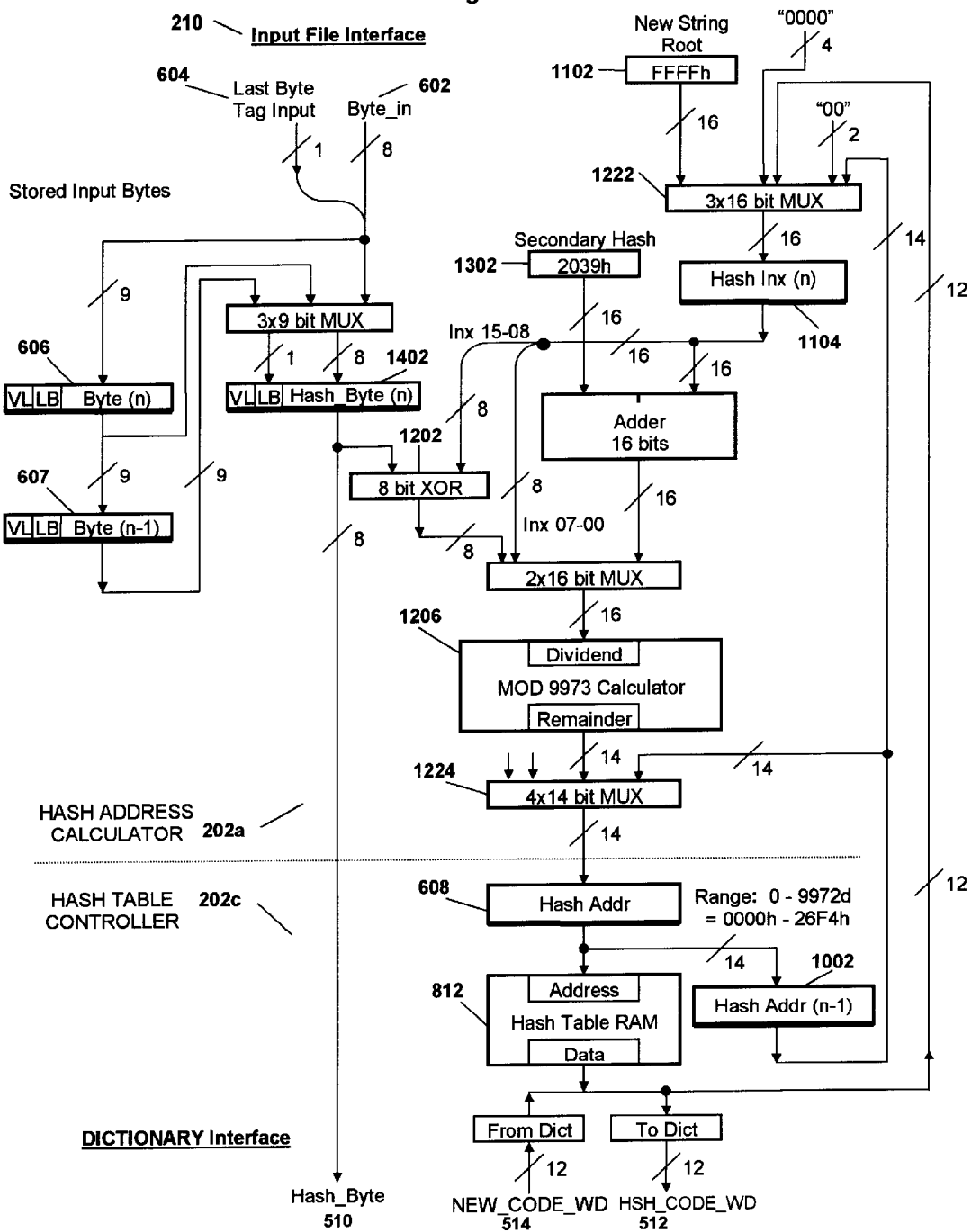
FIG. 6 illustrates the major data path of an LZW Hash Table Processor in accordance with one embodiment of the invention.

Hash Table Processor 202 comprises Hash Address Calculator 202a and Hash Table Controller 202c. A major data path block diagram for Hash Table Processor 202 is illustrated in FIG. 6. Referring now to FIG. 6, preferably LZW Hash Table Processor 202 is the first stage of pipelined data processing and comprises logic for pipeline levels 1, and 2. The contents of the various pipeline levels of the registers within the LZW Hash Table Processor 202 preferably are designated <Item>(n) where n is a relative byte numbering at the indicated level. Thus <item>(n−1) registers contain processing information for the input byte preceeding the input byte of those designated as <item>(n).

Figure 7:
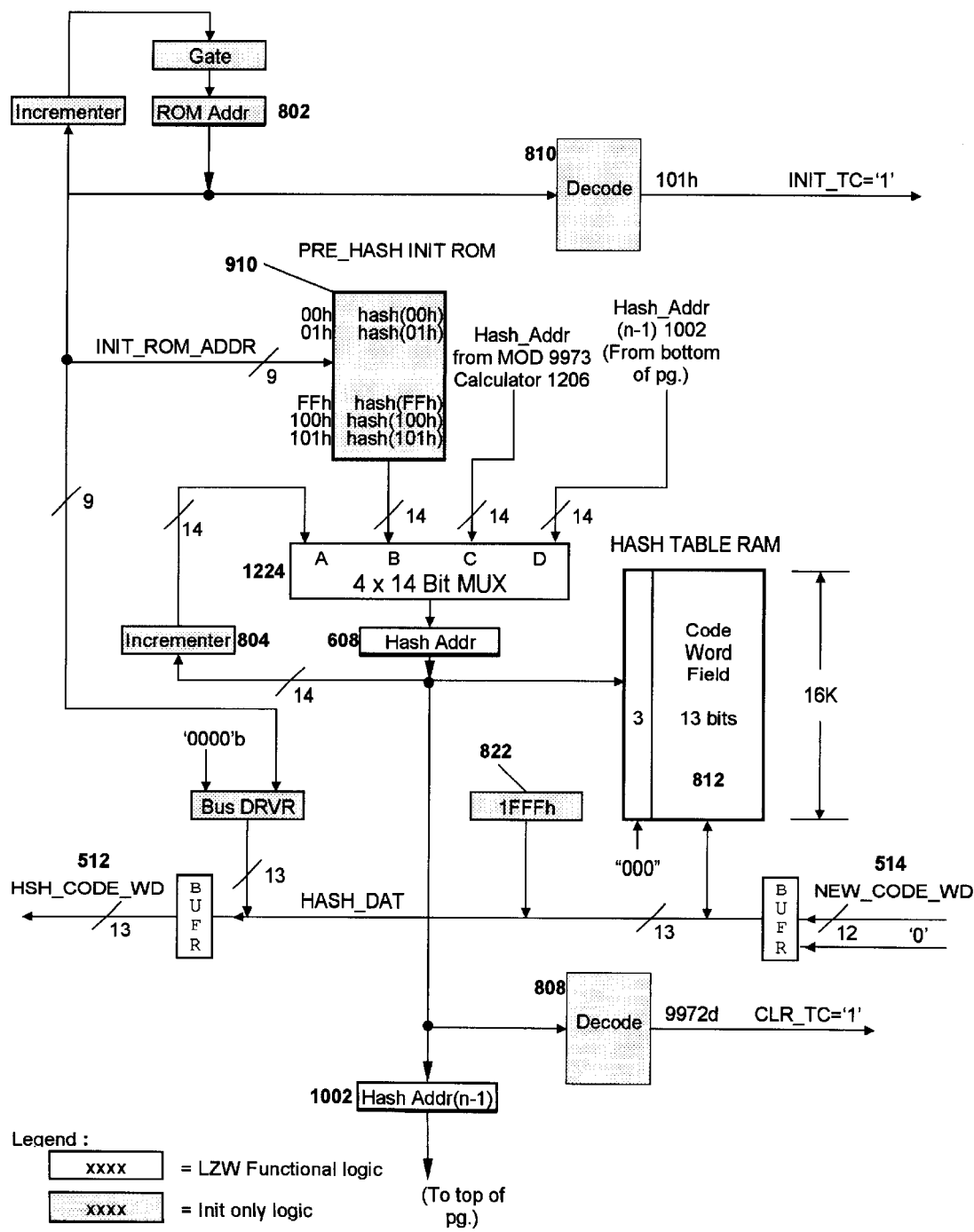
FIG. 7 illustrates the detailed data path of an LZW Hash Table Processor in accordance with one embodiment of the invention.

Hash Table Processor 202 in one embodiment of the invention performs the first two steps in the processing of input string data for LZW data compression: a) Hash the input byte and b) Retrieve the code word. The first step (hash the input byte) is performed by dedicated logic which performs the hash calculation and is herein referred to as Hash Address Calculator 202a. The second step is performed by another set of dedicated logic and is herein referred to as Hash Table Controller 202c. A detailed data path block diagram for the Hash Table Controller 202c is illustrated in FIG. 7.

LZW Hash Table Processor 202 has two basic modes of operation, data retrieval and data entry. In data retrieval mode, LZW Hash Table Processor 202 inputs characters from input file 211, maps them to Hash Table locations and retrieves either a code word or a value indicating the location is unassigned. This mode of operation is used for the NEWHASH, PRI_HASH, REHASH and STRING_CMP commands. The data entry mode is used to enter new code words into the Hash Table data structure as needed. This mode of operation is used for the NEW_PFX_WR command.

Data Retrieval Mode

This first processing step in the LZW Hash Table Processor 202 comprises mapping sets of input string byte values onto a set of locations in the logical Hash Table data structure. The process by which this occurs is called hashing. In one embodiment, the set of locations is one of $9973_{10}$ locations in the logical Hash Table. Note that only $3838_{10}$, or $(4196_{10}-258_{10})$ of the $9973_{10}$ locations are actually assigned in the logical Hash Table data structure in the process of building a Dictionary data structure and that the number of assigned locations in the Hash Table data structure is the same as the number of assignable Dictionary data structure locations, also $3838_{10}$. Note also that the physical size of the associated RAM (e.g. SRAM 812) which stores the logical Hash Table data structure is 16K locations and thus is only partially utilized. Thus, Hash Calculator 202a performs hashing of the root, hashing of strings of input characters during STRING COMPARE, and REHASHing to resolve hash collisions. Hashing, in general, comprises inputting an 8 bit byte to be hashed and performing a hash calculation using the byte and a recursive 16 bit value of Hash Index as inputs to the function and generating a 14 bit output in the range of 0d to 9972d used as an address into the Hash Table logical data structure. In concept, this is a mapping of an arbitrary sized string of characters from the input file onto a fixed range of deterministic output values as conceptually defined as a hashing function. The action of hashing a byte always results in the presentation of a byte+code word pair to the Dictionary over interface signals Hash Byte 510 and HSH_CODE_WD 512. If the byte+ code word pair represents an existing entry in the hash table, the code word represents the entire string, including the byte. It is not a prefix.

Data Entry Mode

Data entry mode is only used for NEW_PFX_WR operations and is discussed under that command.

The details of the method that accomplishes the Data Retrieval and Data Entry functionality follows.

2. LZW Hash Table Processor 202 Interfaces

LZW Hash Table Processor 202 is the first of the three cascaded String Data Processors 202, 204 and 206 that form the data processing path of the LZW algorithm. The LZW Hash Table Processor 202 has three interfaces:

a) Input File interface 210—Input string byte (e.g. BYTE_in 602) and Last Byte tag bit (e.g. Last Byte Tag Input 604).
b) Dictionary Processor interface 213
c) LZW Manager Processor interface 208b Input File interface 210 and Dictionary Processor interface 213 are on the same hierarchical level and are peer-to-peer, data path interfaces. LZW Manager interface 208b is to LZW Manager Processor 208 (No data crosses interface 208b.) Data preferably is only moved across Input File interface 210 and Dictionary Processor interface 213.

a. Input File Interface 210

In one embodiment of the invention, Input File interface 210 comprises two data items and two control signals. The data items are the 8 bit character value (Byte_In 602) and a single bit indicating if the character is the last character of the file (Last Byte Tag Input 604). The character and LB tag each go to both the Byte(n) 606 and Hash_Byte 1402 registers.

The control interface is a simple request/acknowledge interface having the two signals referred to herein as STRING_BYTE_REQ, and STRING_BYTE_ACK, respectively. It is the responsibility of an external device such as a DMA controller to generate the REQ and "feed" input data to the LZW Hash Table Processor 202. LZW Hash Table Processor 202 responds with ACK for each byte it accepts. In general, it will achieve a maximum rate of accepting one byte for each two clock cycles.

b. Dictionary Processor Interface 213

In one embodiment of the invention, Dictionary Processor interface 213 comprises three data items. Two data items comprise a byte/code word pair named Hash_Byte 510 and HSH_CODE_WD 512. HSH_CODE_WD 512 is the code word value retrieved from the Hash Table data structure after hashing and Hash_Byte 510 is the corresponding string byte that hashed to that code word. Hash_Byte 510 is presented to LZW Dictionary Processor 204 to determine if there is a match between the incoming string and a string stored in the Dictionary data structure.

The associated control interface is a simple ready/load interface having the two signals referred to herein as HSH_CODE_RDY, and HSH_CODE_LD. LZW Hash Table Processor 202 waits for LZW Dictionary Processor 204 to indicate a RDY condition and then it issues a HSH_CODE_LD to perform the information transfer to LZW Dictionary Processor 204.

The third data item preferably comprises a 12 bit value named NEW_CODE_WD 514. The direction of this data item is from the LZW Dictionary Processor 204 to the LZW Hash Table Processor 202. This is the current value of the NEW_CODE_WD pointer into the Dictionary data structure and represents the code word value which is assigned in a NEW PREFIX WRITE operation when the current prefix+byte (new string) is written into the Dictionary data structure. When an unassigned hash location is discovered, indicating that the current byte represents a new string, the hash address register (i.e. Hash Addr 608) points to the unassigned hash location. LZW Dictionary Processor 204 requests a code word write into the Hash Table data structure at the unassigned location. This is accomplished by a simple request/acknowledge interface using the two signals, NEW_CODE_REQ, and NEW_CODE_ACK, respectively. LZW Dictionary Processor 204 requests the code word write and LZW Hash Table Processor 202 responds with ACK when it accepts the code word.

c. LZW Manager Processor Interface 208b

The interface 208b between LZW Hash Table Processor 202 and LZW Manager Processor 206 was described above in Section III. A.3.

3. Response to LZW Manager Processor 208 Commands

In one embodiment of the invention, LZW Hash Table Processor 202 is required to act upon all of the seven LZW Manager Processor 208 commands. The following paragraphs describe the response of LZW Hash Table Processor 202 to each of the commands.

RESTART COMMAND

Preferably, when LZW Hash Table Processor 202 receives a RESTART command from LZW Manager Processor 208, LZW Hash Table Processor 202 performs a data structure initialization sequence. The LZW Hash Table Processor 202 initialization sequence preferably comprises clearing the Hash Table to 1FFFh and then loading the Hash Table with predefined values.

Figure 8:
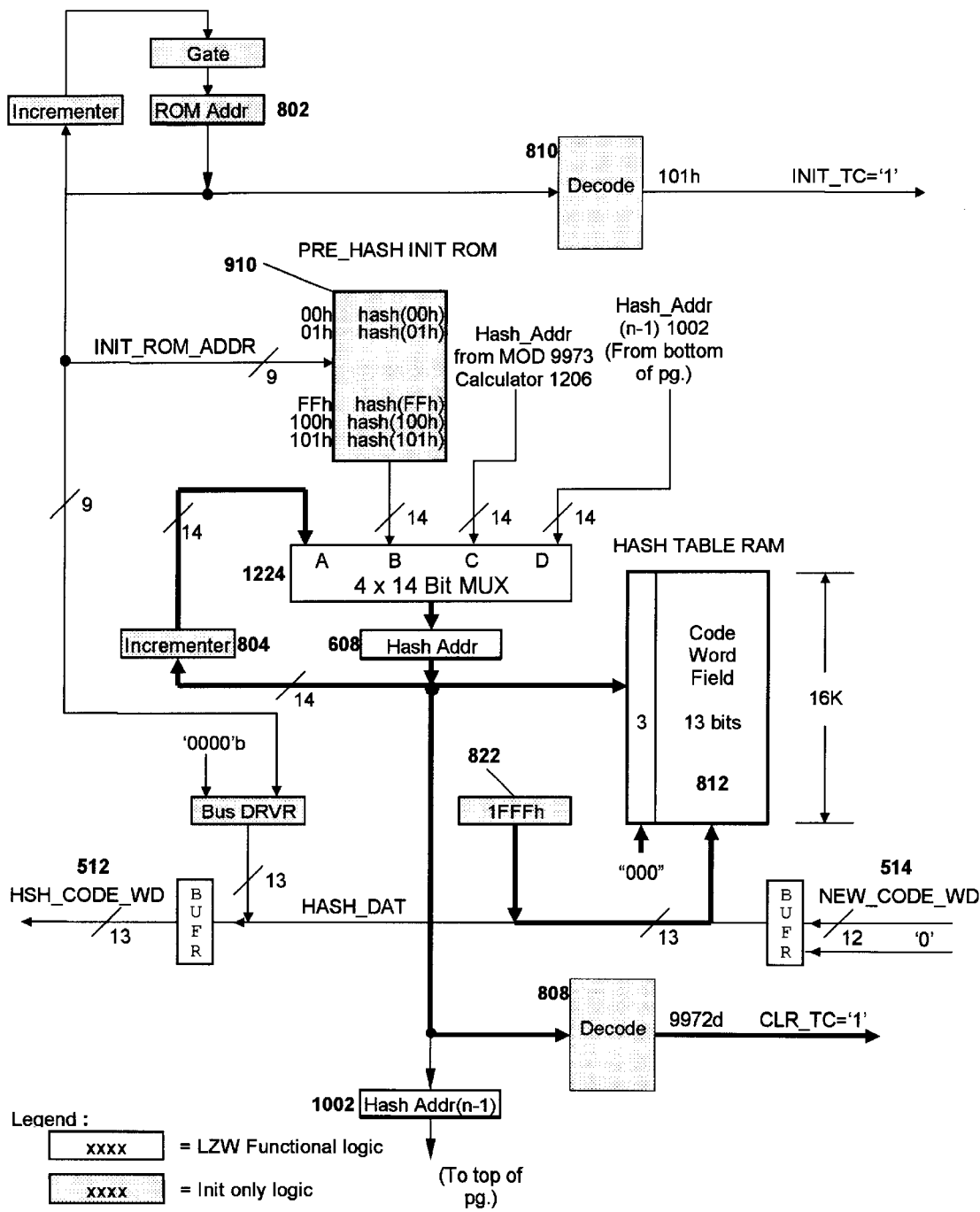
FIG. 8 illustrates the clearing of the Hash Table entries to 1FFFh in an LZW Hash Table Processor in accordance with one embodiment of the invention.
Figure 9:
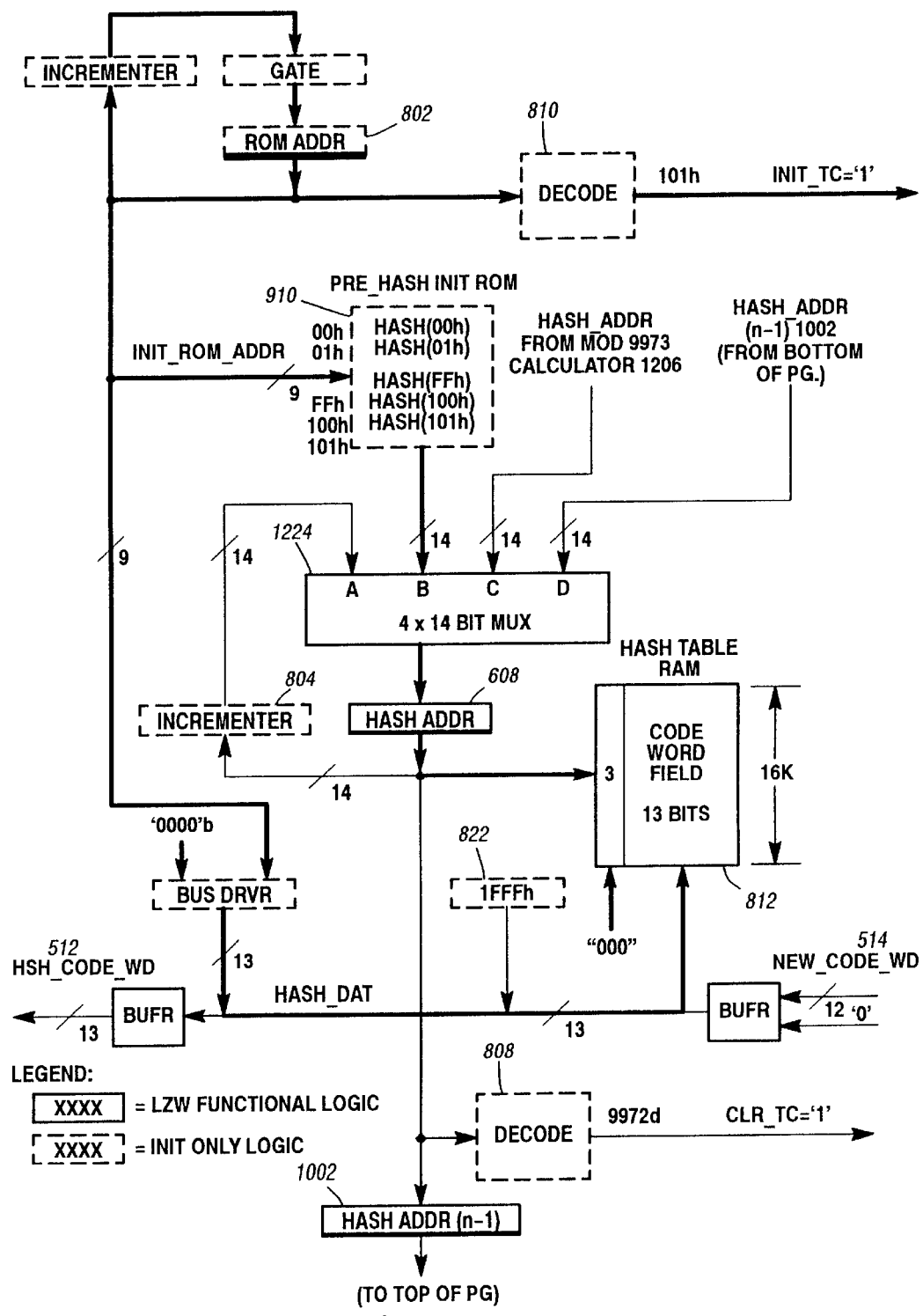
FIG. 9 illustrates the loading of prehashed roots into the Hash Table in an LZW Hash Table Processor in accordance with one embodiment of the invention.

The bolded data path in FIG. 8 highlights the clearing process. The Hash Table logical structure 812 is first cleared to 1FFFh 822 in all locations. Then the roots are loaded into Hash Table 812 at the pre-hashed locations. The bolded data path in FIG. 9 illustrates the loading of Hash Table 812.

LZW Hash Table Processor 202 preferably contains an initialization ROM 910 that contains the pre-hashed values of the roots and control codes, enabling high-speed loading of the values into the proper locations in the Hash Table logical data structure 812 without the real-time processing burden of actually hashing the values. The initialization ROM 910 is used to load the code words for the roots and control codes into their respective pre-hashed locations in Hash Table 812. Finally, all the pipeline data registers are invalidated and Last Byte flags cleared.

STRING_CMP COMMAND

When a STRING-CMP command is in effect, preferably LZW Hash Table Processor 202 inputs a string byte, performs a PRIMARY HASH calculation on it to generate a Hash Table address 608, retrieves the corresponding code word at the Hash Table 812 location and presents the code word (e.g. HSH_CODE_WD 512) along with the byte (e.g. Hash_Byte 510) to LZW Dictionary Processor 204. See PRIMARY HASH, below.

NEW_PFX_WR COMMAND

Figure 10:
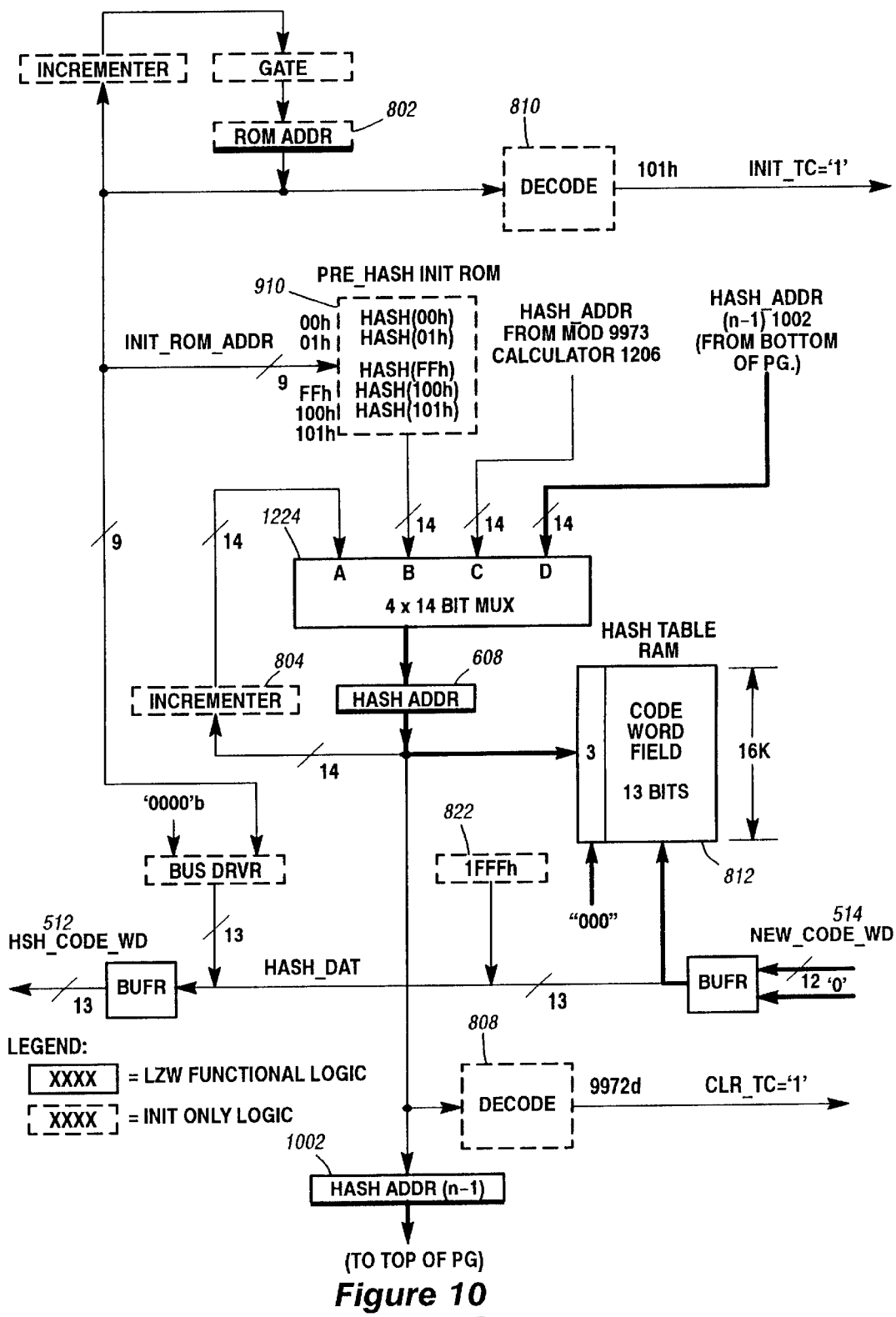
FIG. 10 illustrates a data flow path for a NEW PREFIX WRITE sequence in an LZW Hash Table Processor in accordance with one embodiment of the invention.

The bolded data path in FIG. 10 highlights the data flow of the NEW_PFX_WR command. LZW Hash Table Processor 202 responds to a NEW_PFX_WR command by writing a code word entry into the Hash Table 812 data structure. The correct Hash Table address is obtained from the Hash_Addr(n−1) register 1002. The correct code word is supplied by the LZW Dictionary Processor 204 over the NEW_CODE_WD 514 interface. LZW Dictionary Processor 204 requests the data transfer over LZW Dictionary Processor 204 to Hash Table Processor interface 213 and the Hash Table Controller 202c performs the write.

NEWHASH COMMAND

Figure 11:
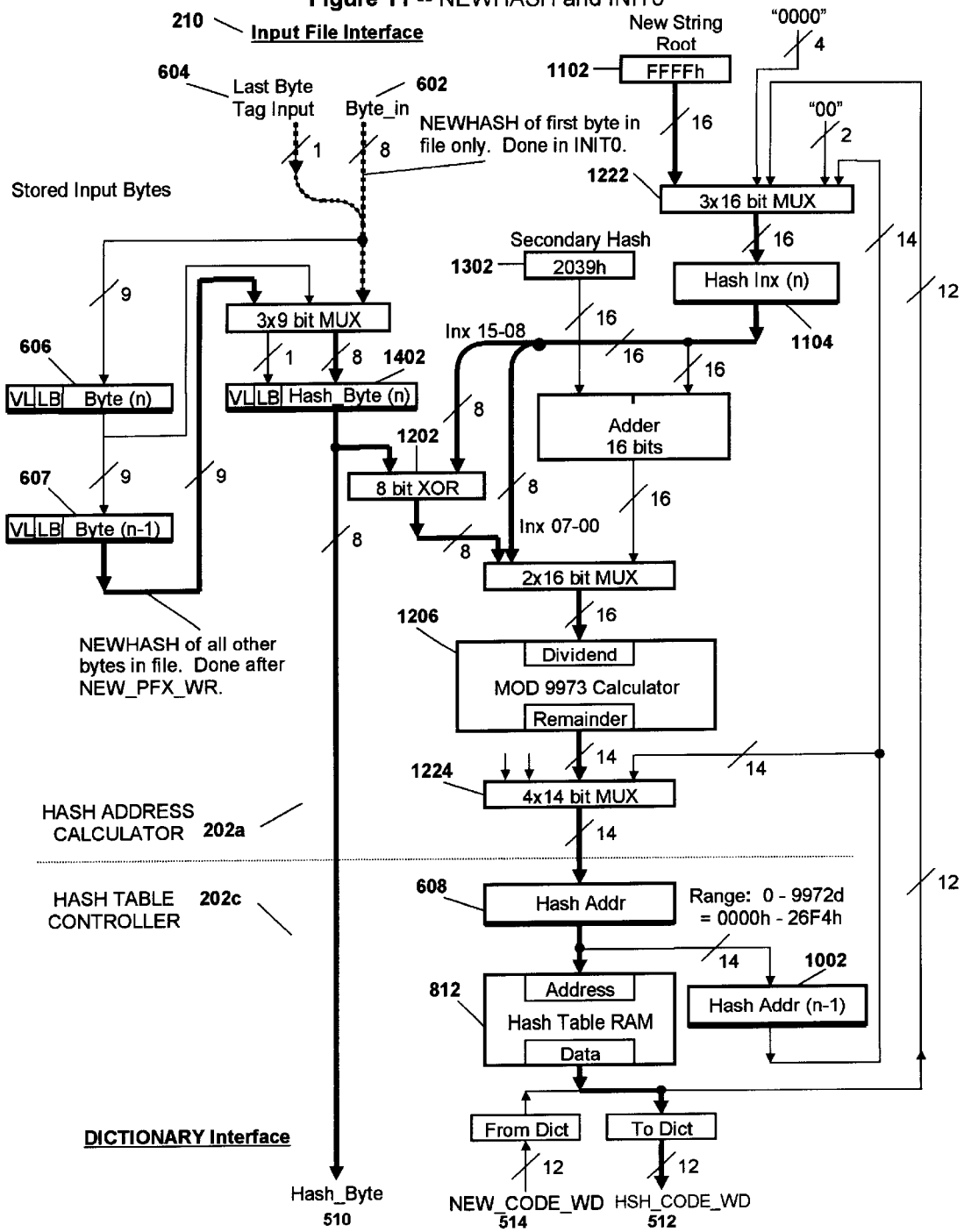
FIG. 11 illustrates a data flow path for a NEWHASH sequence in an LZW Hash Table Processor in accordance with one embodiment of the invention. It shows two cases, the NEWHASH of the first byte in the input file as well as subsequent NEWHASHes of bytes after a NEW_PFX_WR sequence.

The bolded data path of FIG. 11 highlights this data flow of the NEWHASH command. In one embodiment of the invention, LZW Manager Processor 208 issues a NEWHASH command each time it processes the first character, defined as a root, of a new character string. In response to the command, LZW Hash Table Processor 202 calculates the Hash Index (e.g. Hash_Inx(n) 1104) of the root using a default value of FFFFh 1102 as the initial Hash Index 1104. A default value is necessary because this is the first byte of the new string to be processed and thus no preceding Hash Index 1104 has been calculated. This is the initial value of Hash Index 1104 used in the recursive updating of the Hash Index value as the input string is hashed. Other than the default value of the initial Hash Index 1104 the algorithm is identical to the PRIMARY HASH algorithm.

PRI_HASH COMMAND

Figure 12:
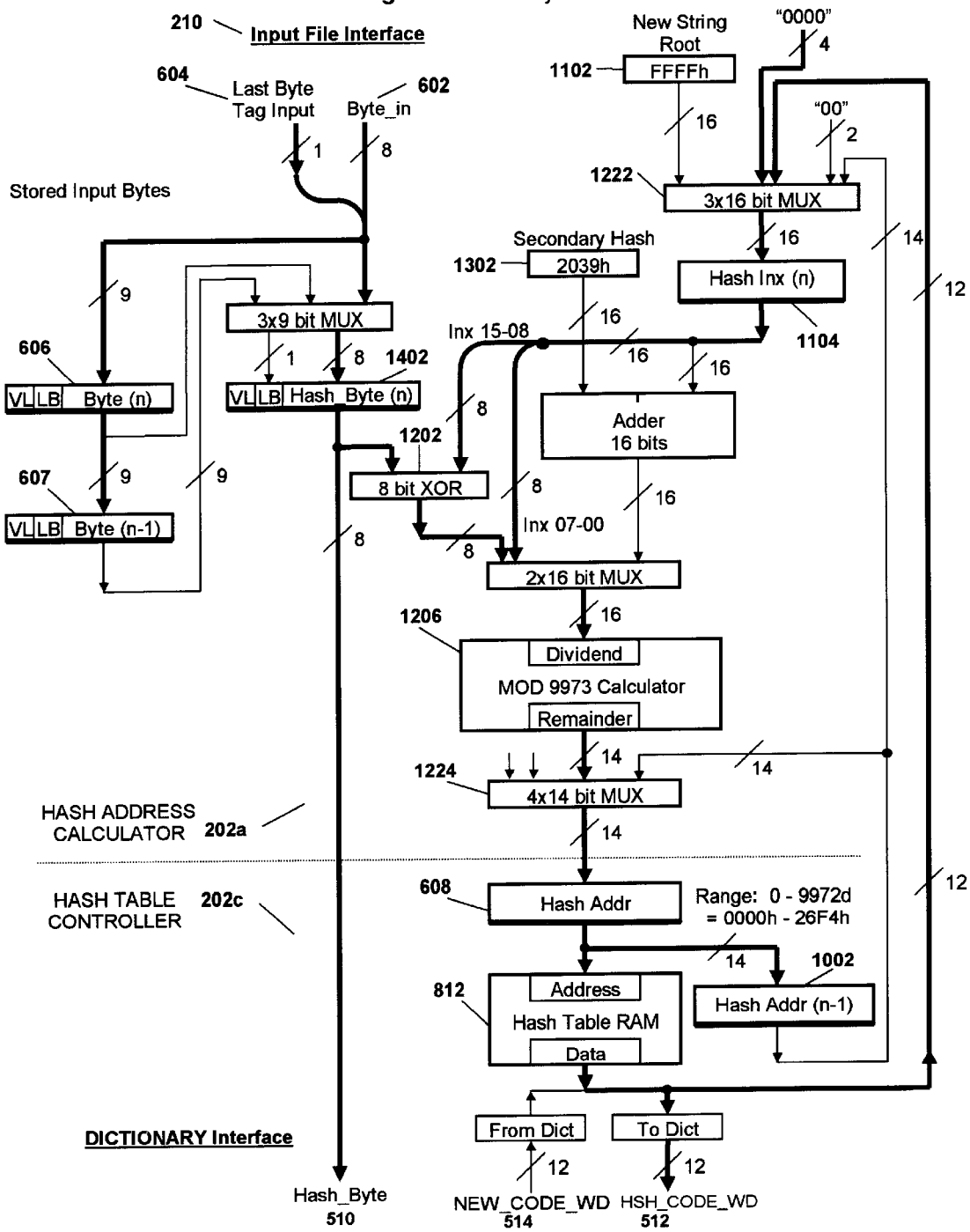
FIG. 12 illustrates a data flow path for a PRIMARY HASH sequence in an LZW Hash Table Processor in accordance with one embodiment of the invention.

The bolded data path of FIG. 12 highlights the data flow for the PRI_HASH command. In one embodiment of the invention, in response to the PRI_HASH command LZW Hash Table Processor 202 resumes calculating the Hash Index 1104 of the next input byte using the PRIMARY HASH algorithm after successfully discovering the preceding byte in the dictionary after one or more REHASHes. The PRIMARY HASH algorithm is also executed during the STRING COMPARE command. It is used to allocate uniformly distributed Hash Table addresses based on string input data. In the PRIMARY HASH algorithm, the byte is XORed 1202 with the upper 8 bits of the Hash Index 1104. This is followed by a MOD 9973d calculation 1206 that produces a 14 bit Hash Table address 608. Preferably, the MOD 9973d calculator is implemented as described in co-pending, commonly assigned U.S. patent application Ser. No. 09/971,949, filed Oct. 5, 2001, entitled "CIRCUIT AND METHOD FOR HIGH-SPEED EXECUTION OF MODULO DIVISION," which is hereby incorporated by reference in its entirety. Note the recursive nature of updating the Hash Index value is shown. In addition, note that the code word (e.g. HSH_CODE_WD 512) retrieved from the Hash Table 812 is used for updating the Hash Index 1104 as well as being passed to LZW Dictionary Processor 504.

REHASH COMMAND

Figure 13:
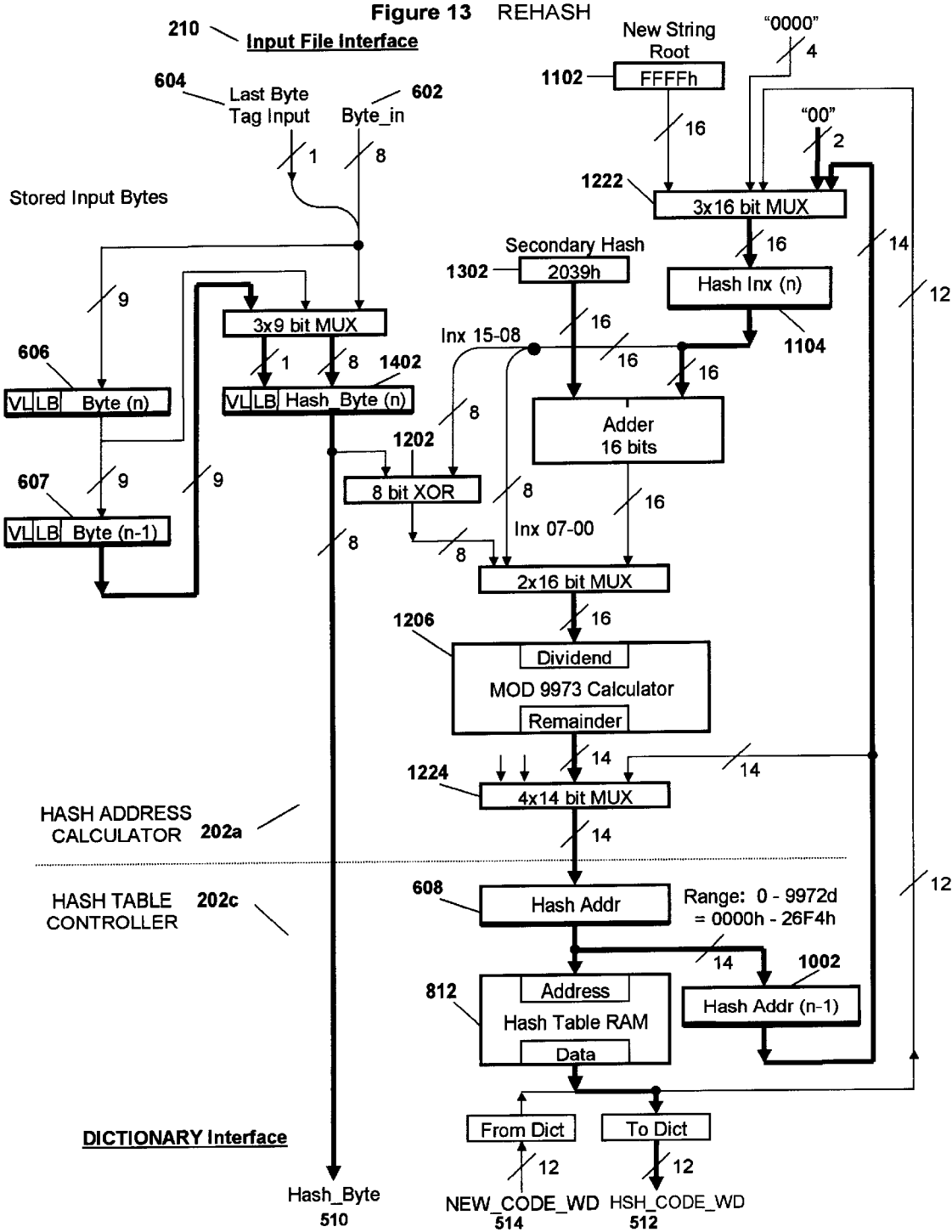
FIG. 13 illustrates a data flow path for a REHASH sequence in an LZW Hash Table Processor in accordance with one embodiment of the invention.

The bolded path in FIG. 13 highlights the data flow for the REHASH command. In one embodiment of the invention, in response to the REHASH command LWZ Hash Table Processor 202 recalculates the Hash Index 1104 of stored input byte(n−1) 607 or Byte(n) 606 using a REHASH algorithm rather than the PRIMARY HASH algorithm. Rather than doing an XOR 1202 on the input byte, the REHASH algorithm adds a constant value of 2039d 1302 to the current hash index 1104. The hash index 1104 is also updated with the current hash address value rather than with the code word. Hence the REHASH algorithm preferably adds 2039d onto the existing index and does a MOD 9973d calculation 1206 on the result. An exhaustive search for a free location is thus performed rather than the uniformly distributing assignments as is done by the PRIMARY HASH algorithm thus guaranteeing that an available hash table location will eventually be found.

OPEN_DICT COMMAND

The response of LZW Hash Table Processor 202 to an OPEN DICTIONARY command in accordance with one embodiment of the invention is identical to its behavior for a RESTART with the exception that the pipeline register valid and Last Byte bits are not changed. The integrity of the data pipeline registers is maintained across a dictionary closing and opening. The same illustrations (FIGS. 8 and 9) apply 4. LZW Hash Table Block Diagram FIG. 6 illustrates the major data paths of the Hash Address Calculator 202a and the Hash Table Controller 202c in accordance with one embodiment of the invention. The Hash Address Calculator 202a is illustrated in FIG. 6. The detailed block diagram for the Hash Table Controller 202c is illustrated in FIG. 7. The additional logic in FIG. 7 is the specialized logic to perform logical data structure Clearing and initializing. The operation of the data paths is performed by associated control logic described in state sequences and diagrams below.

5. LZW Hash Table General Timing Cycle

Figure 14:
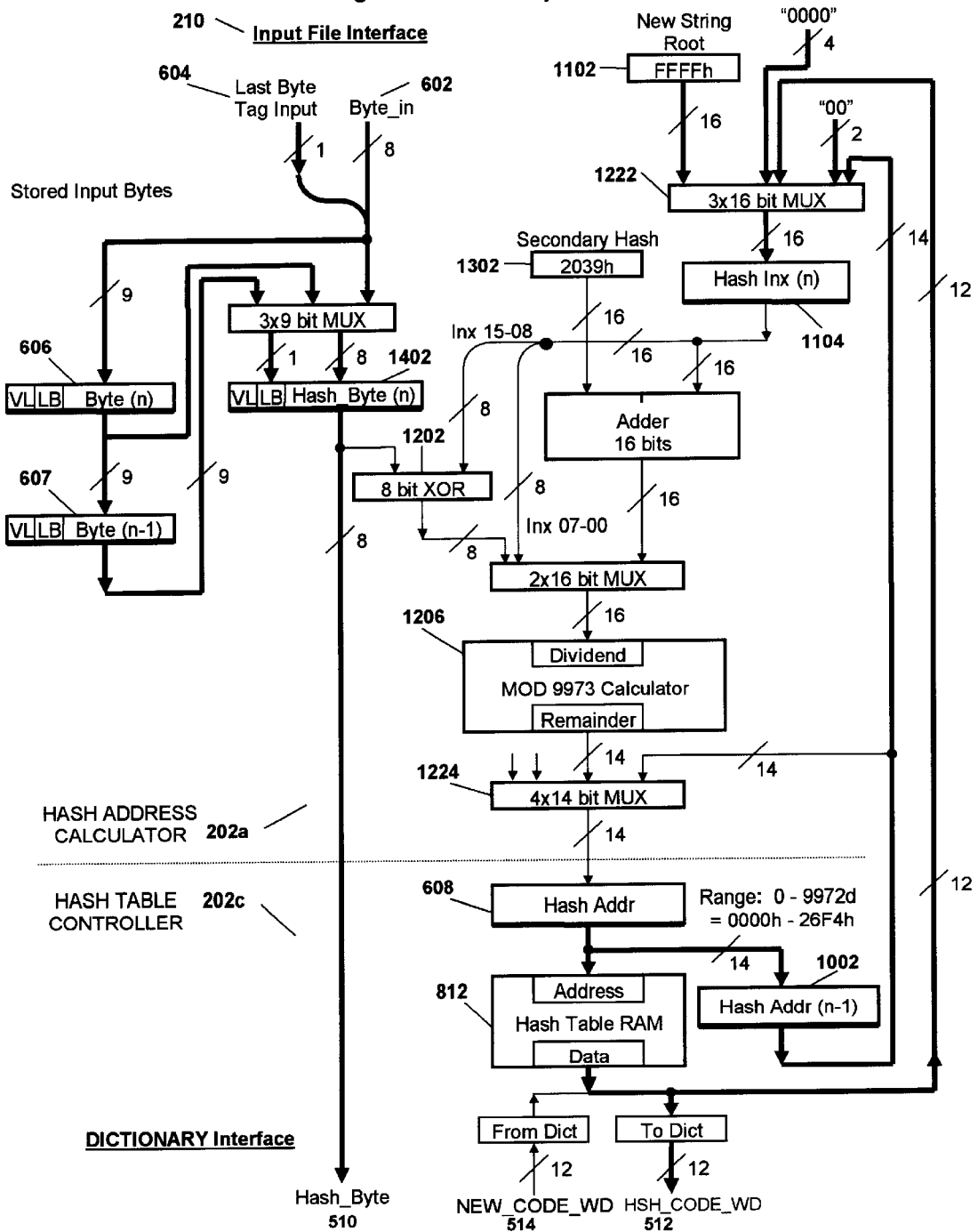
FIG. 14 illustrates a potential data flow path for a first cycle in an LZW Hash Table Processor in accordance with one embodiment of the invention.
Figure 15:
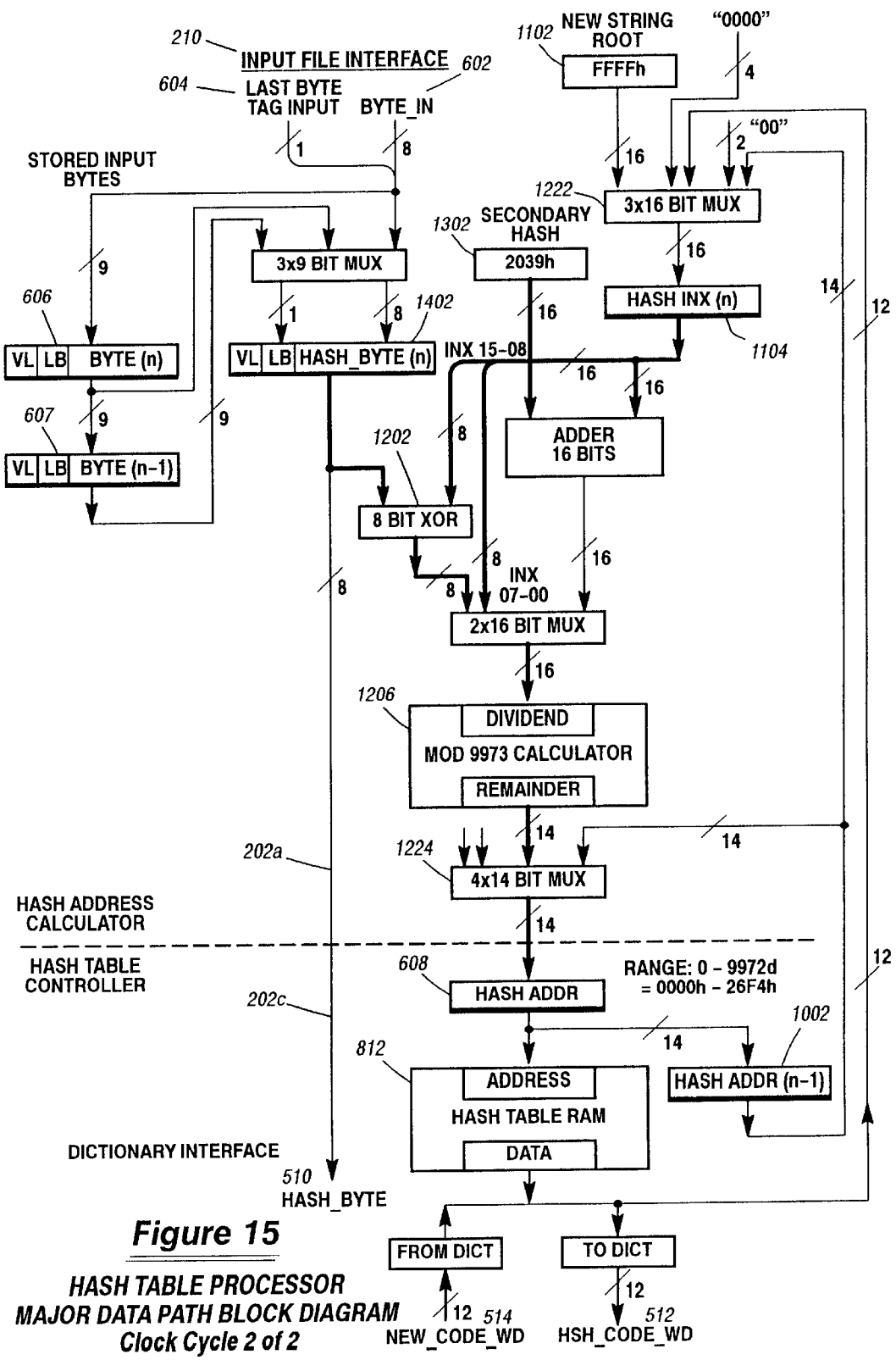
FIG. 15 illustrates a potential data flow path for a second cycle in an LZW Hash Table Processor in accordance with one embodiment of the invention.

FIGS. 14 and 15 highlight the potential set of data paths in clock cycle one and clock cycle 2, respectively, of LZW Hash Table Processor 202. In general, in one embodiment of the invention, it takes two clocks for LZW Hash Table Processor 202 to perform its calculation. Thus the fastest the Hash Byte register 1402, Hash_Index register 1204 and Hash_Addr register 1210 loads is once for every two clocks. Because of this, LZW Hash Table Processor 202 is the performance limiting processor in the data processing pipeline. The other processors are able to perform one data processing calculation per clock cycle.

Note that all of the possible data paths are highlighted for a given cycle. The intent of the diagrams is to indicate the sets of logic that may be activated in each cycle. It does not represent an actual data processing operation.

6. Hash Address Calculator 202a

Figure 16:
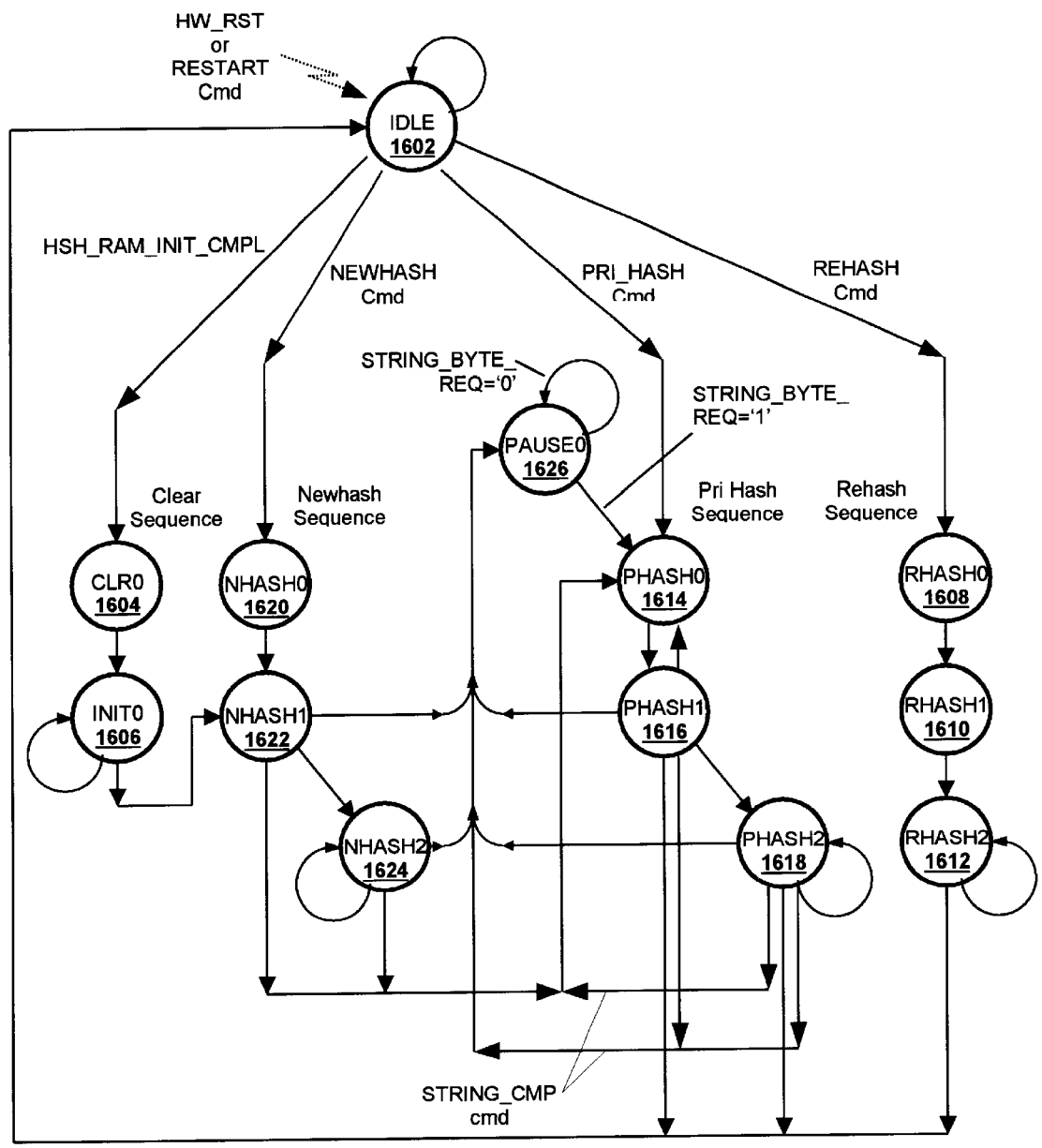
FIG. 16 illustrates an exemplary state sequence diagram of a Hash Address Calculator of an LZW Hash Table Processor in accordance with one embodiment of the invention.

The following sections describe the architecture and operation of the Hash Address Calculator 202a portion of LZW Hash Table Processor 202. FIG. 16 illustrates a state sequence diagram of the Hash Address Calculator 202a in accordance with one embodiment of the present invention.

The following is a legend for the state names in FIG. 16. Dotted lines on FIG. 16 indicate that an LZW Manager Processor 208 command or other interface signal is necessary for the state transition to occur.

| STATE NAME | STATE DESCRIPTION |
| --- | --- |
| IDLE | IDLE state. 1602 |
| CLR0 | Initialization sequence, CLEAR state 0. 1604 |
| INIT0 | Initialization sequence, INIT state 0. 1606 |
| RHASH0 | REHASH sequence, state 0. 1608 |
| RHASH1 | REHASH sequence, state 1. 1610 |
| RHASH2 | REHASH sequence, state 2. 1612 |
| PHASH0 | PRIMARY HASH sequence, state 0. 1614 |
| PHASH1 | PRIMARY HASH sequence, state 1. 1616 |
| PHASH2 | PRIMARY HASH sequence, state 2. 1618 |
| NHASH0 | NEWHASH sequence, state 0. 1620 |
| NHASH1 | NEWHASH sequence, state 1. 1622 |
| NHASH2 | NEWHASH sequence, state 2. 1624 |
| PAUSE0 | PRIMARY HASH sequence, Pause state 0. 1626 |

IDLE State 1602

In one embodiment of the invention, the IDLE state 1602 is the state in which the Hash Address Calculator 202a "parks" when no hashing activity is in progress. It is also the state that is entered unconditionally upon a HW RESET or a RESTART command. No data paths are enabled. No data from the input file 211 is accepted. If IDLE state 1602 was entered after either a HW RESET or RESTART command, the Hash Table initialization described above will also be started. Upon completion of the initialization, the Hash Table Controller 202c will issue a Hash RAM INIT Complete signal to the Hash Address Calculator 202a which will cause it to enter the CLEAR Sequence. Otherwise, the Hash Address Calculator 202a awaits a command from LZW Manager Processor 208 and enters the indicated sequence upon receipt of the command.

CLEAR Sequence

The CLEAR sequence comprises states CLR0 1604 and INIT0 1606.

CLR0, CLEAR sequence, CLEAR state 0 1604.

In one embodiment of the invention, CLR0 1604, the various registers are cleared to zero. This includes clearing any Last Byte flags. This is followed by an unconditional transition to INIT0 1606.

INIT0, CLEAR sequence, INIT state 1 1606.

In INIT0 1606, the value of FFFFh 822 is preloaded into the Hash Index register 1104 in preparation for hashing the first root from input file 211. In addition, the first byte from input file 211 is accepted and loaded into the Byte(n) register 606 if an external device is requesting acceptance of input. Otherwise, the INIT0 state 1606 is repeated until a request to accept an input byte 602 occurs. FIG. 11 highlights the data flow of the INIT0→NHASH1 sequence. The dotted path from the Input File Interface 210 to Hash Byte(n) register 1402 applies in this case. The path from stored Byte(n−1) 607 does not apply.

Condition: STRING_BYTE_REQ="0".

Description: External device is not requesting the Hash Table Processor 208 to accept an input byte 602.

Hash Address Calculator 202a Response: Stay in INIT0 state 1606.

Condition: STRING_BYTE_REQ='1'

Description: External device is requesting Hash Table Processor 208 to accept an input byte 602.

Hash Address Calculator 202a Response: Accept the first byte from input file 211 and load it into the Byte(n) register 606. Output STRING_BYTE_REQ='1' to the external device. Go to NHASH1 state 1622.

NEWHASH Sequence

The bolded data path of FIG. 11 illustrates the data flow for the NEWHASH sequence. The path from stored Byte(n−1) 607 to Hash Byte(n) register 1402 applies in this case. The dotted path from the Input File Interface 210 does not apply. In one embodiment of the invention the NEWHASH sequence comprises states NHASH0 1620, NHASH1 1622 and NHASH2 1624. This sequence is used to begin the processing of a new string. Thus, the recursive Hash Index 1104 gets reset to its initial state in this sequence. The NEWHASH sequence is executed on the first byte of the input file and, thereafter, unconditionally follows a NEW_PFX_WR command. When entering the NEWHASH sequence subsequent to the first input byte, the pipeline has been "stalled" because a new string prefix was just written. Thus the Byte(n) 606 and Byte(n−1) 607 registers and other pipeline registers contain data from a halted STRING COMPARE that requires reprocessing. The NEWHASH sequence is used as part of the processing to restore the pipeline flow after the stalled condition. The associated byte for the prefix just written is in the Byte(n−1) register 607 and must be NEWHASHed as a root of the next string.

NHASH0, NEWHASH sequence, state 0 1620.

In one embodiment of the invention, in NHASH0 1620, the 3×16 Hash Index MUX 1222 selects the value of FFFFh 1102 which is preloaded into the Hash Index register 1104 in preparation for REHASHing the byte from the prefix just written as a root of the next string. The Byte(n−1) register 607 is selected and loaded into the Hash Byte(n) register 1402. This is followed by an unconditional transition to NHASH1 1622. This state is very similar to INIT0 1606 with the difference that INIT0 1606 begins with an unprimed pipeline whereas in NHASH0 1620, the pipeline is in the Stalled state.

NHASH1, NEWHASH sequence, state 1 1622.

In one embodiment of the invention, in NHASH1 1622, the result of the hash calculation is loaded into the Hash Address register 608. This is followed by an unconditional transition to NHASH2 1624, PHASH0 1614 or PAUSE0 1626 depending upon conditions, below.

Condition: HSH_CODE_RDY '1' and (STRING_BYTE_REQ '1' or PL_LD_ENABLE='0')

Description: LZW Dictionary Processor 204 is indicating HSH_CODE_RDY to LZW Hash Table Processor 202 and pipeline flow can continue.

Hash Address Calculator 202a Response: Go to PHASH0 state 1614.

Condition: HSH_CODE_RDY '1' and (STRING_BYTE_REQ='0' and PL_LD_ENABLE='1')

Description: LZW Dictionary Processor 204 is indicating HSH_CODE_RDY to LZW Hash Table Processor 202 but pipeline flow can not proceed because the input device is not submitting an input byte for processing.

Hash Address Calculator 202a Response: Go to PAUSE0 state 1626.

Condition: HSH_CODE_RDY='0'

Description: LZW Dictionary Processor 204 is not indicating HSH_CODE_RDY to LZW Hash Table Processor 202.

Hash Address Calculator 202a Response: Go to NHASH2 state 1624.

NHASH2, NEWHASH sequence, state 2 1624.

There is no action in NHASH2 1624. NHASH2 1624 is a wait state to wait for LZW Dictionary Processor 204 to accept the code word. The conditions and responses are identical to NHASH1 state 1622.

STRING COMPARE Sequence

In one embodiment of the invention, the Hash Table Calculator 202a executes primarily the PRIMARY HASH sequence to perform the STRING COMPARE function. This occurs while the STRING_CMP command is in effect from the LZW Manager Processor 208. The PRIMARY HASH sequence must be entered via the NEWHASH sequence or through an explicit PRI_HASH command from LZW Manager Processor 208, following a REHASH sequence. There is no actual STRING COMPARE Sequence in the Hash Table Processor.

PRIMARY HASH Sequence

FIG. 12 highlights the data path flow for the PRIMARY HASH sequence for the Hash Address Calculator 202a for one embodiment of the present invention. Note that both clock cycle paths are highlighted and that only one of the two is active in a given clock cycle. FIG. 12 indicates that the byte selected for loading into the Hash Byte(n) register 1402 is from an external input source. Note that it is occasionally necessary to perform a PRIMARY HASH on bytes in the stored byte registers, Byte(n) 606 and Byte(n−1) 607 and that these paths may be enabled.

PAUSE0, PRIMARY HASH Sequence, Pause state 0 1626.

In one embodiment of the invention, Pause state 0 1626 is a state in which the PRIMARY HASH sequence, also used for the optimized STRING COMPARE function, parks when the input file interface device is not issuing a STRING_BYTE_REQ. It is used to keep the pipeline from being disrupted by a momentary lack of input data. A transition to PHASH0 1614 occurs when data is again presented to the input. This state is also entered for specific pipeline flush conditions.

PHASH0, PRIMARY HASH Sequence, state 0 1614.

In PHASH0 1614, the 3×16 Hash Inx MUX 1222 selects the code word value output from the Hash Table RAM 812 and this value is also recursively loaded into the Hash Index register 1104. The byte loaded into Hash Byte(n) register 1402 may be one of the following: the byte from the external input interface, the byte in Byte(n) 606 or the byte in Byte(n−1) 607. Which byte is loaded is determined with the assistance of pipeline control logic. After a byte is loaded into the Hash Byte(n) register 1402, there is an unconditional transition to PHASH1 1616.

PHASH1, PRIMARY HASH Sequence, state 1 1616.

In one embodiment of the invention, in PHASH1 1616, the 4×14 Hash Addr MUX 1224 selects the MOD 9973 value output from the MOD 9973 Calculator 1206. This value is also loaded into the Hash Addr register 608. The remainder of the actions are related to pipeline flow control and depend upon the conditions below. Note the conditions are similar to those in NHASH1 state 1622.

Condition: STRING_CMP='1' and HSH_CODE_RDY '1' and (STRING_BYTE_REQ '1' or PL_LD_ENABLE='0')

Description: LZW Manager Processor 208 issues a STRING_CMP command, LZW Dictionary Processor 204 indicates HSH_CODE_RDY to LZW Hash Table Processor 202 and pipeline flow can continue.

Hash Address Calculator 202a Response: Go to PHASH0 state 1614. This is the optimized, maximum speed processing path consisting of a repeated cycling between PHASH0 1614 and PHASH1 1616.

Condition: STRING_CMP='1' and HSH_CODE_RDY '1' and (STRING_BYTE_REQ='0' and PL_LD_ENABLE='1')

Description: LZW Manager Processor 208 issues a STRING_CMP command, LZW Dictionary Processor 204 indicates HSH_CODE_RDY to LZW Hash Table Processor 202 but pipeline flow can not proceed, primarily because the input file interface is not doing a STRING_BYTE_REQ.

Hash Address Calculator 202a Response: Go to PAUSE0 state 1626.

Condition: STRING CMP='1' and HSH_CODE_RDY='0'

Description: LZW Manager Processor 208 issues a STRING_CMP command, but LZW Dictionary Processor 204 is not indicating HSH_CODE_RDY to LZW Hash Table Processor 202. All conditions are GO except for LZW Dictionary Processor 204.

Hash Address Calculator 202a Response: Go to PHASH2 1618 state.

Condition: STRING_CMP='0'

Description: LZW Manager Processor 208 withdraws the STRING_CMP command.

Hash Address Calculator 202a Response: Go to IDLE state 1602.

PHASH2, PRIMARY HASH Sequence, state 2 1618.

In one embodiment of the invention, PHASH2 1618, is identical to PHASH1 1616 with the exception that there are no actions performed in PHASH2. However, all the conditions and next states are the same. No action is performed in PHASH2 1618 other than waiting until the conditions to make a state transition occur.

REHASH Sequence

FIG. 13 highlights the data path flow for the REHASH sequence for the Hash Address Calculator 202a in accordance with one embodiment of the invention. The state of the pipeline is such that preferably the byte requiring REHASHing is present in Byte(n−1) register 607 or Byte(n) register 606. Thus REHASH is performed on byte ordering of byte(n−1) followed by byte(n) which is their same ordering in the input file. REHASHing is dependent upon the result of the first hashing of each byte and both stored input bytes will not necessarily be REHASHed. Note that both clock cycle paths are highlighted and that only one of the two paths is active in a given clock cycle. Also note that there are a minimum of three states to the REHASH sequence because data processing from the Hash Byte(n) register 1402 through LZW Dictionary Processor 204 is required to determine if the REHASH was successful or if another REHASH is required, preventing pipelining. The Flowing state is resumed if processing is such that the PRIMARY HASH sequence is resumed after REHASHing.

RHASH0, REHASH Sequence, state 0 1608.

In one embodiment of the invention, in RHASH0 1608, the 3×16 Hash Inx MUX 1222 selects the Hash Addr(n−1) register 1002 output value and this value is also recursively loaded into the Hash Index register 1104. Byte(n−1) 607 or Byte(n) 606 is selected for input to the Hash Byte(n) register 1402. This is determined with the assistance of pipeline control logic. After Byte(n−1) 607 or Byte(n) 606 is loaded into Hash Byte(n) register 1402 there is preferably an unconditional transition to RHASH1 1610.

RHASH1, REHASH Sequence, state 1 1610.

In one embodiment of the invention, in RHASH1 1610, the 4×14 Hash Addr MUX 1224 selects the MOD 9973 value output from the MOD 9973 Calculator 1206. This value is also loaded into the Hash Addr register 608. This is followed by an unconditional transition to RHASH2 1612.

RHASH2, REHASH Sequence, state 2 1612.

In one embodiment of the invention, the Hash Address Calculator 202a waits in RHASH2 1612 for LZW Dictionary Processor 204 to indicate HSH_CODE_RDY at which time the Hash_Byte 510 and HSH_CODE_WD 512 pair retrieved from LZW Hash Table Processor 202 are transferred to LZW Dictionary Processor 204 by loading them respectively into Hash Byte(n−1) 2102 and Code Word(n−1) 2104 registers, respectively. RHASH2 1612 is repeated until LZW Dictionary Processor 204 indicates it is RDY at which time a transition to IDLE state 1602 occurs.

LZW Dictionary Processor 204 then uses Code Word(n−1) 2104 received from LZW Hash Table Processor 202 as an address to retrieve a code_word+byte pair from the Dictionary SRAM. It then compares the Hash Byte(n−1) 2102 and Code Word(n−2) 2106 which respectively contain the current byte and the stored prefix of the current byte to the values of byte and prefix retrieved from the dictionary data structure. Finally, it signals LZW Manager Processor 208 of the result of the compare. LZW Manager Processor 208 then issues another REHASH, PRI_HASH or NEW_PFX_WR command depending upon the result.

7. Hash Table Controller 202c

Figure 17:
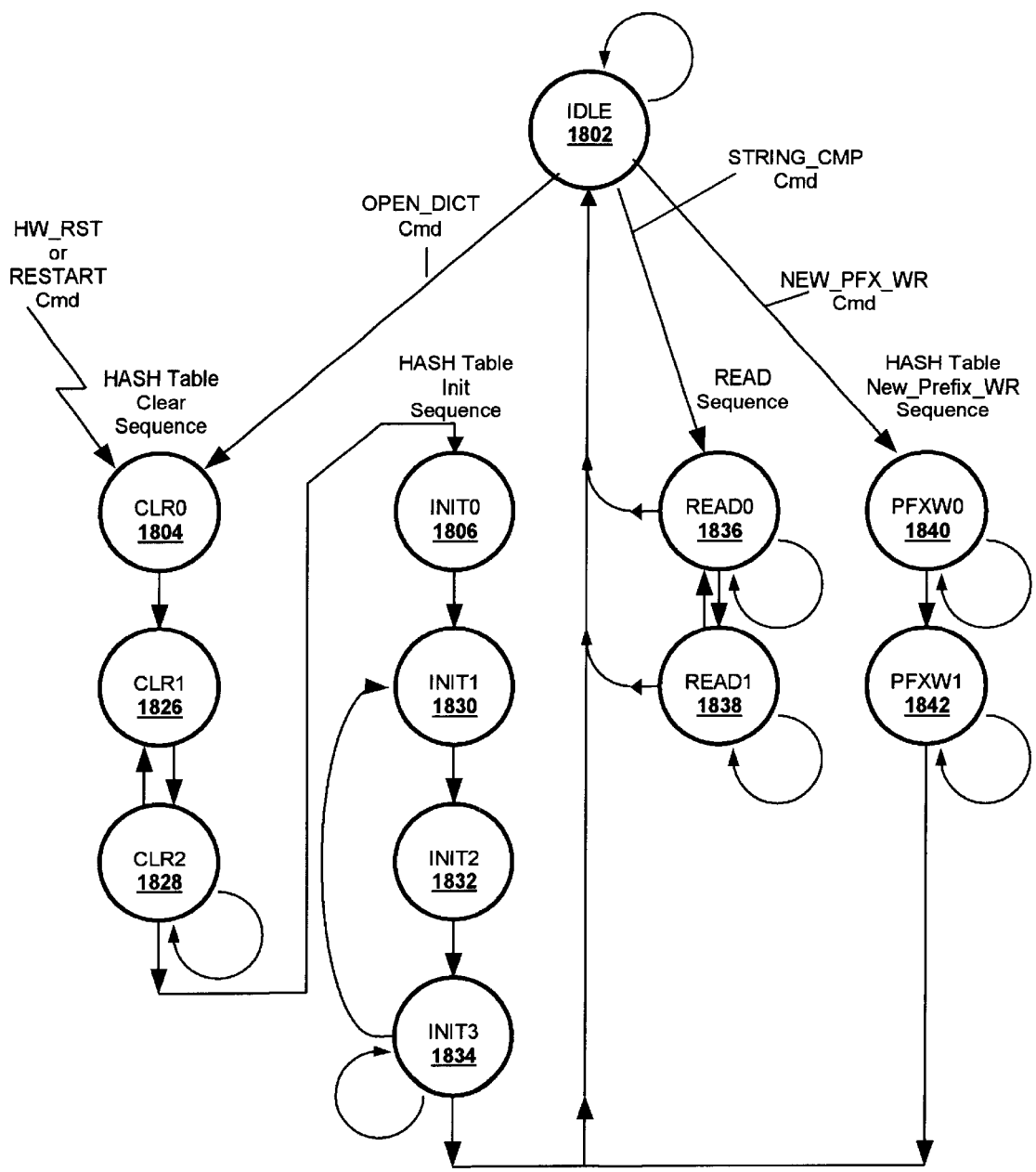
FIG. 17 illustrates a state sequence diagram of a Hash Table Controller of an LZW Hash Table Processor in accordance with one embodiment of the present invention.

FIG. 17 illustrates a state sequence diagram of the Hash Table Controller 202c in accordance with one embodiment of the invention. The sequences performed by the Hash Table Controller 202c are all related to writing and reading the Hash Table Logical Data structure 812 preferably stored in the physical Hash Table SRAM 812. Writing is required in order to CLEAR Hash Table 812, load prehashed values into the Hash Table 812 during initialization, and to write code words for new prefixes into the Hash Table 812 as commanded by the LZW Manager Processor 208 via NEW_PFX_WR commands. When no write operations are required, the Hash Table Controller 202c continually repeats the read sequence, where the paths and controls for retrieving data from the Hash Table 812 are enabled. READ sequence preferably is the sequence that the Hash Table Controller 202c performs for most of the activity of the Hash Address Calculator 202a. For all other than the READ sequence, only one of either the Hash Address Calculator 202a or Hash Table Controller 202c preferably is permitted to be actively executing a state sequence at a time. One of the two preferably is in the IDLE 1802, IDLE 1602, or READ sequence (comprising READ0 1836 and READ1 1838) while the other runs a sequence.

The following is a legend for the state names in the Hash Table Controller 202c State Sequence Diagram, FIG. 17. Dotted lines on the state diagram indicate that an LZW Manager Processor 208 command or other interface signal is necessary for the state transition to occur.

| STATE NAME | STATE DESCRIPTION |
|---|---|
| IDLE | IDLE state 1802. |
| CLR0 | CLEAR sequence, CLEAR state 0 1804. |
| CLR1 | CLEAR sequence, CLEAR state 1 1826. |
| CLR2 | CLEAR sequence, CLEAR state 2 1828. |
| INIT0 | Initialization sequence, INIT state 0 1806. |
| INIT1 | Initialization sequence, INIT state 1 1830. |
| INIT2 | Initialization sequence, INIT state 2 1832. |
| INIT3 | Initialization sequence, INIT state 3 1834. |
| READ0 | READ sequence, READ state 0 1836. |
| READ1 | READ sequence, READ state 1 1838. |
| PFXW0 | NEW PREFIX WRITE sequence, state 0 1840. |
| PFXW1 | NEW PREFIX WRITE sequence, state 1 1842. |

IDLE 1802

In one embodiment of the invention, in general, in the IDLE state 1802, no outputs are enabled and no action is performed except for transitioning into one of the CLEAR, READ or NEW PREFIX WRITE sequences. It represents primarily, a state to passively reside between LZW Manager Processor 208 commands.

CLEAR Sequence

In one embodiment of the invention, the CLEAR sequence comprises states CLR0 1804, CLR1 1826 and CLR2 1828. FIG. 8 highlights the data flow for the three-state CLEAR sequence.

CLR0, CLEAR sequence, CLEAR state 0 1804.

In one embodiment of the invention, in CLR0 1804, the Hash Address register 608 and the ROM Address register 802 are CLEARed to zero and an unconditional transition to CLR1 1826 occurs.

CLR1, CLEAR sequence, CLEAR state 1 1826.

In CLR1 1826, the Hash Address MUX 1224 enables the incrementer 804 for input to the Hash Address register 608. A trigger pulse is generated to the Hash Table RAM Write controller to begin a write cycle. The Hash Table RAM Write controller is a small, subordinate, state machine that generates precise SRAM write cycle timings. The write cycle proceeds in interlocked synchronization with the Hash Table controller 202c to perform the write of the CLEAR value into the Hash Table SRAM 812. Finally, an unconditional transition to CLR2 1828 occurs.

CLR2, CLEAR sequence, CLEAR state 2 1828.

In one embodiment of the invention, in CLR2 1828, the Hash Address MUX 1224 continues to enable incrementer 804 for input to the Hash Address register 608 and the value of 1FFFh 822 is enabled onto the Hash Table SRAM data bus. The RAM Write controller writes the value into the current location determined by the Hash Address register 608. This state is repeated until the RAM write controller responds with a HSH_WR_CMPL complete signal. Upon receipt of the HSH_WR_CMPL complete signal, Hash Address register 608 is loaded with the incremented value of the address and a transition back to state CLR1 1826 occurs.

The states CLR1 1826 and CLR2 1828 are repeated for 9973d loops to CLEAR all of the 9973d locations in the logical Hash Table data structure 812. The loop is terminated by a decode 808 of the Hash Address register value of 9972d, resulting in signal CLR_TC going TRUE, which terminates the loop. Preferably a transition to INIT0 1806 state occurs.

Hash Table Initialization Sequence

In one embodiment of the invention, the Hash Table initialization sequence loads the root values as code words into their proper pre-hashed locations in Hash Table 812. Note that the INIT Table ROM 910 data values are the pre-hashed Hash Table addresses for the root values. The root values are used as addresses into the ROM 910. Since the roots are byte values 00h to FFh, a ROM address counter 802 can be used to cycle through the root values, reading out the pre-hashed address values from the ROM 910 which are then loaded into the Hash Address register 608. Thus two levels of indirect referencing apply. The first is inputting the ROM address, 802, counter-based generation of 256 root values into the init ROM 910. The init ROM 910 outputs the associated value of the pre-hashed root location in the Hash Table. This ROM output is loaded into Hash Address register, 608, to select a Hash Table location. The counter-based root value from ROM address counter, 802, is finally written into the selected Hash Table location as a code word for the associated root. The following state descriptions detail each step in the sequence.

The INIT sequence comprises states INIT0 1806, INIT1 1830, INIT2 1832 and INIT3 1834. FIG. 9 highlights the data flow for the four-state INIT sequence.

Note that the Hash Address MUX 1224 enables the pre-hashed root values from INIT Table ROM 910 data output as input to the Hash Address register 608 in all four INIT states. This is mentioned here and is not duplicated in the description of each state.

INIT0, Initialization sequence, state INIT0 1806.

In one embodiment of the invention, in INIT0 1806, the Hash Address register 608 is cleared and an unconditional transition to INIT1 1830 occurs.

INIT1, Initialization sequence, state INIT1 1830.

In one embodiment of the invention, in INIT1 1830, the Hash Address register 608 is loaded with the pre-hashed root value obtained from the INIT Table ROM 910 and an unconditional transition to INIT2 1832 occurs.

INIT2, Initialization sequence, state INIT2 1832.

In INIT2 1832, The INIT ROM address from the ROM address counter, 802, is enabled to the Hash Table SRAM 812 as data. The address represents the root value. The high 4 bits are padded out with '0000'b to create a 12 bit code word for the root which is written into the Hash Table SRAM 812. Furthermore, a trigger pulse is generated to the Hash Table RAM Write controller to begin a write cycle. This is the same small, subordinate, state machine that generates the precise SRAM write cycle timings as described in CLR1 1826 state. The write cycle proceeds in interlocked synchronization with the Hash Table controller 202c to perform the write of the code word value for the root into the pre-hashed location in the Hash Table SRAM 812.

INIT3, Initialization sequence, state INIT3 1834.

In one embodiment of the invention, in INIT3 1834, the RAM Write controller writes the code word value for the root into the pre-hashed location in the Hash Table SRAM 812. This state is repeated until the RAM write controller responds with HSH_WR_CMPL complete signal. Upon the receipt of the HSH_WR_CMPL complete signal, the ROM Address register 802 is loaded with the incremented value of the root. This causes the next pre-hashed root location to be presented as input to the Hash Addr register 608. Finally, a transition back to state INIT1 1830 occurs. The states INIT1 1830, INIT2 1832 and INIT3 1834 are repeated for 101h loops to initialize all of the 256d root locations plus two control code locations in the logical Hash Table data structure 812. The loop is terminated by a decode 810 of the ROM Address register value of 101h, resulting in signal INIT_TC going TRUE, which terminates the loop and a transition to IDLE state 1802 occurs.

READ Sequence

Figure 18:
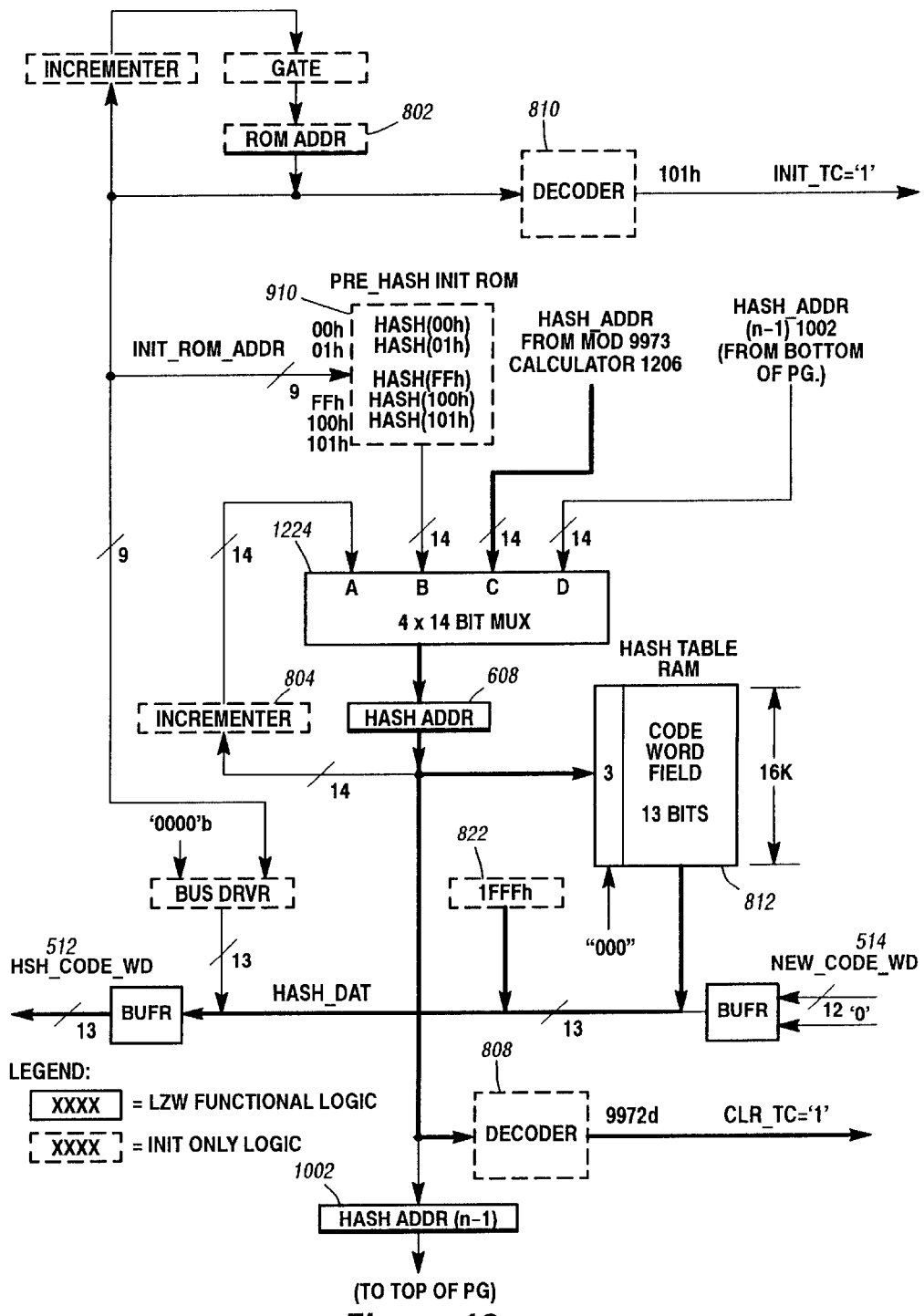
FIG. 18 illustrates a data flow path for a two-state READ sequence in a Hash Table Controller of an LZW Hash Table Processor in accordance with one embodiment of the present invention.

In one embodiment of the invention, the READ sequence comprises states READ0 1836, and READ1 1838. In the READ sequence, the paths and controls for retrieving data from the Hash Table 812 are enabled. This path is used for both pipelined and non-pipelined data retrieval from the Logical Hash Table structure 812. In the optimum flow case, the READ0 1836, READ1 1838 cycle is repeated to create a two clock cycle per pipeline cycle timing sequence. FIG. 18 highlights the data flow for the two-state READ sequence.

READ0, READ sequence, READ0 state 1836.

In one embodiment of the invention, in the READ0 1836 state, the Hash Addr MUX 1224 selects the Hash Address Calculator 202a output value as input to the Hash Address register 608. A control handshake is also performed with the Hash Address Calculator 202a to coordinate the timing of the pipeline levels.

If the Hash Address Calculator 202a signals that it has a valid hash address, a transition to READ1 1838 occurs.

If the Hash Address Calculator 202a signals to wait for a valid hash address, the READ0 state 1836 is repeated.

If LZW Manager Processor 208 withdraws the STRING COMPARE command, a transition back to IDLE 1802 occurs.

READ1, READ sequence, READ1 state 1838.

In one embodiment of the invention, in the READ1 state 1838, the Hash Address Calculator 202a output value is loaded into the Hash Addr register 608. The Hash Addr(n–1) register 1002 is also updated from the Hash Addr register 608 once each pipeline cycle. The data output of the Hash Table logical data structure 812 (HSH_CODE_WD 512) along with Hash_Byte 510, from the Hash Address Calculator 202a are enabled to LZW Dictionary Processor 204 as a byte/code word pair. A control handshake is also performed with LZW Dictionary Processor 204 to coordinate the timing of the byte/code word pair across pipeline levels.

If LZW Dictionary Processor 204 signals that it is ready to accept the byte/code word pair, the pipeline registers are updated and a transition back to READ0 1836 occurs.

If LZW Dictionary Processor 204 signals to wait for a valid hash address, the READ1 1838 state is repeated.

If LZW Manager Processor 208 withdraws the STRING COMPARE command, a transition back to IDLE 1802 occurs.

NEW PREFIX WRITE Sequence

In one embodiment of the invention, the NEW PREFIX WRITE sequence comprises states PFXW0 1840, and PFXW1 1842. In the NEW PREFIX WRITE sequence, the paths and controls for writing a new prefix value from LZW Dictionary Processor 204 into the Hash Table 812 are enabled. The bolded data path in FIG. 10 highlights the data flow for the two-state NEW PREFIX WRITE sequence.

PFXW0, NEW PREFIX WRITE sequence, state 0 1840.

In one embodiment of the invention, when LZW Manager Processor 208 issues a NEW_PFX_WR command, the Hash Address 608 of the unassigned Hash Table location is present in the Hash Addr(n–1) register 1002 as the final result of hashing through a particular string and encountering an unassigned Hash Table location. In PFXW0 1840, the Hash Address MUX 1224 enables the value in Hash Addr (n–1) register 1002 as input to the Hash Address register 608 and a load of the Hash Address register 608 with the updated value occurs, thus selecting the unassigned location in the Hash Table SRAM 812.

If LZW Dictionary Processor 204 is signaling a NEW_CODE_REQ, indicating that it is submitting a new prefix value, a trigger pulse is generated to the Hash Table SRAM Write control state machine to begin a write cycle to store the new prefix. This is the same, subordinate, state machine that generates the precise SRAM write cycle timings previously described. The write cycle proceeds in interlocked synchronization with the Hash Table controller 202c to perform the write of the prefix value into the Hash Table SRAM 812. A control handshake is also performed with LZW Dictionary Processor 204 to coordinate the timing of the pipeline levels. Finally, a transition to PFXW1 1842 occurs.

If LZW Dictionary Processor 204 does not signal a NEW_CODE_REQ, the PFXW0 state 1840 is repeated.

PFXW1, NEW PREFIX WRITE sequence, state 1 1842.

In PFXW1 1842, the NEW_CODE_WD 514 prefix value is enabled from LZW Dictionary Processor 204 to the Hash Table RAM 812 data inputs. A NEW_CODE_ACK response is signaled to LZW Dictionary Processor 204 to indicate that the code word for the prefix is being accepted. The RAM Write controller writes the code word into the current unassigned location determined by the Hash Address register 608. PFXW1 1842 is repeated until the RAM write controller responds with the HSH_WR_CMPL complete signal. Upon this event, a transition to IDLE 1802 occurs.

D. LZW Dictionary Processor 204

1. Structure and Function

Figure 19:
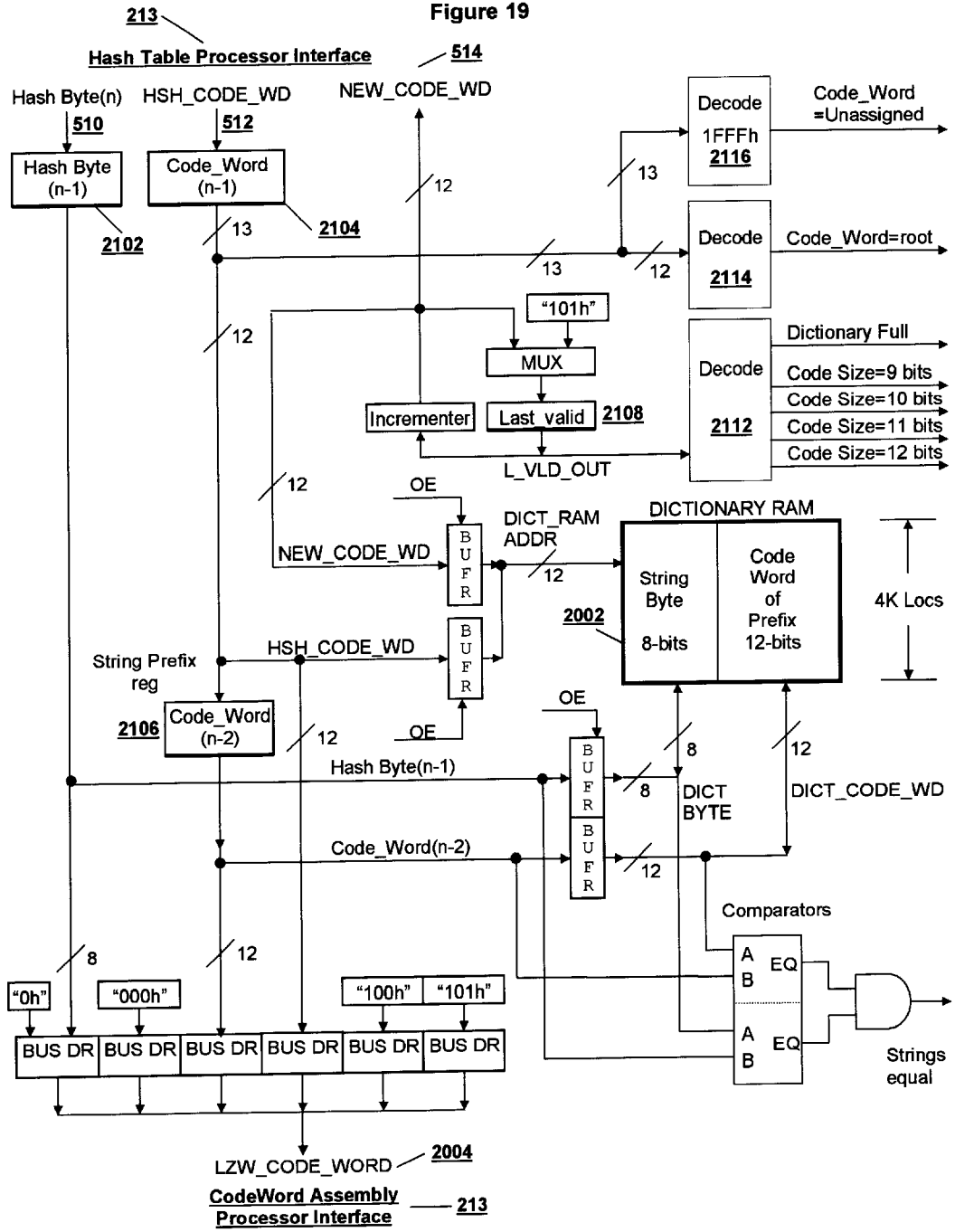
FIG. 19 illustrates a data path diagram for entering a byte and prefix pair into a Dictionary data structure of an LZW Dictionary Processor in accordance with one embodiment of the invention.

FIG. 19 contains a block diagram of the major data paths of LZW Dictionary Processor 204 in accordance with one embodiment of the invention. The outputs of Hash_Byte (n–1) 2102 and Code_Word(n–1) 2104 registers are at pipeline level 3. The output of Code_Word(n–2) register 2106 is at pipeline level 4. Code_Word(n–1) 2104 and Code_Word(n–2) 2106 registers, when marked valid, respectively contain the code word for the entire string including the byte in Hash Byte(n–1) 2102 and prefix of the string not including the byte in Hash Byte(n–1) 2102 processed thus far. The operation of these registers has been described above. There is also a Last_Valid register 2108, along with an associated combinational incrementer, an input MUX and output decoder. This set of logic is responsible for maintaining the current value of the Last_Valid code word that has been assigned and to generate the next value of code word for the string to be assigned. It also outputs a decode to LZW Code Word Assembly Processor 206 to notify it of the current width in bits of code words which are being output over the LZW_CODE_WORD 2004 interface.

Initialization of the Dictionary

In software-implementations of the LZW algorithm, the Dictionary is typically initialized by first clearing all values to 000h and then loading the root values and the control code values into Dictionary data structure 2002 locations 000h through 101h. In accordance with one embodiment of the present invention, the Dictionary data structure 2002 is initialized by resetting the value of the NEW_CODE_WD 514 pointer to 102h. This marks location 102h and all higher locations as cleared. Identifying roots is accomplished through a combination of LZW Dictionary Processor 204 control state and a decode of HASH_CODE_WD 512 rather than a Dictionary lookup and compare, thereby eliminating the need to initialize the Dictionary data structure 2002 with the root values and the control code values. Special logic 2114 decodes and identifies the control codes or code words for roots as being presented to LZW Dictionary Processor 204 when the control state is not expecting roots. When this limited special condition occurs, a hash collision of the current byte with a root or control code is identified without the overhead of requiring a Dictionary lookup of the control codes or roots. This is logic unique to the invention which obviates the need to initialize the Dictionary data structure 2002 with the root and control code values allowing a simple reset of the Last_Valid register 2108 to accomplish Dictionary Logical Data Structure 2002 initialization. These techniques both simplify and improve the performance of the invention by eliminating the necessity to CLEAR each location of the Dictionary data structure 2002 or initialize the Dictionary 2002 with root values and control code values.

LZW Dictionary Processor 204 is the second level of pipelined data processing. It comprises logic comprising pipeline levels L3 and L4. Items at level L3 are designated <Item>(n-1) and items at level L4 are designated <Item>(n-2).

In one embodiment of the present invention, LZW Dictionary Processor 204 performs the third step in the processing of input string data for LZW data compression, that is, LZW Dictionary Processor 204:

a) Uses the incoming byte+code word pairs defining the current string to compare with strings defined as byte+prefix entries stored in the Dictionary Logical Data Structure 2002.

b) Enters new byte+prefix pairs into the Dictionary Logical Data Structure 2002 as new strings.

The detailed data path diagram for LZW Dictionary Processor 204 is illustrated in FIG. 19.

LZW Dictionary Processor 204 has two basic modes of operation: data retrieval and data entry.

Data Retrieval Mode

Figure 20:
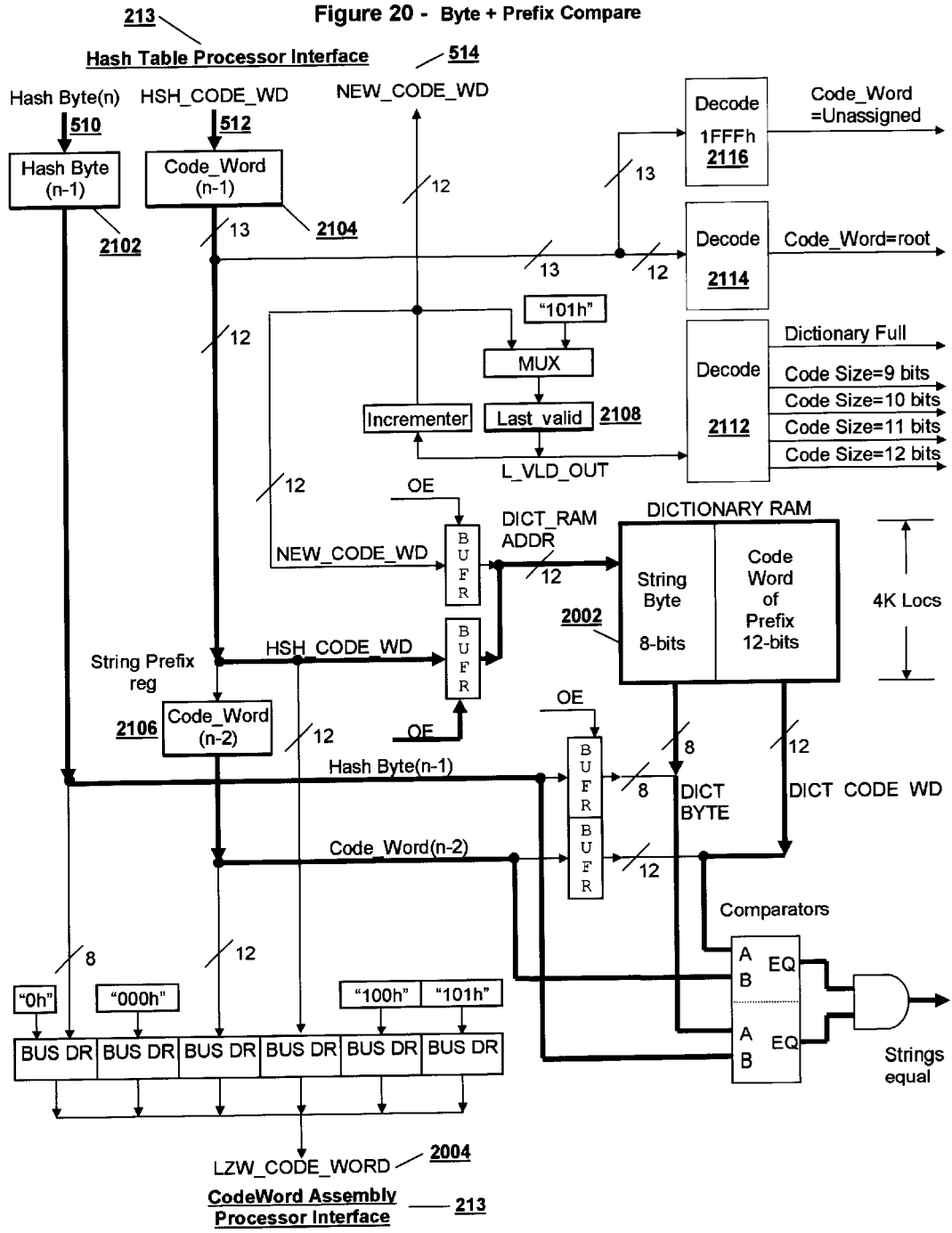
FIG. 20 illustrates a data path diagram for a data retrieval mode of an LZW Dictionary Processor when the pipeline mode is in the flowing state in accordance with one embodiment of the invention.

In one embodiment of the invention, in data retrieval mode, LZW Dictionary Processor 204 inputs byte/code word pairs (510 and 512) from LZW Hash Table Processor 202, and compares them with strings stored in the Dictionary Logical Data Structure 2002. Data retrieval mode is used for the PRIMARY_HASH, REHASH and STRING_COMPARE commands. NEWHASH does not cause a lookup and compare because there is no prefix associated with a NEWHASH of a root. The Data Retrieval Mode of LZW Dictionary Processor 204 applies when the pipeline is in the Flowing state. FIG. 20 highlights the data flow of an incoming byte and associated string code word and the compare with potentially corresponding strings stored in the Dictionary. In this state the contents of the various registers is as follows:

| REGISTER | CONTENTS |
| --- | --- |
| Hash_Byte (n − 1) | String byte being presented to Dictionary |
| Code_Word. (n − 1) | Code word for the string including both byte (n − 1) and its prefix (n − 1) |
| Code_Word. (n − 2) | Code word for prefix of Byte (n − 1), not including Byte (n − 1). |

Hash_Byte(n-1) 2102

In one embodiment of the invention, the contents of Hash_Byte(n-1) register 2101 represents the current byte of byte+prefix of the string being tested for its presence in the Dictionary Logical Data Structure 2002. Note that the contents of Hash_Byte(n) register 1402 in LZW Hash Table Processor 202, which is the successor byte to Hash_Byte(n-1) 2102 in input file 211, is, optimally, being processed simultaneously by LZW Hash Table Processor 202.

Code_Word(n-1) 2104

In one embodiment of the invention, the contents of the Code_Word(n-1) register 2104 represents the code word for the current string of byte+prefix of the string being tested for inclusion in the Dictionary Logical Data Structure 2002. This code word is the code word for the string, consisting of both the Hash Byte(n-1) and its prefix, NOT the code word for the prefix alone. Referring to the mechanism by which the Dictionary Logical Data Structure 2002 is addressed: the address into the Dictionary Data Structure 2002 is the code word for the string stored at that address. The data record entered at that code word defines the string stored there. The string is entered as two components: byte+prefix where byte is the actual value of the string character and prefix is the code word for the prefix which defines a subset of the current string (minus the byte) all the way back to the root. Also note that the code_word(n-1) 2104 is generated by recursively hashing the Hash_Byte(n-1) 2102 against the recursive Hash Index 1104 which represents hashing all the preceding bytes in the string from the root to the byte before the current byte. Thus the code_word(n-1) 2104 represents the hashing of the prefix plus the byte and thus represents the code_word for the entire string, not the prefix.

Code_Word(n-2) 2106

In one embodiment of the invention, the contents of code_word(n-2) register 2106 represents the code_word for the string ending with the byte preceding Hash_Byte(n-1) 2102. The byte preceeding Hash_Byte(n-1) 2102 in the input file could be conceptually considered as a virtual Hash_Byte(n-2). Thus this string ending in virtual Hash Byte(n-2) is the prefix of the string ending in Hash_Byte(n-1) 2102 and was processed in the pipeline cycle preceding the current cycle. Therefore, the code word in Code_Word(n-2) register 2106 is the code word for the prefix of the string ending in Hash_Byte(n-1) 2102. Note that for each pipeline cycle, a successor byte to the string is presented to the Dictionary Logical Data Structure 2002 for compare. If the compare is successful, such that the string is determined to be already contained in the Dictionary Logical Data Structure 2002, the current value of Code_Word(n-2) 2106 is replaced by the value of Code_Word(n-1) 2104. In this way, the code word for the current string including Hash Byte(n-1) becomes the prefix for the string containing the byte which succeeds Hash_Byte(n-1) 2102 from the input file.

With the preceding descriptions of the various data quantities in mind, the processing flow can be described as follows:

The value of the code word for the current string contained in Code_Word(n-1) 2104 is presented as an address to the Dictionary Logical Data Structure 2002. The selected location will contain a string entry consisting of byte+prefix. The value of the Hash_Byte(n-1) register 2102, representing the byte of the current string, along with the value of the code word for the prefix of the current string contained in Code_Word(n-2) 2106 are presented to the "B" inputs of two comparators. The values of byte and prefix, defining a stored string, are read from the Dictionary Logical Data Structure 2002 at location selected by Code Word(n−1) and presented to the corresponding "A" inputs of the comparators. Thus an incoming code word for a string along with its associated values of byte and prefix are compared with the corresponding values of byte and prefix stored in the Dictionary Data Structure 2002 location for that same code word (i.e.string). If compares of both byte and prefix values are equal, the string is already stored in the Dictionary and the signal, String_Equal, comes TRUE and the compare is said to be successful. Furthermore, since all compares of root to byte preceding this one have also been successful, a positive confirmation of equal strings has been made and the current string is said to be FOUND.

Data Entry Mode

Figure 21:
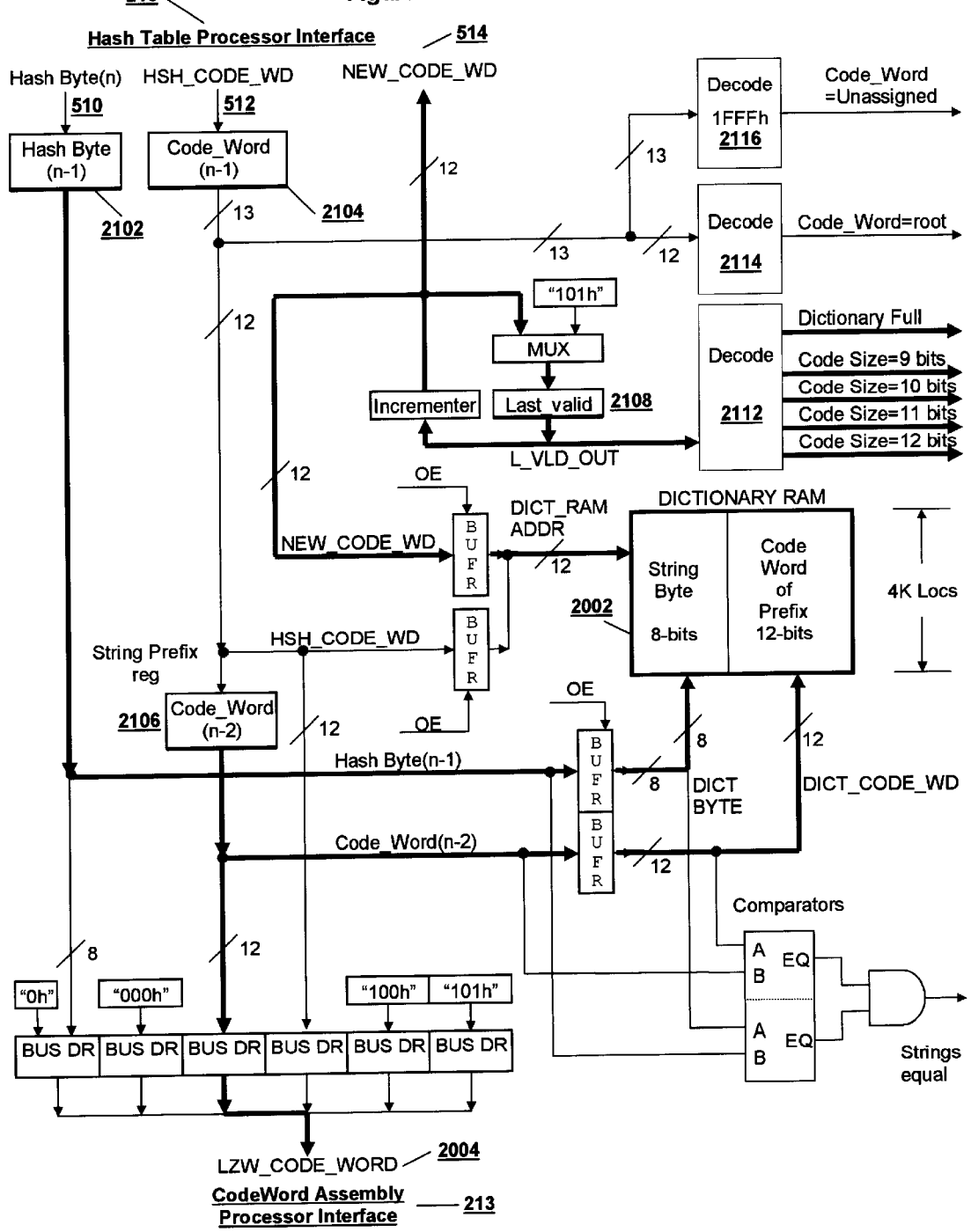
FIG. 21 illustrates an LZW Dictionary response to entering a data entry mode for a NEW PREFIX WRITE sequence.

In one embodiment of the invention, the data entry mode is used to enter new byte+code word pairs as new strings into the Dictionary Logical Data Structure 2002 as needed. Data Entry mode is only used for the NEW_PFX_WR command. The Data Entry Mode of LZW Dictionary Processor 204 generally occurs when the pipeline is in the Flowing state and temporarily interrupts this flow. The bolded data path of FIG. 21 illustrates the data flow for the NEW_PFX_WR command. In this mode the contents of the various registers is the same as described previously with one exception: the value in Code_Word(n−1) register 2104, rather than being a code word, is the 1FFFh value of the tag representing that the code word for the string ending in Hash_Byte(n−1) 2102 is unassigned. STRING COMPARE activity is halted and the pipeline state is frozen. The status indicating an unassigned code word has been encountered is communicated to the LZW Manager Processor 208 that responds by withdrawing the STRING COMPARE command and issuing a NEW_PFX_WR command. In this mode, the pointer in the Last_Valid register 2108, which represents the last code word value assigned in the Dictionary data structure 2002, is combinationally incremented by 1 and presented to the Hash Table as a NEW_CODE_WD 514. This same value is presented to the input of the Last Valid register 2108 and is also enabled as the Dictionary SRAM 2002 address. Thus the code word for the new string is selecting a data structure location in the Dictionary data structure 2002. Simultaneously, the contents of the Hash_Byte(n−1) 2102, (string byte) register and the Code_Word (n−2) 2106, (string prefix) register are enabled to the corresponding Dictionary SRAM 203 data fields. The values are then written to that location, thus creating a new entry in the Dictionary data structure 2002. In addition, the contents of the Code_Word(n−2) register 2106, code_word for the string prefix, is additionally enabled to LZW Code Word Assembly Processor 206 for insertion into the output file 217. Simultaneously, LZW Hash Table Processor 202 enters the NEW_CODE_WD 514 value into the Hash Table 812 as previously described.

2. LZW Dictionary Processor 204 Interfaces

In one embodiment of the invention, LZW Dictionary Processor 204 is the second of three cascaded String Data Processors 202, 204, and 206 that form the data processing path of the LZW algorithm. LZW Dictionary Processor 204 has three interfaces:

a) To LZW Hash Table Processor 202, interface 213
b) To LZW Code Word Assembly Processor 206, interface 215
c) To LZW Manager Processor 208, interface 208c LZW Hash Table Processor interface 213 and LZW Code Word Assembly Processor interface 215 are on the same hierarchical level and are peer-to-peer, data path interfaces. LZW Manager interface 208c is to LZW Manager Processor 208, an upper hierarchical level processor and is a control and status interface only. No data crosses interface 208c. Data is only moved across LZW Hash Table Processor interface 213 and LZW Code Word Assembly Processor interface 215.

a. LZW Dictionary Processor Interface to LZW Hash Table Processor, Interface 213

LZW Hash Table Processor interface 213 has been described previously in section III. C.2.b.

b. LZW Dictionary Processor Interface to LZW Code Word Assembly Processor, Interface 215

LZW Code Word Assembly Processor interface 215 comprises one data item, an LZW_CODE_WORD 2004 and five control items. The data item comprises a 12 bit code_word named LZW_CODE_WORD 2004 along with a decoded, 4 bit, Code_Size control item 2118, output of decoder 2112, which identifies the size in bits of the LZW_CODE_WORD 2004 by means of one of four mutually exclusive signals, Code_Size=9 through Code_Size=12. In addition a LAST_ASSY_CODE tagging the last code word of a compression session is included. LZW_CODE_WORD 2004 is the code word value, in general, obtained from Code_Word(n−2) register 2106. However, there are other special cases of LZW_CODE_WORDs including the two control codes, 100h and 101h, a pad out code word of all zeroes and a selection of Code_Word(n−1) 2104 as the output code word. The associated control interface is a simple REQ/ACK interface having the two signals named ASSY_CD_REQ, and ASSY_CD_ACK. LZW Code Word Assembly Processor 206 waits for LZW Dictionary Processor 204 to signal with ASSY_CD_REQ and then responds combinationally with ASSY_CD_ACK if it is able to accept the code word transfer from LZW Dictionary Processor 204. In one embodiment of the invention, LZW Code Word Assembly Processor 206 is always ready to respond. The only exception is if the output device is not accepting output from the LZW Dictionary Processor 204 and the pipeline "backs up". In this case the ACK will not be issued until the output device responds and the pipeline clears.

Finally, there is a "Last" tag associated with the LZW_CODE_WORD 2003 which indicates that the code word being transferred is the last of the current output file 217. Only null code words of value 000h for possible padding out partial byte fields in the output file 217 will follow.

c. LZW Dictionary Processor 204 Interface to LZW Manager Processor 208, Interface 208c Interface 208c was described previously in Section III. A.3.

3. Response to LZW Manager 208 Commands

In one embodiment of the invention, LZW Dictionary Processor 204 is required to act upon all of the seven LZW Manager Processor 208 commands. The following paragraphs describe the response of LZW Dictionary Processor 204 to each of the commands.

HW RESET

Although not a command, a hardware reset unconditionally places LZW Dictionary Processor 204 into the IDLE state 2502. Once in IDLE 2502, the Last_Valid (Code word) register 2108 is loaded with a value of 101h, the End of Information code. This initializes the Dictionary Logical Data Structure 2002. The value of 101h is the highest numbered entry in the Dictionary data structure 2002 at this point. The NEW_CODE_WD 514 pointer is the incremented value of Last Valid 2108 or 102h. 102h preferably is used as a code word to be assigned in the first NEW_PFX_WR operation.

RESTART COMMAND

In one embodiment of the invention, the RESTART command causes a transition from IDLE 2502 to CC1 state 2566. CC1 state 2566 is used to insert a CLEAR Code, code word value 100h, in the output file 217, as the first entry in the output file.

STRING_CMP COMMAND

In one embodiment of the invention, when a STRING_CMP command is in effect, LZW Dictionary Processor 204 inputs byte+code word pairs from LZW Hash Table Processor 202, and compares them with strings stored in the Dictionary Logical Data Structure 2002 as previously described in the Data Retrieval mode of operation. FIG. 20 illustrates the data paths involved in this operation. Not bolded in the figure is the replacement of Code_Word(n-2) 2106 with Code_Word(n-1) 2104 which occurs if the compare is successful. By performing this replacement, the code word for the current string byte becomes the code word for the prefix of the next byte. The compare process continues until a Code Word=Unassigned is detected which halts processing and freezes the pipeline. LZW Manager Processor 208 then withdraws the STRING_CMP command and immediately issues a NEW_PFX_WR command. Note that LZW Dictionary Processor 204 defaults to performing STRING COMPARE when no overriding command is in effect. It does not explicitly use or respond to the STRING_CMP command. String compare activity is driven by requests to process incoming byte+code word pairs marked as valid from the LZW Hash Table Processor 202.

NEW_PFX_WR COMMAND

In one embodiment of the invention, LZW Dictionary Processor 204 responds to a NEW_PFX_WR command by writing a new byte+code word pair as a new string into the Dictionary Logical Data Structure 2002 as previously described above in the Data Entry mode of operation. The bolded paths of FIG. 21 highlight the data paths involved in this operation. LZW Dictionary Processor 204 supplies an updated value of NEW_CODE_WD 514 to LZW Hash Table Processor 202. Both LZW Hash Table Processor 202 and LZW Dictionary Processor 204 update their data structures with their respective data entries simultaneously. In addition, LZW Dictionary Processor 204 outputs the contents of Code_Word(n-2) register 2106 as an LZW_CODE_WORD 2004 to LZW Code Word Assembly Processor 206 for insertion into the output file 217. The Code Size outputs of decode 2112 are highlighted here, although they are always valid, because the only time it is possible for them to change is as a result of incrementing Last Valid 2108 at the end of a New Prefix_Write. LZW Dictionary Processor 204 transitions back to IDLE 2502 after completing the NEW_PREFIX_WRITE sequence. LZW Manager 208 follows the NEW_PFX_WR command with a NEWHASH command.

NEWHASH, REHASH, PRI_HASH COMMANDS

It should be noted that any hashing algorithm may be used to generate Hash_Byte(n-1) 2102 and Code_Word(n-1) 2104 pair presented as input to LZW Dictionary Processor 204. However, the LZW Dictionary Processor 204 is subject to pipeline disruptions and preferably part of its control is managing the pipeline valid tags associated with pipeline levels 3 and 4 and enabling or disabling the load of selected pipeline registers during each pipeline cycle.

NEWHASH COMMAND

In one embodiment of the invention, LZW Manager Processor 208 issues a NEWHASH command each time it processes the first character, (root), of a new character string. NEWHASH is generally the first operation toward restoring pipeline flow. In response to the command, LZW Dictionary Processor 204 invalidates pipeline levels 3 and 4, which are in one embodiment the only pipeline registers in LZW Dictionary Processor 204 to clear the pipeline in preparation for reestablishing the pipeline flow. LZW Dictionary Processor 204 is already in IDLE 2502 from the previous NEW_PFX_WR command. In IDLE 2502, the Hash_Byte (n-1) 2102 and Code_Word(n-1) 2104 registers are conditionally loaded and pipeline level 3 is conditionally tagged as valid The NEWHASH command is a one clock command. NEWHASH is preferably followed by the STRING_CMP command. The first pipeline cycle in STRING_CMP validates pipeline level 4 and restoration of the pipeline flow is complete.

PRI_HASH COMMAND

In one embodiment of the invention, the PRI_HASH command is issued by the LZW Manager Processor 208 after performing a REHASH which resulted in a STRING_FOUND condition. This is done to restore normal flow in the pipeline. The complete sequence is:

STRING_CMP→REHASH→PRI_HASH→STRING_CMP

In response to the PRIMARY HASH command LZW Dictionary Processor 204 invalidates pipeline level 3 which represents stale information left over from the preceding (non-pipelined) REHASH. Level 4 remains valid because it contains the prefix of the string that was found during the REHASH.

REHASH COMMAND

In one embodiment of the invention, REHASH is an operation which destroys pipeline flow. The REHASH command is issued by LZW Manager Processor 208 during a STRING COMPARE in which a hash collision has occurred. In response to the REHASH command LZW Dictionary Processor 204 transitions from the STRING COMPARE sequence to the IDLE state 1802. Also in response, LZW Dictionary Processor 204 invalidates pipeline level 3 that represents stale information left over from the preceding STRING_CMP or (non-pipelined) REHASH. Code Word (n-2) at level 4 remains valid because it contains the prefix of the string that was found thus far during either STRING_CMP or preceding REHASH. The bolded data flow path of FIG. 20 also highlights the data flow for REHASH. Note that Code_Word(n-2) register 2106 is not updated each pipeline cycle as would apply to the STRING COMPARE case where the string is found. It is eventually updated if the final REHASH results in a STRING_FOUND condition. This register, otherwise, remains frozen until the hash collision is resolved.

OPEN_DICT COMMAND

In one embodiment of the invention, the OPEN DICT command is issued by the LZW Manager Processor 208 any time a NEW_PFX_WR is needed, but the Dictionary Logical Data Structure 2002 is FULL as indicated by the Dictionary Full output of decoder 2112 signalling a TRUE condition. In this case, the LZW Dictionary Processor 204 outputs the contents of Code_Word(n-2) register 2106 as an LZW_CODE_WORD 2004 to LZW Code Word Assembly Processor 206 for insertion into the output file 217 in the normal manner, but the Hash Byte(n-1) which is the root of the next string is applied to the new Dictionary data structure 2002 and eventually becomes encoded in the new Dictionary session of the output file.

Figure 23:
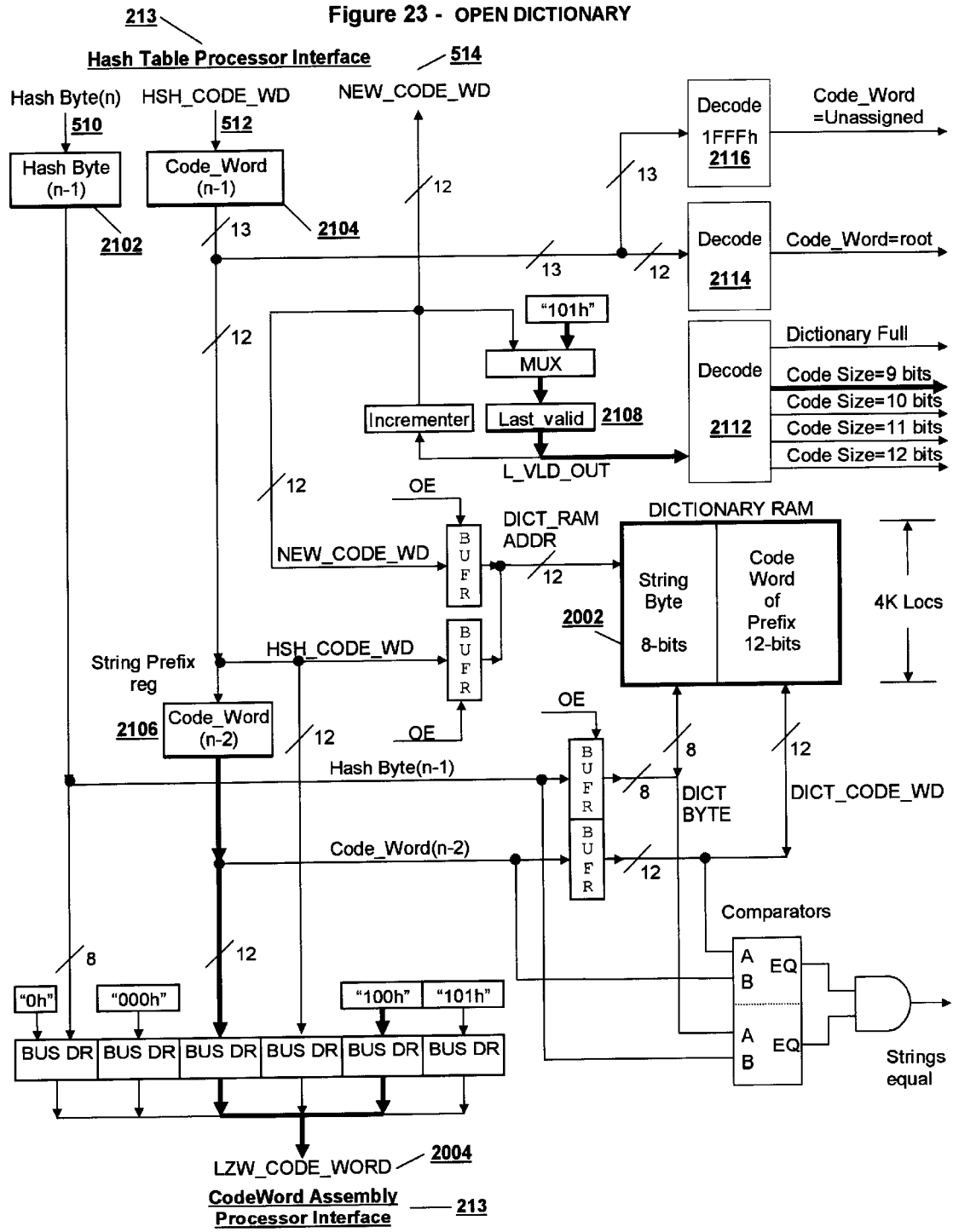
FIG. 23 illustrates a data flow path for an OPEN DICTIONARY sequence in accordance with one embodiment of the invention.

In response to the OPEN_DICT command, LZW Dictionary Processor 204 first outputs the contents of Code_Word(n-2) register 2106 as an LZW_CODE_WORD 2004 to LZW Code Word Assembly Processor 206 for insertion into the output file 217 the same as for a NEW_PFX_WR. Next, the code_word value of 100h, the CLEAR Code, is output to LZW Code Word Assembly Processor 206 for insertion into the output file 217. Finally, the Last_Valid register 2108 is reinitialized to a value of 101h, thus clearing the Dictionary Logical Data Structure 2002 for the start of a new Dictionary 2002 and signalling to the LZW Code Word Assembly Processor 206 a rollback in the code word size from 12 bits back to 9 bits. The bolded data flow path of FIG. 23 highlights the data flow for OPEN_DICT. Note that it shows all three steps in a single diagram and thus the illustration of time sequence is compromised.

CLOSE FILE SEQUENCE

Figure 22:
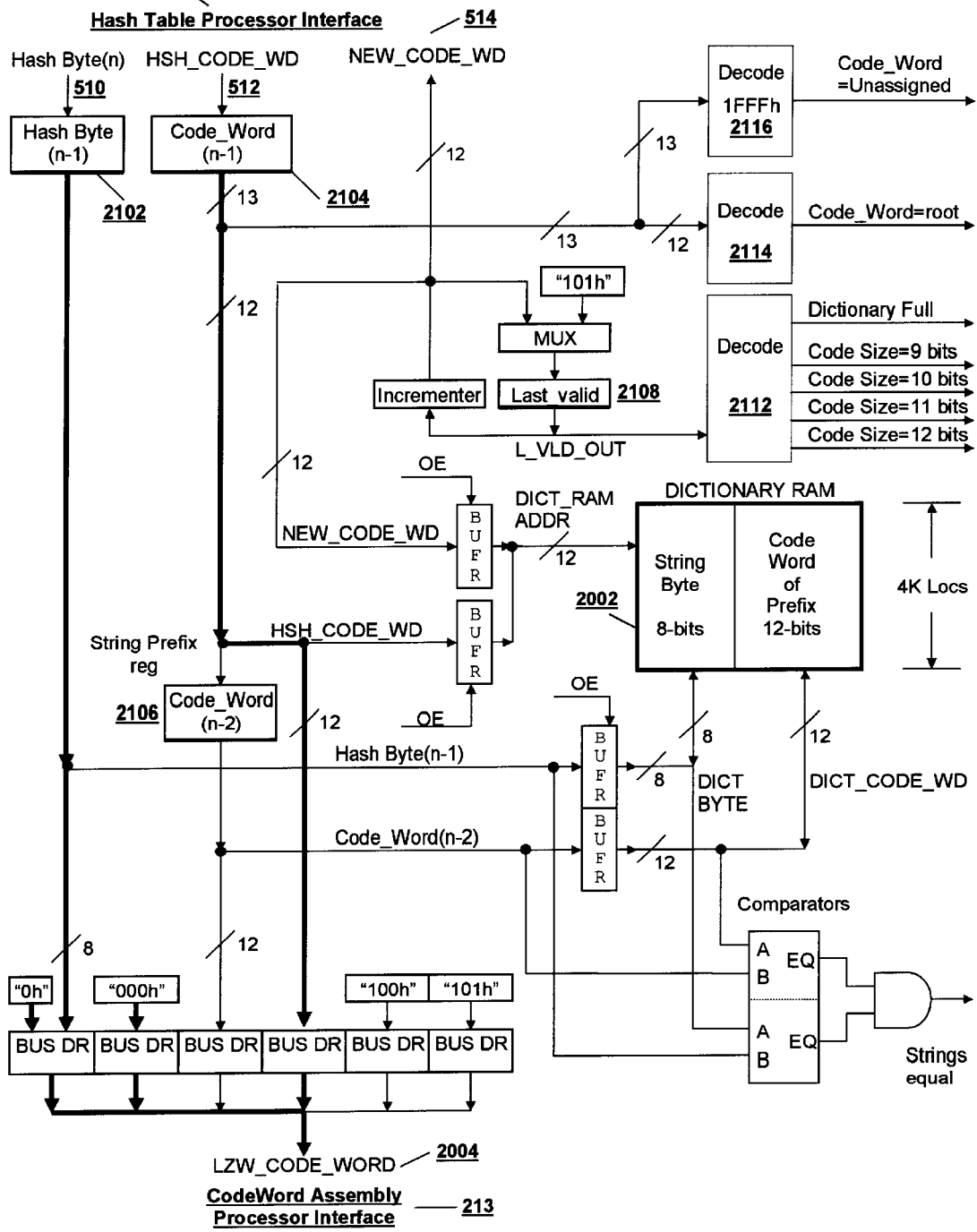
FIG. 22 illustrates an LZW Dictionary data flow path diagram for the sending of the last code word of a CLOSE FILE sequence in accordance with one embodiment of the invention.

In one embodiment of the invention, the CLOSE FILE sequence is not commanded by LZW Manager Processor 208 and thus executing this sequence is not a response to a command. It is performed automatically by LZW Dictionary Processor 204 when the Last Byte of the input file 211 is being encoded into a code word by LZW Dictionary Processor 204. There are two mutually exclusive cases:

a) The byte(n−1) 2102 and code_word(n−1) 2104 pair values match a Dictionary data structure 2002 entry. In this case the last code word inserted into the output file 217 is for the currently found string. Note in this final special case, the code word is not a prefix, since there is no more linking to be performed. Rather, it is the code word for the string. This code word includes encoding for the Last Byte of the input file 217. The code word is not obtained from Code Word(n−2) 2106 as in the usual case, but rather from Code_Word(n−1) 2104 which contains the code word which encodes the entire final string.

b) The byte(n−1) 2102 value is a root. In this case the last code word inserted into the output file 217 is the code_word for the root. In this case, the code word is obtained from Hash_Byte(n−1) 2102 padded with sufficient leading zeroes to fill the current code word size. This is justified by the property that a code word for a root has a value equivalent to the root value. Each case is automatically detected and processed in the CLOSE FILE sequence. Finally, the output file 217 is padded out with sufficient "000"h values to flush the remaining code words through LZW Code Word Assembly Processor 206 and to ensure inclusion of the entire last code word in the final byte of the output file. This is the final sequence performed by the LZW HW Data Compression Co-Processor 12 in processing an input file. At the end of this sequence, the encoded output file is complete. FIG. 22 highlights the data path for the two cases of last code word as well as the padding with "000"h. All three cases are highlighted although only one case can be active at a time.

In one embodiment of the invention, the Dictionary SRAM 2002 is a physical device containing the Logical Dictionary Data Structure 2002. Dictionary SRAM 2002 has a small associated state machine to perform write cycles, similar to the one associated with the Hash Table SRAM 812. There is logic on the LZW_CODE_WORD 2004 output which allows the selection of one of six values for output by LZW Dictionary Processor 204 to LZW Code Word Assembly Processor 206 as a code word. The normal value is the contents of Code_Word(n−2) register 2106 which is the code word for the current string prefix. The other values are "100"h, CLEAR Code, which is inserted between Dictionary Sessions, the contents of Code_Word (n−1) register 2104 which, when selected, contains the code word for the last string, not the prefix, of the string containing the last byte of the input file. Another one of the six values is the value of the Hash_Byte(n−1) register 2104 which, when selected, contains the last byte and, equivalently, its code word, of the input file. It is padded with "0"h in the upper bits to generate a code word for the last byte which is encoded as a root. Finally, a value of "000"h is available to pad out the output file sufficiently to ensure inclusion of the entire last code word in the final output byte. The operation of the data paths is performed by associated control logic. This control logic is described in state sequences and diagrams in the following sections.

4. LZW Dictionary Processor 204 General Timing Cycle

In one embodiment of the invention, it typically takes one clock for LZW Dictionary Processor 204 to perform its function in the pipeline Flowing state. However, as discussed above, LZW Hash Table Processor 202 limits pipeline cycles to one pipeline cycle every two clocks and therefore limits the performance of LZW Dictionary Processor 204.

5. LZW Dictionary Processor 204 State Sequence Diagram

Figure 24:
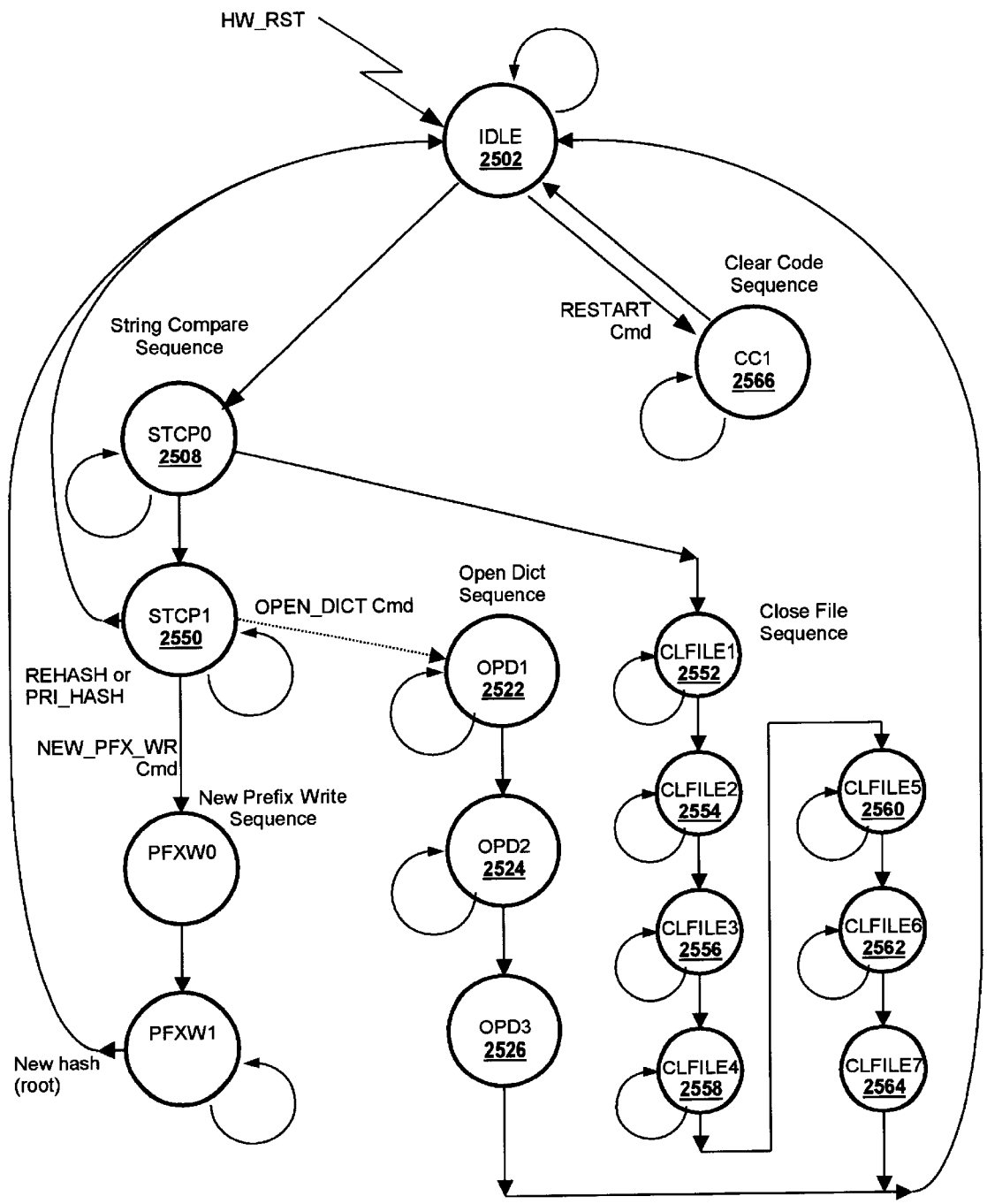
FIG. 24 illustrates a state sequence diagram for an LZW Dictionary Processor in accordance with one embodiment of the invention.

FIG. 24 illustrates a state sequence diagram of LZW Dictionary Processor 204 in accordance with one embodiment of the invention.

The following is a legend for the state names in the LZW Dictionary Processor 204 State Sequence Diagram of FIG. 24. Dotted lines on the state diagram indicate that an LZW Manager Processor 208 command or other interface signal is necessary for the state transition to occur.

| STATE NAME | STATE DESCRIPTION |
|---|---|
| IDLE | IDLE stale 2502. |
| STCP0 | Input STRING COMPARE sequence, state 0 2508. |
| STCP1 | Input STING COMPARE sequence, state 1 2550. |
| PFXW0 | New Prefix WR sequence, state 0 2510. |
| PFXW1 | New Prefix WR sequence, state 1 2512. |
| OPD1 | OPEN DICTIONARY sequence, state 1 2522. |
| OPD2 | OPEN DICTIONARY sequence, state 2 2524. |
| OPD3 | OPEN DICTIONARY sequence, state 3 2526. |
| CLFILE1 | Close File sequence, state 1 2552. |
| CLFILE2 | Close File sequence, state 2 2554. |
| CLFILE3 | Close File sequence, state 3 2556. |
| CLFILE4 | Close File sequence, state 4 2558. |
| CLFILE5 | Close File sequence, state 5 2560. |
| CLFILE6 | Close File sequence, state 6 2562. |
| CLFILE7 | Close File sequence, state 7 2564. |
| CC1 | Clear Code sequence, state 1 2566 |

IDLE State 2502

In one embodiment of the invention, the IDLE state 2502 is the state in which LZW Dictionary Processor 204 "goes" after one of the pipeline disrupting events: NEW_PFX_WR, RESTART, REHASH or NEWHASH occurs and the pipeline flow must be reestablished. Generally, all the pipeline levels have been invalidated when the IDLE state 2502 is entered. It is also the state that is entered unconditionally upon HW reset. In this state, the logic waits for the Hash Table logic in pipeline level 2 to go valid. Then it loads the pipeline level 3 registers, Hash_Byte(n−1) 2102 and Code Word(n−1) 2104 registers and transitions to STCP0 state 2508.

CLEAR Code Sequence

In one embodiment of the invention, the CLEAR Code sequence comprises a single state: CC1 2566.

CC1, CLEAR Code sequence, state 1 2566.

In one embodiment of the invention, CC1 2566 is only executed once in the beginning of a Compression Session, in response to the RESTART command. It sends the CC code word value of "100"h to LZW Code Word Assembly Processor 206 for insertion as the first code word entry in the output file. This is done by enabling the CLEAR Code value of "100"h onto the LZW_CODE_WORD bus and generating an ASSY_CD_REQ to LZW Code Word Assembly Processor 206. LZW Code Word Assembly Processor 206 responds with ASSY_CD_ACK when it accepts the code word. At that time a transition back to IDLE 2502 occurs.

STRING COMPARE Sequence

In one embodiment of the invention, the STRING COMPARE sequence comprises two states: STCP0 2508 and STCP1 2550. The STRING COMPARE sequence is entered automatically and not as a response to the STRING_CMP command. This sequence also comprises the performance optimized pipelined flow path. FIG. 20 illustrates the data paths involved in the string compare sequence.

STCP0, STRING COMPARE sequence, state 0 2508.

In one embodiment of the invention, STCP0 2508 is entered from IDLE 2502 when the first Hash Byte and Code Word pair are accepted from LZW Hash Table Processor 202. STCP0 2508 is the state in which the incoming byte+ code word pairs defining the current string are compared with strings defined as byte+prefix entries stored in the Dictionary Logical Data Structure 2002. This is the primary function in this state. Several conditions are handled in STCP0 2508. These are described as follows:

Condition: STRING_FOUND

Description: LZW Dictionary Processor 204 is optimized for handling the STRING_FOUND case.

Dictionary Processor Response:

a) Load the pipeline registers at level 3 to process the next byte/code_word pair from LZW Hash Table Processor 202.

b) Load Code Word(n−2) at level 4 with contents of Code Word(n−1) to replace previous string prefix with existing string code word to become prefix of the next byte/code_word pair from LZW Hash Table Processor 202.

c) Signal a READY condition to LZW Hash Table Processor 202.

d) Stay in STCP0 2508.

Condition: NOT(STRING_FOUND)

Description: LZW Dictionary Processor 204 is optimized for handling the STRING_FOUND case. This condition indicates that a non-optimized, pipeline disrupting event has occurred.

Dictionary Processor Response:

a) Send the disrupting status to LZW Manager Processor 208.

b) Go to STCP1 state 2550.

STCP1, STRING COMPARE sequence, state 1 2550.

In one embodiment of the invention, STCP1 2550 is a pause state in which LZW Dictionary Processor 204 signals a LMGR_DICT_RQ request for help from the LZW Manager Processor 208 to process a flow disrupting event. LZW Dictionary Processor 204 stays in STCP1 2550 until LZW Manager Processor 208 responds with one of the following commands:

Condition: NEW_PFX_WR

Description: LZW Dictionary Processor 204 is commanded to perform a NEW PREFIX WRITE.

Dictionary Processor Response: Go to PFXW0 state 2510.

Condition: REHASH

Description: LZW Dictionary Processor 204 is commanded to perform a REHASH.

Dictionary Processor Response: ACK the LZW Manager Processor 208 and go to IDLE state 2502.

Condition: PRI_HASH

Description: LZW Dictionary Processor 204 is commanded to perform a PRIMARY HASH following a REHASH that resulted in a STRING FOUND.

Dictionary Processor Response:

a) ACK the LZW Manager Processor 208.

b) Load the value in Code_Word(n−1) 2104 code word for the current string into Code_Word(n−2) 2106 to be the prefix for the next STRING COMPARE.

c) Go to IDLE state 2502 to accept the next byte/code word pair from LZW Hash Table Processor 202.

Condition: OPEN_DICT

Description: LZW Dictionary Processor 204 is commanded to perform an OPEN DICTIONARY sequence.

Dictionary Processor Response: Go to OPD1 state 2522.

NEW PREFIX WRITE Sequence

In one embodiment of the invention, the NEW PREFIX WRITE sequence comprises two states: PFXW0 2510 and PFXW1 2512. The NEW PREFIX WRITE sequence is entered from STCP1 in response to the LZW Manager Processor 208 NEW_PFX_WR command.

PFXW0, NEW PREFIX WRITE sequence, state 0 2510.

In one embodiment of the invention, when LZW Manager Processor 208 issues a NEW_PFX_WR command, the Code Word (address) of the next unassigned Dictionary SRAM 2002 location is available at the output of the incrementer of the Last_Valid register 2108 as NEW_CODE_WD 514. In PFXW0 2510, signal NEW_CODE_OE enables the NEW_CODE_WD 514 value as input to LZW Dictionary SRAM 204 address. Also, signal DICT_WDAT_OE enables the data values of a new string consisting of byte contained in Hash_Byte(n−1) 2102 and Code_Word(n−2) 2106 for the prefix to the Dictionary SRAM 2002 data inputs. A trigger pulse is generated to the Dictionary SRAM Write control state machine to generate a write cycle to store the values of the next string entry. This is the same, subordinate, state machine that generates the precise SRAM write cycle timings previously described. The write cycle proceeds in interlocked synchronization with LZW Dictionary Processor 204.

In one embodiment of the invention, in addition, the contents of Code_Word(n−2) 2106 the string prefix, is enabled to LZW Code Word Assembly Processor 206 as LZW_CODE_WORD 2004 and an ASSY_CD_REQ request signal is generated. Similarly, the NEW_CODE_WD 514 output of the incrementer is also enabled to LZW Hash Table Processor 202 and a NEW_CODE_REQ request is generated.

Finally, in one embodiment of the invention, an unconditional transition to PFXW1 2512 occurs.

Note that LZW Hash Table Processor 202 is also, simultaneously, performing a NEW PREFIX WRITE sequence using the NEW_CODE_WORD value as its entry into the Hash Table.

PFXW1, NEW PREFIX WRITE sequence, state 1 2512.

In one embodiment of the invention in PFXW1, the RAM Write control state machine completes the write cycle to the Dictionary SRAM 2002. In addition, interlocked handshakes to LZW Hash Table Processor 202, LZW Code Word Assembly Processor 206 and RAM Write control state machine are performed. Upon all three handshakes completing, the Last Valid register 2108 is incremented if the Dictionary is not full, and a transition to IDLE 2502 occurs.

OPEN DICTIONARY Sequence

In one embodiment of the invention, the OPEN DICTIONARY sequence comprises three states: OPD1 2522, OPD2 2524 and OPD3 2526. This sequence is entered from STCP1 in response to LZW Manager Processor 208 OPEN_DICT command. This action occurs in response to a Dictionary Full condition along with the need for a NEW PREFIX WRITE to occur.

OPD1, OPEN DICTIONARY sequence, state 1 2522.

OPD1 2522 is entered from STCP1 when LZW Dictionary Processor 204 discovers that a special case requiring LZW Manager Processor 208 assistance has occurred. In OPD1 2522, the contents of Code_Word(n−2) 2106 the string prefix, is enabled to LZW Code Word Assembly Processor 206 as LZW_CODE_WORD 2004 and an ASSY_CD_REQ request is generated, the same as in PFXW0 2510. In addition, an interlocked control REQ/ACK handshake with LZW Code Word Assembly Processor 206 is also performed. This state is repeated until LZW Code Word Assembly Processor 206 responds with ASSY_CD_ACK at which time a transition to OPD2 2524 occurs.

OPD2, OPEN DICTIONARY sequence, state 2524.

In one embodiment of the invention, the OPD2 state 2524 performs exactly the same operations as OPD1 2522 with the exception that the code word value of "100"h for a CLEAR Code is output as the LZW_CODE_WORD 2004 value to LZW Code Word Assembly Processor 206. When the control REQ/ACK handshake with LZW Code Word Assembly Processor 206 completes, a transition to OPD3 2526 occurs.

OPD3, OPEN DICTIONARY sequence, state 3 2526.

The OPD3 state 2526 performs a load of the initial value of "101"h into the Last_Valid register 2108, invalidating all entries after the "101"h location, thus accomplishing a reset of the Dictionary Logical Data Structure 2002. This is followed by an unconditional transition to IDLE 2502.

Close File Sequence 2570

In one embodiment of the invention, the Close File sequence 2570 comprises seven states: CLFILE1 2552, CLFILE2 2554, CLFILE3 2556, CLFILE4 2558, CLFILE5 2560, CLFILE6 2562 and CLFILE7 2564. The function of the CLOSE FILE sequence 2570 is to encode the last byte of the input file 211 as a code word, insert an EOI code at the end of the output file 217 and flush the remaining code words through LZW Code Word Assembly Processor 206 pipeline registers through to the output file 217.

CLFILE1, Close File sequence, state 1 2552.

In one embodiment of the invention, CLFILE1 2552 is entered from STCP0 2550 when LZW Dictionary Processor 204 discovers that the Last Byte of the input file is being encoded into a code word. CLFILE1 2552 handles the case of encoding the Last Byte into a code word of an existing string. This case is indicated by the condition Code_Word=Root being FALSE. The possible cases are as follows:

Condition: Code_Word=Root is FALSE

Description: Last_Byte must be encoded into the current, existing, Dictionary string.

LZW Dictionary Processor 206 Response: If this condition exists, the state of the pipeline is the normal STRING COMPARE case as described above. In this special case, the code word output to LZW Code Word Assembly Processor 206 is the code word for the entire string, including the byte, not just the prefix. Thus the Last Byte will be included in this last code word. This code word for the entire string resides in Code_Word(n−1) register 2104 which is enabled as LZW_CODE_WORD 2004 to LZW Code Word Assembly Processor 206. An interlocked REQ/ACK control handshake is performed to transfer the code word and then a transition to CLFILE2 2554 occurs.

Condition: Code_Word=Root is TRUE

Description: For this condition, the state does not perform any action.

LZW Dictionary Processor 206 Response: Immediately transition to CLFILE2 2554.

CLFILE2, Close File sequence, state 2 2554.

In one embodiment of the invention, the CLFILE2 state 2554 handles the case of encoding the Last Byte into its own code word as a root. This case is indicated by the condition Code_Word=Root being TRUE. The possible cases are as follows:

Condition: Code_Word=Root is TRUE

Description: Last_Byte must be encoded as a code word for a root.

Dictionary Processor Response: If this condition exists, the state of the pipeline is the normal STRING COMPARE case after a NEW PREFIX WRITE and the root of the next string has just been hashed and the byte/code_word pair are loaded in the Hash_Byte(n−1) 2102 and Code_Word(n−1) 2104 registers, respectively. Thus the Last Byte resides in Hash_Byte(n−1) register 2102 which is enabled, along with upper digit padding of "0"h, as a 12 bit LZW_CODE_WORD 2004 to LZW Code Word Assembly Processor 206. Note that the actual allocated code word width may be smaller as determined by the Code_Size 2118 value currently in effect. An interlocked REQ/ACK control handshake is performed to transfer the code word and then a transition to CLFILE3 2556 occurs.

Condition: Code_Word=Root is FALSE

Description: For this condition, no action is performed.

LZW Dictionary Processor 206 Response: Immediately transition to CLFILE3 2556.

CLFILE3, Close File sequence, state 3 2556.

In one embodiment of the invention, the CLFILE3 state 2556 sends the End of Information, EOI, code word value of "101"h to LZW Code Word Assembly Processor 206 for insertion into the output file along with the signal, LAST_ASSY_CODE, tagging this code_word as the last one of the compression session. Thus, in CLFILE3 2556, the EOI, code word value of "101"h is enabled as LZW_CODE_WORD 2004 and an interlocked REQ/ACK control handshake is performed to transfer the code word with associated tag and then a transition to CLFILE4 2558 occurs.

CLFILE4 2558, CLFILE5 2560 and CLFILE6 2562,

Close File sequence 2570 in one embodiment of the invention comprise CLFILE4 state 2558, CLFILE5 state 2560 and CLFILE6 state 2562.

In one embodiment of the invention, these states send output file 217 padding values of "000"h to LZW Code Word Assembly Processor 206. This ensures that all of the code_words remaining in the pipeline are forced through to the output file 217. Note that due to the pipeline levels remaining in LZW Code Word Assembly Processor 206, only one or two of the three padding values will actually traverse the pipeline and be inserted into the output file 217. This ensures that the last code word is sent to the output file in its entirety. Thus, in each of these states, a value of "000"h is enabled as LZW_CODE_WORD 2004 and an interlocked REQ/ACK control handshake is performed to transfer the code word. In CLFILE6 2562, a transition to CLFILE7 2564 occurs upon completion of the handshake.

CLFILE7, Close File sequence, state 7 2564.

In one embodiment of the invention, in the CLFILE7 state 2564, the signal, LZW_COMP_CMPL, indicating that the LZW compression session is complete is generated and a transition back to IDLE 2502 occurs. This is the last active event of LZW processing for the current compression session. At this time, the encoded output file is complete. Compression of a new input file 211 can be started by issuing a RESTART.

E. LZW Code Word Assembly Processor 206

1. Structure and Function

In one embodiment of the present invention LZW Code Word Assembly Processor 206 is the third and final level of pipelined data processing. It comprises logic comprising pipeline levels 5 and 6.

LZW Code Word Assembly Processor 206 performs the fourth step in the processing of input string data for LZW data compression, that is LZW Code Word Assembly Processor 206:

a) Concatenates the code words of varying width together into a contiguous output data stream 217.

b) Segmenting the output data stream 217 into uniform bytes and outputting those bytes into the output file device.

Figure 25:
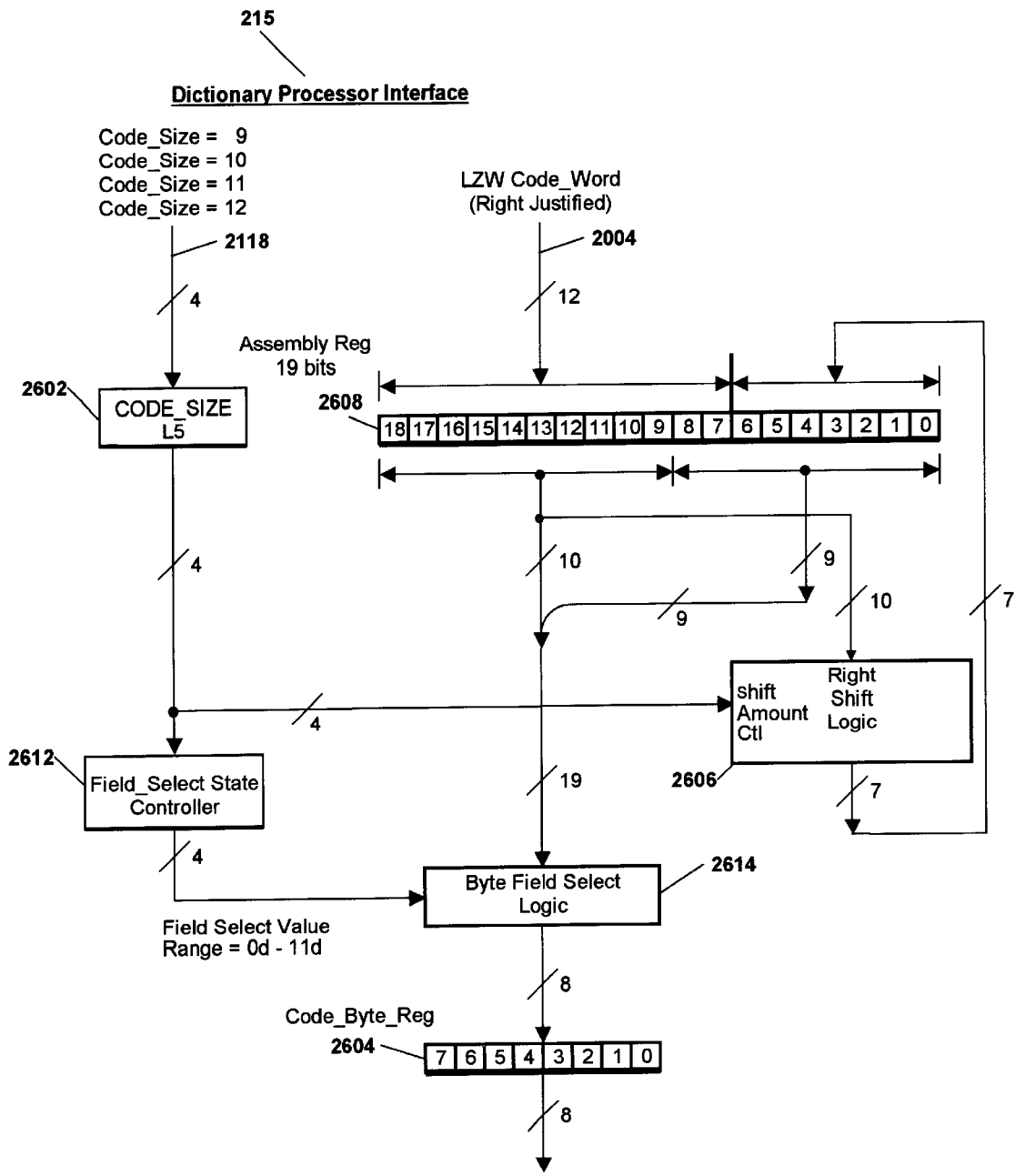
FIG. 25 illustrates a detailed data path diagram for an LZW Code Word Assembly Processor in accordance with one embodiment of the invention.

The detailed data path diagram for LZW Code Word Assembly Processor 206 is illustrated in FIG. 25 in accordance with one embodiment of the invention.

In one embodiment of the invention, unlike the other String Data Processing Processors 202 and 204, LZW Code Word Assembly Processor 206 only has one mode of operation: reformatting data according to a consistent, predictable algorithm. There are no occasions where data needs to be reprocessed by re-flowing it through any part of the pipeline. The pipeline registers in LZW Code Word Assembly Processor 206 are only tagged as invalid at RESTART and become valid as the pipeline flow is initially established and remain valid for the remainder of the compression session.

Assembly Register

Referring to FIG. 25, the Assembly Register 2608 is a 19 bit wide register which has two data fields: bits 18 down to 7 and bits 6 down to 0. The data field consisting of bits 18 down to 7 is a 12 bit field which is used to accept the 12 bit code words as they are input from LZW Dictionary Processor 204. These values are padded and right justified when the Code_Size L5 register 2602 indicates code word widths of less than 12 bits. This register in its entirety operates as a right shift register where the data in the register is shifted right by the amount indicated by the Code_Size L5 register value 2602. As this Code_Size L5 value 2602 increases from 9-to-10-to-11-to-12, the Right Shift Logic 2606 adjusts the corresponding amount of the field shift. The partial code_word field that is shifted right is accepted by bits 6 down to 0. In this way, incoming code_words are concatenated end-to-end and any padding zeroes are stripped off. Thus, the entirety of the Assembly Register 2608 is a 19 bit window of the most recent code_words being formatted for output, with an entire code_word(n) contained in the 12 bit, full code_word field, 18 down to 7 and the upper bits of the preceding code_word(n−1) contained in 7 bit, partial code_word field 6 down to 0.

The registered output of Assembly Register 2608 consisting of the 12 bit, full code_word field, 18 down to 7 is at pipeline level 5. The registered output of Assembly Register 2608 consisting of the 7 bit, partial code_word field 6 down to 0 is at pipeline level 6.

Code Byte Register

It should be understood that the word "byte" in this context is not associated with either an input character or a string byte in the context of string=byte+prefix. It now represents an 8 bit field of data as extracted from the Assembly Register 2608 and presented to the output device interface. This byte contains a partial code word and very often contains two fields, each consisting of adjacent fields of two concatenated code words. The output of Code Byte Register 2604 is at pipeline level 6.

Figure 26:
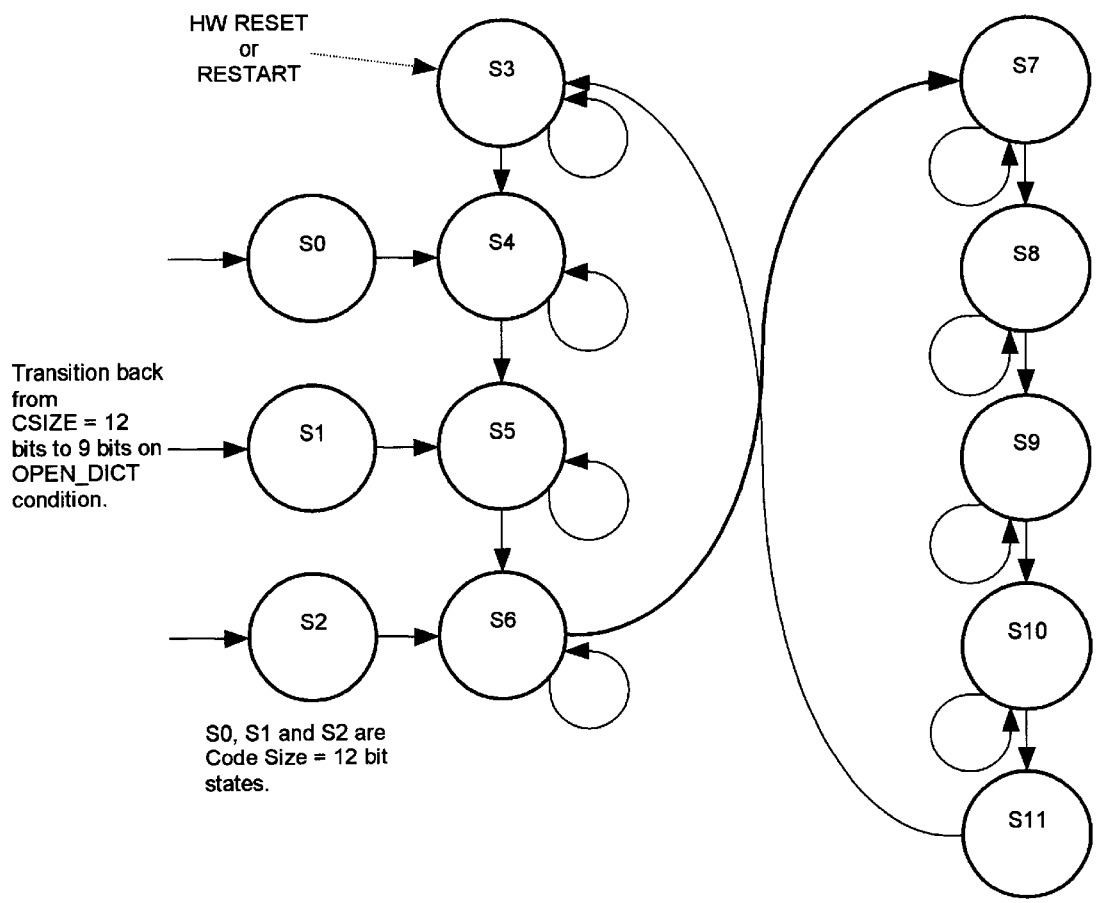
FIG. 26 illustrates a state sequence diagram of an LZW Code Word Assembly Processor for a 9-bit code word in accordance with one embodiment of the invention.
Figure 27:
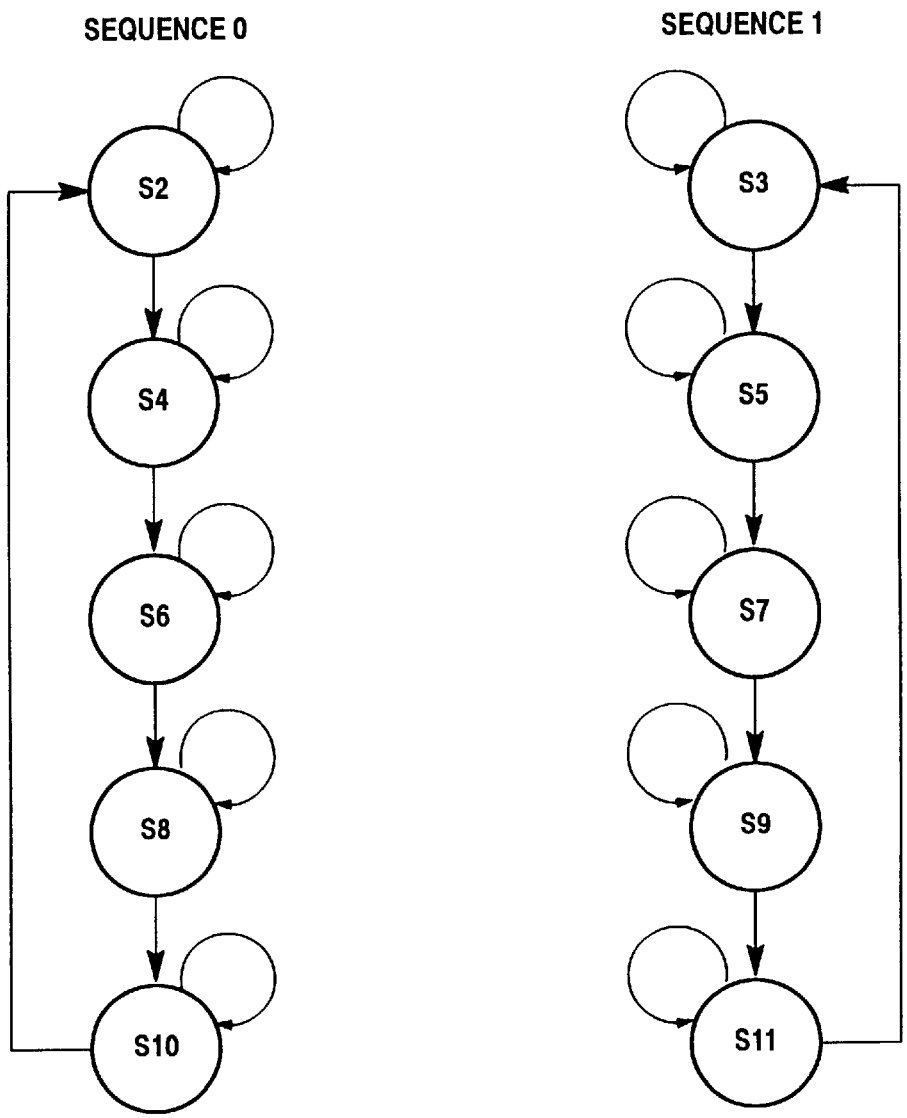
FIG. 27 illustrates a state sequence diagram of an LZW Code Word Assembly Processor for a 10-bit code word in accordance with one embodiment of the invention.
Figure 28:
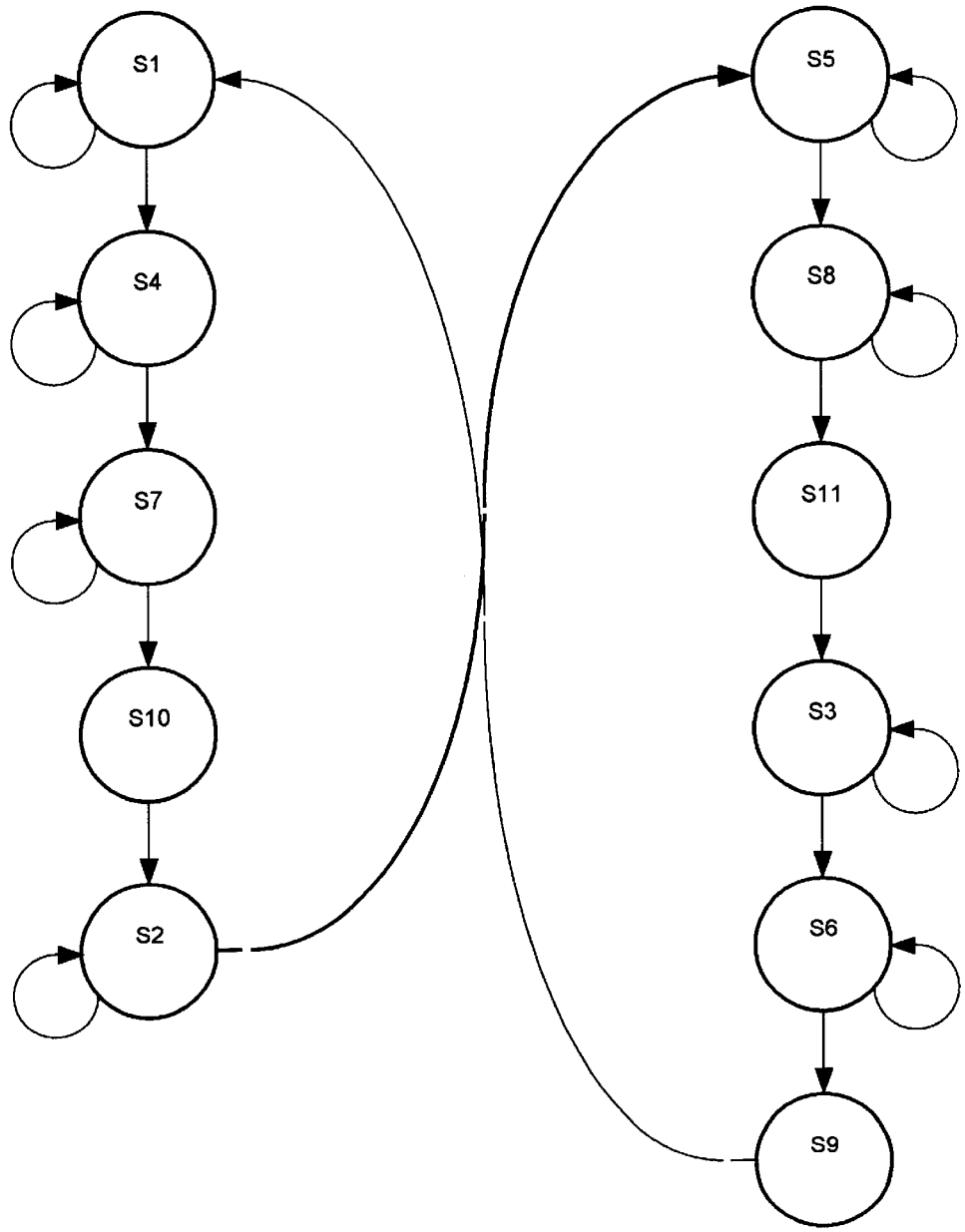
FIG. 28 illustrates a state sequence diagram of an LZW Code Word Assembly Processor for an 11-bit code word in accordance with one embodiment of the invention.
Figure 29:
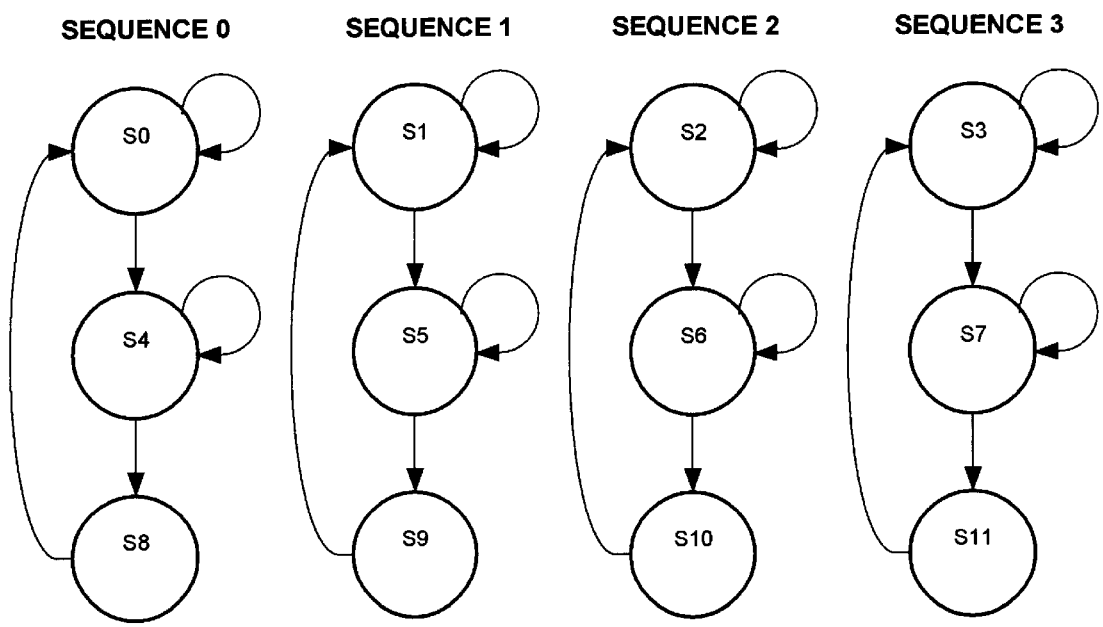
FIG. 29 illustrates a state sequence diagram of an LZW Code Word Assembly Processor for a 12-bit code word in accordance with one embodiment of the invention.
Figure 30:
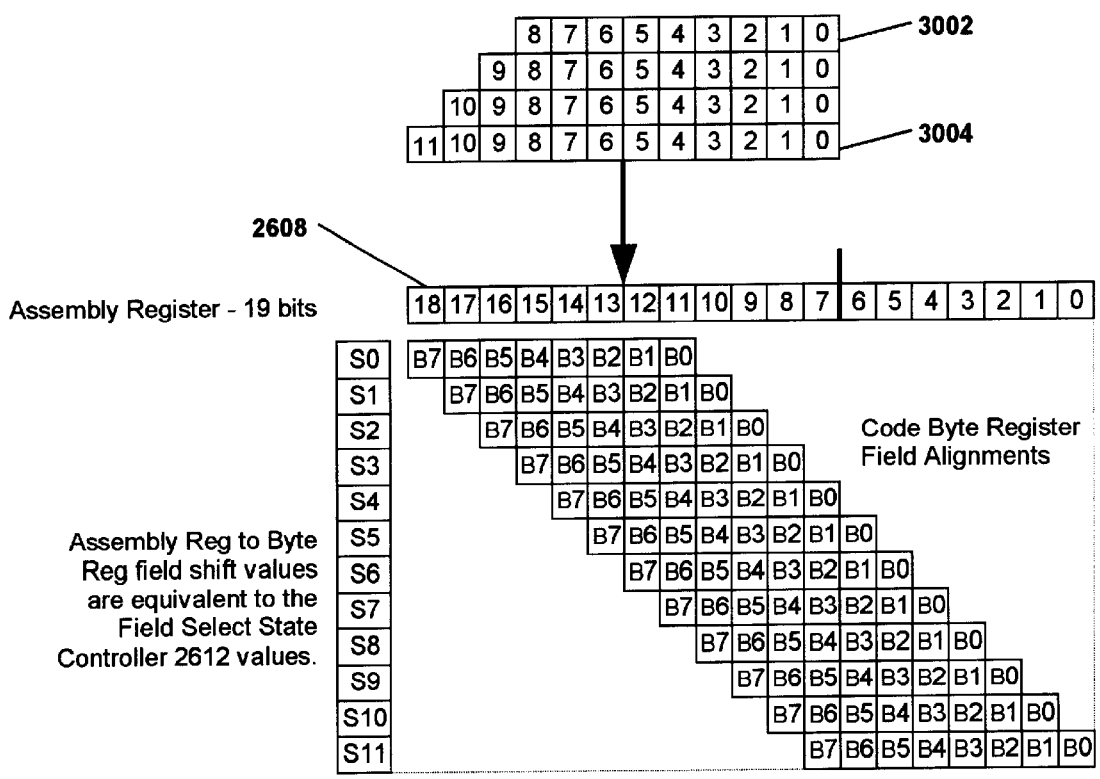
FIG. 30 illustrates a field alignment diagram of an LZW Code Word Assembly Processor for incoming 9, 10, 11 and 12-bit code words and all of the possible alignments between the Assembly Register and Code Byte register in accordance with one embodiment of the invention.

Referring again to FIG. 25, in accordance with one embodiment of the invention, the Code Byte Register 2604 is an 8 bit wide register that contains a byte value which is presented to the output interface. This byte register is preceded by combinational Byte Field Select Logic 2610. The Byte Field Select Logic 2610 is capable of selecting any one of all possible byte fields of the entirety of the Assembly Register 2608, ranging from the rightmost justified byte field to the leftmost justified byte field as well as all other byte fields in between. There are 12 different selectable byte field alignments as shown in FIG. 30. FIG. 26 illustrates a state sequence diagram for a 9-bit code word, FIG. 27 a state sequence diagram for a 10-bit word, FIG. 28 a state sequence diagram for an 11-bit word and FIG. 29 a state sequence diagram for a 12-bit word. In FIGS. 26–30, states S0, S1 . . . S11 are referred to by reference numerals 2700, 2701, . . . 2711, respectively.

Note that although there are 19 bits in the entirety of the Assembly Register 2608, the full set of bits may not be of interest for selection as input to the Code Byte register 2604. A group of contiguous bits of the central grouping of bits is always of interest, but bits at the ends may or may not be useful depending upon current conditions.

For example: when code_size=9 bits, 3002, preferably the upper three bits of assembly register 2608, 18, 17 and 16 contain padding zeroes because these bits do not contain useful information in 9-bit mode. Thus, bits 18, 17 and 16 preferably are not selected for presentation to the Code Byte Register 2604 for insertion in the output file when code_size=9 bits. Hence, when code size=9 bits, (FIG. 26), the Field Select state controller 2612 preferably does not enter states S0(2700), S1(2701) or S2(2702). Obviously, when code_size=12 bits, 3004, these bits are included in the fields selected to be presented to the Code Byte Register 2604 (FIG. 29).

When code_size L5 2602=12 bits, assuming digit alignment between the Code_Byte and Code Word, (there are several other possible alignments) there are only three field alignments between the Code Byte register 2604 and the Assembly Register 2608 which are needed. The three fields are:

a) bits 14 down to 07 b) bits 18 down to 11 c) bits 10 down to 03

Assuming the selection sequence begins with field a) selected as input to the Code Byte register, this leaves bits 18 down to 15 of the Assembly Register 2608 leftover. The next code_word accepted is loaded into bits 18 down to bit 7 of the Assembly Register 2608 and simultaneously, the leftover bits 18 down to 15 are shifted right by 12 bits into bit positions 6 down to 3. The next selection for input to the Code Byte register 2604 is field c). This selects the leftover bits from the preceding code_word plus the low 4 bits of the current code word. Note that bits 02 down to bit 00 of the Assembly Register 2608 are never selected for input to the Code Byte register 2604 in this formatting sequence. This example also highlights a case where two consecutive Code Byte fields can be captured from a single load of the Assembly Register 2608. Selecting field b), selects the upper 8 bits of the current code_word for input to the Code Byte register 2604. The next field selection, field c), selects the lower 4 bits of the current code_word and upper 4 bits of the preceeding code word for input to the Code Byte register 2604. Thus two valid Code Bytes have been selected from a single Assembly Register 2608 load of a code_word from LZW Dictionary Processor 206.

The preceding is an example which shows the general method of concatenating and assembling code words into output bytes. When all the possible alignments of 9, 10, 11 and 12 bit code words are analyzed, it can be seen that there are 8 different sequences of the 12 possible Code Byte alignments required to support all the possibilities. It is believed that the LZW output format may be more deterministic than expected at the time of the implementation. If so, it is possible that the some of the byte alignment sequences may be eliminated, thus resulting in a simplification of the Field Select State Controller logic 2612.

The details of the methods which accomplish the Data Retrieval and Data Entry functionality follow.

2. LZW Code Word Assembly Processor 206 Interfaces

In accordance with one embodiment of the invention, LZW Code Word Assembly Processor 206 is the third of three cascaded String Data Processing Processors 202, 204 and 206 that form the data processing path of the LZW algorithm. LZW Code Word Assembly Processor 206 has three interfaces:

a) To LZW Dictionary Processor 204, interface 215
b) To Output File 217 Device, interface
c) To LZW Manager Processor 208, interface 208d LZW Dictionary Processor 204 interface and Output File 217 Device interfaces are on the same hierarchical level and are peer-to-peer, data path interfaces. The LZW Manager Processor interface 208d is to the LZW Manager upper hierarchical level processor 208 and is a command interface only. No data crosses interface 208d. Data is only moved across LZW Dictionary Processor 204 interface and Output File 217 Device interfaces.

a. Dictionary Processor Interface

LZW Dictionary Processor 204 interface 215 in accordance with one embodiment of the invention has been described above.

b. Output File Device Interface 217

Output File Device interface 217 comprises one data item and a REQ/ACK handshake control interface. The output of the Code Byte register 2604 is the data item and consists of an 8 bit value. A signal CODE_BYTE_REQ indicates that LZW Code Word Assembly Processor 206 desires to transfer data. The device receiving the output data responds with an ACK signal when it accepts the data.

c. LZW Manager Processor 208

LZW Code Word Assembly Processor 206 interface 208d in accordance with one embodiment of the invention has been described above in Section III. A.3.

3. Response to LZW Manager Processor 208 Commands

In one embodiment of the invention, LZW Code Word Assembly Processor 206 is required to act upon two of the seven LZW Manager Processor 208 commands: RESTART and OPEN_DICT. The following paragraphs describe the response of LZW Code Word Assembly Processor 206 to each of the commands.

HW RESET

In accordance with one embodiment of the invention, although not a command, a hardware reset unconditionally places LZW Code Word Assembly Processor 206 into the S3 state and CLEARs all the VALID and LAST tags from the pipeline controls. Referring to FIG. 26, the S3 state defines the first alignment of the Code Byte input with the Assembly Register 2608 such that the low 8 bits of a 9 bit code word are selected. The Code_Size L5 register 2602 also loads Code Size=9 bits as a signal input 2118 from LZW Dictionary Processor 206.

RESTART COMMAND

In one embodiment of the invention, the RESTART command causes exactly the same response as HW RESET.

OPEN DICT COMMAND

In one embodiment of the invention, the OPEN_DICT command causes the proper transitioning of Field Select controller state to properly make the transition rollback from 12 bit Code Size back to 9 bit Code Size processing in order to prepare to accept 9 bit code words from the newly opened Dictionary data structure 2002. Note that assembly of code words into the output file 217 remains continuous through an OPEN_DICT command.

4. LZW Code Word Assembly Processor 206 General Timing Cycle

In one embodiment of the present invention, typically it takes one clock for LZW Code Word Assembly Processor 206 to accept and process a code word from LZW Dictionary Processor 204. Usually, the Assembly Register 2608 is loaded with a code_word, the leftover bits are right shifted within Assembly Register 2608, and the Code Byte register 2604 is loaded with all three actions occuring on a single clock cycle. Note, that there are cases as described in the example, above, in which two successive fields of the Assembly Register 2608 must be captured by the Code Byte register 2604 before another code word can be accepted. In that case, two states, controlling two successive field alignments of the Code Byte register 2604, occurring on two successive clock cycles, are required to accept and process a code word. Note, however, that the maximum rate that LZW Dictionary Processor 204 is capable of issuing code words is approximately one code word in 8 clocks. This is limited by the fact that the shortest string is two bytes, requiring two pipeline cycles, or 4 clocks, to process the string. The maximum code word rate is achieved when each two byte string is a new string and causes a NEW PREFIX WRITE. It takes a minimum of two additional clocks to perform the NEW PREFIX WRITE plus one clock each for the LZW Manager Processor 208 to issue two commands. Therefore, LZW Code Word Assembly Processor 206 will never be the performance limiting device. Note, that general data throttling caused by the output device refusing to accept Code Byte output can cause the pipeline to "back up" and thereby externally constrain performance.

5. State Sequence Diagrams for LZW Code Assembly Processor 206

FIGS. 26, 27, 28 and 29 illustrate state sequence diagrams of each of the possible LZW Code Word Assembly Processor 206 flows in accordance with one embodiment of the invention. First, it must be understood that the state numbers shown on the diagrams are the output of Field Select State Controller 2612 and represent the numerical values associated with each state. These state values are also the field select numbers which select the Assembly Register field 2608 to be presented as input to the Code Byte register 2604. The field select values are input to the Byte Field Select logic 2614 which is an 8 bit wide, 12-to-1 data path selector which routes the desired field of the Assembly Register 2608 to the Code Byte register 2604. Note that the 9 bit and 11 bit sequences are long and use all, or almost all, of the possible aligments. The 10 bit and 12 bit sequences are shorter, and there are several independent sequences, only one of which may be entered during a given Dictionary Session. Once entered, the targeted sequence is repeated over and over. Which of the possible sequences is entered depends upon the state of the Field Select State Controller 2612, respectively, at the time the Dictionary signals a Code Size 2118 increment from 9 to 10, 10 to 11, or 11 to 12 bits. The change in field size generally causes an immediate change in the next state selected. Thus the present state becomes a launching point into the new sequence. Depending upon the present state, the new sequence will be determined if there is more than one possible sequence. Beyond that, the operation of the control is not much different than a strangely behaving counter which counts one sequence for a while (9 bit sequence) then another (10 bit sequence) and so on up to one of the 12 bit sequences. Upon receiving the OPEN_DICT command, it reverts to the 9 bit sequence. Each state or count value represents a selection of a unique field of the Assembly Register 2608 for input to the Code Byte register 2604. Also, while the 9 bit sequence is running, the Assembly Register 2608 shifts right by 9 bits for each new code word accepted, for the 10 bit sequence the shift amount is 10 bits and so on up to 12 bits.

It should be understood that the transitional path from one code size state sequence to the next higher code size sequence (not shown) comprises a path from each of the states in the currently executing sequence to a single state in the next higher code size sequence.

The transition back to the 9 bit sequence from the 12 bit sequence, caused by the OPEN_DICT command, can occur from any one of the possible 12 bit sequence states of any one of the 4 possible 12 bit sequences. There are unique entry points into the 9 bit sequence for each of the 12 bit sequence exit states. Three states which exist in the 12 bit sequences, but not in the 9 bit sequence are indicated as entry points on the 9 bit sequence state diagram.

The starting point at HW RESET or RESTART is state S3. Referring to the diagram in the "Code Byte" chart above, it can be appreciated that the Code Byte is alligned one bit position to the left of the low 8 bits of the code word. When the code word is actually accepted from LZW Dictionary Processor 204, the state transitions from S3 to S4. Therefore, at the time the actual first code word is loaded into the Assembly Register, the state is such that the selected field as input to the Code Byte register is aligned with the low 8 bits of the code word. This is the starting alignment of the output file.

There are some conditions in which a burst of two states is required to process a single code word. This occurs once in a 9 bit sequence, once in a 10 bit sequence, three times in an 11 bit sequence and once in a 12 bit sequence.

III. Operation of the LZW Hardware Data Compression Co-Processor

FIG. 1 is a flow diagram illustrating the operation of the LZW Hardware Data Compression Co-Processor. The input to the LZW Hardware Data Compression Co-Processor is a file of data characters, resolved into 8 bit quantities called bytes. The output of the LZW Hardware Data Compression Co-Processor is a string of LZW code words that, in one embodiment, range in size from 9 to 12 bits. The width of the code word monotonically increases from 9 bits to 12 bits as the input file is processed, the Dictionary is constructed, and code words are generated and assembled into the compressed output byte stream.

As mentioned above, a code word is a word containing the value of an index into the Dictionary data structure. A code_word is a pointer (link) to another location in the Dictionary. Each entry in the Dictionary contains a data byte representing a byte from a stored string from the input file, and a code_word linking it to its successor string byte. These links extend all the way back to the root and thus define a unique string of characters from the input file as previously stored in the Dictionary. Each additional link to another code_word adds a character to the string represented by the assigned code_word. A single code_word in the encoded output byte stream represents a complete string because the code_word is used as an entry point into the Dictionary and the entire string of characters back to the root is defined by that particular code_word entry.

In the present embodiment, the code words of the output file are concatenated end-to-end with no padding between the code words. Hence code words are generally not aligned to byte boundaries.

The LZW algorithm is usually able to compress data because in most data files there is a substantial amount of redundant information. The LZW algorithm removes some of the redundant information when producing the output file. Thus in most cases the output file is smaller than the input file. The output file is compressed in physical size only, not in information content. Hence the LZW algorithm is referred to as a lossless compression technique, because the entire original physical input file can be reconstructed from the encoded output file.

The LZW Hardware Data Compression Co-Processor accomplishes data compression by dynamically constructing the Dictionary data structure of character strings extracted from the input file and assigning a code word to each character string stored. In the present embodiment as described above, the Dictionary is implemented by a dedicated, discrete physical SRAM electrical component, completely independent of the Hash Table SRAM. In other embodiments, however, other components may be used to implement the Dictionary.

The LZW Hardware Data Compression Co-Processor matches strings that occur later in the input file with strings previously stored in the Dictionary data structure from earlier occurrences in the input file and inserts the code word representation for the string in the compressed output file. The output file only contains the code word representation of the character string. In most cases the strings stored in the Dictionary data structure are long enough that the code word representation is shorter than the string.

The process just described is called a Dictionary session. In general, a plurality of Dictionary sessions are performed to create a compressed output file.

In the present embodiment, a Dictionary session results in the creation of a block of compressed output data bounded by a delimiter such as but not limited to Clear_Code, "CC", which is a code word having a value of "100"h, at the beginning and at the end. A Dictionary Session represents the compression of a contiguous block of input characters from the input data file. During this time, both the Hash Table and the Dictionary data structures are first initialized, and then Dictionary entries are created and code words are output as compression proceeds. The Dictionary Session terminates when the Dictionary is full at which time a "CC" code is output and another Dictionary session is initiated. A complete Dictionary session, in the present embodiment, outputs 3839d code words in a contiguous field of 43258d bits in the output data file. A Dictionary session may be terminated prematurely in which case there will be fewer code words and bits inserted into the output file.

In the present embodiment, there is a leftover byte at the end of the Dictionary session. This byte is the first root of the new Dictionary if followed by another Dictionary session, or is output directly if followed by an End_of_Information EOI code word (101h), which in the present embodiment concludes a compression session.

Note that the last code word of a Dictionary session does not claim a location in the Dictionary or Hash Table because it is output after the Dictionary has become full. In the present embodiment, there is no NEW_PFX_WR command (described above) associated with the generation of this last code word and thus, no Hash Table entry, which is why there are only 3838d entries in the tables, but 3839d code words generated as output.

In the present embodiment, a Dictionary session begins with the Initialization of both the Hash Table data structure and the Dictionary logical data structure (step 562). The Dictionary logical data structure comprises 9973d entries and is preferably included within a physical structure of 16K entries, rounding the size of the logical structure up to the next higher binary block boundary.

As discussed above, the Hash Table may be implemented by a dedicated, discrete physical SRAM electrical component, completely independent of the Dictionary SRAM. In other embodiments, however, other components or even a shared, multipurpose, component may be used to implement the Hash Table.

The Hash Table data structure may be initialized (step 562) by first loading a value of 1FFFh into locations 0 to 9972d. Loading a value of 1FFFh into the locations is an exemplary method used to mark the locations in the logical Hash Table data structure as "Unassigned". Each individual root value, 00h through FFh may then be hashed and the root value, which is also the assigned code word value, is loaded into the hashed location.

In the present embodiment, LZW Hash Table Processor 202 includes an initialization ROM which includes the pre-hashed values of the roots and control codes, enabling high-speed loading of the values into the proper locations in the Hash Table logical data structure, eliminating the real-time processing burden of actually hashing the values. The pre-hashed values from the initialization ROM are loaded into the Hash Table at step 562.

The hashing and loading process is also performed on a Clear Code "CC" value of 100h, and an End-of-Information "EOI" code value of 101h where the high order '1' is stripped off. A hash collision results for these values because these modified values are also root values. The hash collision is resolved by a single REHASH and the assigned code word values of 100h and 101h are loaded into the REHASHed locations. Thus, in this implementation, 258d of 9973d locations are initialized with pre-assigned values leaving the remaining locations available for assignment by the data compression process.

In software-implementations of the LZW algorithm, the Dictionary is typically initialized by first clearing all code word and byte values to 000h and 00h, respectively, and then loading the root values and the control code values into Dictionary data structure locations 000h through 101h. In accordance with one embodiment of the present invention, however, the Dictionary data structure 2002 is initialized by resetting the value of a NEW_CODE_WD pointer to 102h. This simple initialization is made possible due to an alternate method of detecting roots being presented to the dictionary as implemented in one embodiment of the present invention.

Finally, a Clear_Code (CC), of value 100h, is sent to the Code Word Assembly Processor 206 for insertion into the compressed output file. In the present embodiment, this action is performed by the Dictionary Processor 204 upon receipt of a RESTART command from the LZW Manager Processor 208. Still referring to FIG. 1, the steps of the compression process will now be described.

Step 1 of the LZW Algorithm

A first character (i.e., a first byte) is input from the input file (step 564). Referring to FIG. 1, the first character is read after the LZW Manager Processor issues a RESTART command. As a consequence of the RESTART, this byte is hashed against a default Hash Index value of FFFFh (step 566) and, because it is a root, and roots are pre-loaded into both data structures, it is contained in the Hash Table data structure (steps 568 and 570). The code word for the root, preloaded at Initialization (step 562), is retrieved from the Hash Table data structure (step 568), and stored in Code Word(n−1) register 2104. Because the control state is unique for root processing, there is no need to perform the dictionary look-up and compare. Thus this step is skipped for a root. At this point, pipeline flow for string compare has not been fully established. Thus, the code word for the root has not yet migrated to the string prefix register to be tagged as the current string prefix. Note, also, that because the current "string" comprises a single input character, the LZW definition of string=prefix+byte does not yet exist. Only the prefix exists. The default Hash Index is also updated as the current Hash Index, replacing the value of the default Hash Index. This Hash Index will be used in hashing the next input character.

Step 2 of the LZW Algorithm

The second character is input from the input file (step 564). Since a string prefix is assigned, the second character becomes the byte of the current string as defined as prefix+byte. This byte is hashed against the updated Hash Index (step 566). It is possible that a hash collision may occur, but, because it is a new string and the Hash Table is typically never full, a location marked as "Unassigned" will typically be found in the Hash Table data structure.

Step 3 of the LZW Algorithm

Hashing to an "Unassigned" location in the Hash Table data structure initiates the entry of the current two-character string into the Dictionary data structure (step 590) and Hash Table data structure (step 592). It also causes insertion of the current prefix, which is the code word for the root byte, as a code word into the output file (step 588).

The code word of the root migrates to the Code Word(n−2) register 2106, where it is tagged as the prefix of the current string. It is then written into the prefix field of Dictionary data structure location 102h, and the second (last) character of the current string is written into the byte field of Dictionary data structure location 102h (step 590). The same code word for the string prefix, as written into the Dictionary data structure is also presented to the Code Word Assembly Processor 206 for insertion into the output file (step 588). In this case the code word is for a root. Finally, the current value of the NEW_CODE_WD pointer, which corresponds to the code word of the current string, is written into the thus far "Unassigned" location in the Hash Table data structure (step 592). The NEW_CODE_WD pointer is then incremented to 103h (step 594), the Hash Index is reset to its default value of FFFFh, and the current byte value (i.e. second of two characters) is again presented as input to be hashed as the root of the next string (step 560). This concludes the entry of the first string into the Dictionary data structure and insertion of the first code word into the output file. This example string is a minimum length string and is two characters in length.

Although two characters of the input string have thus far been processed and entered into the Dictionary and Hash Table logical data structures, and a single code word has been output, the second character, or byte of the string entered into the Dictionary data structure (prefix+byte) is not yet encoded into the output file. It has, however, been stored in stored input byte register Byte(n−1) 607, as illustrated in FIG. 6, to be presented again as input to be hashed as the root of the next string and will be included in the encoded output when the prefix of the next string is output.

The following presents a more general string case, and resumes at the point where a string has just been entered into the Dictionary and Hash Table logical data structures, a code word has been inserted into the output stream, the last character of the previous string or current byte is retrieved from stored input byte register Byte(n−1) 607 and again presented as input to be hashed as the root of the next string.

Generalized Step 1 of the LZW Algorithm

Process the first character (root) of a string—In this case the processing as described above in "Step 1 of the LZW Algorithm" occurs. Generalized step 1 includes, however, the first byte of all strings which is also the root of all strings, not just the first character of the input file. This byte is hashed using the NEWHASH sequence as a consequence of a NEWHASH command issued by the LZW Manager Processor.

Generalized Step 2 of the LZW Algorithm

Input a character (byte)—The next character of the current string from the input file is loaded into both stored Byte(n) 606 register and hash byte(n) 1402 registers. Since a current string prefix has been assigned, this next character becomes the byte of the current string as defined as prefix+byte.

Hash the byte—This byte is hashed using either the PRIHASH or REHASH sequence as a consequence of a corresponding command issued by the LZW Manager Processor. The byte is hashed against the updated Hash Index and a hash address is calculated. The current Hash Index is also overwritten as the updated hash Index, replacing the value of the current Hash Index. This updated Hash Index will be used in hashing the next input character or REHASHing the current character.

Retrieve the code word—The calculated value of the hash address is used to access the contents of the Hash Table data structure and the value stored at the hashed location is retrieved. The value retrieved may be the "Unassigned" tag or a code word.

If the value retrieved is the "Unassigned" tag, the current string is new, must be assigned a code word and must be written into the Dictionary data structure. In this case, proceed to Generalized Step 3.

If the value retrieved is a code word, the code word is used as an address to access the Dictionary data structure (step 574). The values of prefix and byte stored in the Dictionary data structure location associated with the code word for the string are compared with the value of byte located in Byte(n−1) 2102 (step 576) from the current input string as well as the current value of the updated string prefix located in Code_Word(n−2) 2106. This Dictionary data structure lookup and compare is called "STRING COMPARE". If both values of byte and both values of prefix are equal (step 578), the input string matches the string stored in the Dictionary data structure. In that case the compare is successful and the code word value from the Hash Table data structure replaces the current value of prefix for use in the next STRING COMPARE (step 586) and Generalized Step 2 is repeated. This loop continues until the STRING COMPARE fails or the input file runs out of data.

If the STRING COMPARE fails, it means that two different strings have hashed to the same Hash Table data structure location. This is called a hash collision and is resolved by REHASHing. REHASHing differs from normal hashing in that the combinational logical transformation function performed on the 16-bit Hash Index value is altered. Otherwise, it is identical to normal hashing and achieves the identical purpose. To perform a REHASH, the contents of stored input byte register Byte(n−1) 607 is retrieved (step 580) and the byte is again presented as input to be hashed (step 582), but using the REHASH algorithm (step 584). In this case, proceed to Hash the Byte, above, with the REHASH algorithm being performed rather than the normal hash algorithm. REHASH continues until either the compare is successful or an "Unassigned" location is encountered.

Generalized Step 3 of the LZW Algorithm

Hashing to an "Unassigned" location in the Hash Table data structure (step 570) initiates the entry of the current string into the Dictionary (step 590) and Hash Table (step 592) logical data structures. It also causes insertion of the code word for the current prefix into the output file (step 588).

The code word, tagged as the current string prefix of the current string, located in Code_Word(n−2) 2106, is also written into the prefix field of the Dictionary data structure and the final character or byte of the current string located in Byte(n−1) 2102, is written into the byte field of the Dictionary data structure at the location defined by the current value of the NEW_CODE_WD pointer. The same code word for the string prefix, located in Code_Word(n−2) 2106, as written into the Dictionary data structure, (step 590) is also inserted into the output file (step 588). Finally, the current value of the NEW_CODE_WD pointer 514, which corresponds to the code word of the current string, is written into the thus far "Unassigned" location in the Hash Table data structure (step 592). The NEW_CODE_WD pointer is then incremented by 1, (step 594), the Hash Index is reset to its default value of FFFFh, and the current byte value (i.e. current string character) is retrieved from stored input byte register Byte(n−1) 607 and again presented as input to be hashed as the root of the next string. Note that the width allocated for the code word in the output file is automatically increased from 9 to 10 to 11 to 12 bytes as the NEW_CODE_WD pointer crosses binary block boundaries.

Generalized Summary of the LZW Algorithm

Thus generalized string processing can be summarized in the following three steps:

a) Hash the root;
b) Perform STRING COMPARE until an "Unassigned" location is encountered in the Hash Table data structure;
c) Enter the current string (prefix+byte) into the Dictionary data structure, insert the code word for the prefix into the output stream, and send the current string byte back for processing as the root of the next string.

In the present embodiment, this process continues until 3839d code words (4096d−258d+1) have been inserted into the output file and the current Dictionary data structure is full. When the current Dictionary data structure is full, the current Dictionary session ends, the current Dictionary data structure is closed, a "CC" code word of value 100h is inserted into the output file and another initialized Dictionary data structure is created and used. Note that the current string byte just links across dictionaries and becomes the root of the next string in the new Dictionary data structure the same as if it was the root of the next string in the same Dictionary data structure.

Finally, upon reaching the end of the input file, the last Dictionary data structure is closed out by one of the following:
a) If a NEW_PFX_WR command has just been performed, the last byte is output as the final code word, as if it were a root;
b) Otherwise the final byte is included in a string prefix through a STRING COMPARE which ran out of input data. This prefix is output as the final code word.

Lastly, the current Dictionary data structure is closed, typically before it is full, by inserting an EOI code word of value 101h into the output file.

As the foregoing illustrates, the present invention is directed to a hardware-based implementation of the LZW data compression algorithm. It is understood that changes may be made to the embodiments described above without departing from the broad inventive concepts thereof. For example, it should be understood that an alternative hashing function or other mapping function of byte strings onto an index (instead of LZW) is contemplated by the invention. Additionally, in an alternate embodiment of the invention, LZW Manager Processor 208 may be integrated into the lower level units. Moreover, in other embodiments of the invention, an array of LZW co-processors may be employed, wherein each element in the array may be assigned an essentially different portion of an input file to compress. An increase in processing throughput proportional to the number of co-processors running in parallel in the array may be realized. Also, the two Hash Table values for EOI and CC may, in other embodiments of the invention be eliminated, thereby increasing the logical hash table size by two locations and reducing the number of hash collisions. Accordingly, the present invention is not limited to the particular embodiments disclosed, but is intended to cover all modifications that are within the spirit and scope of the invention as defined by the appended claims.

What is claimed is:

1. A system for executing an LZW compression algorithm, the system comprising a plurality of processors each comprising a data path and an associated state machine that controls the flow of data through the data path, the data paths of said plurality of processors being coupled to provide simultaneous execution of different steps of the LZW compression algorithm by different ones of the processors on successive bytes of an input stream, said plurality of processors comprising:
a first processor that performs a hashing function to calculate an index value based upon a byte string value from an input data stream, the index value being used as a hash table address to assign a location in a hash table data structure to a code word representing the byte string value and retrieve the code word value from the assigned location;
a second processor coupled to the first processor that stores in a dictionary data structure a linked list of byte strings from the input data stream, each byte string stored in the dictionary data structure being associated with a code word, the second processor comparing byte string values and their associated code words received from the first processor with the stored byte string values associated with those code words in the dictionary data structure, the second processor providing at its output, based on at least some of said comparisons, code words representing byte string values that are repeated in the input data stream; and
a third processor coupled to the second processor that assembles the code words output by the second processor to form a compressed output stream.

2. The system of claim 1, wherein the data paths of each of said plurality of processors comprise a plurality of storage registers that enable multiple bytes of an input data stream to be processed by different ones of said plurality of processors simultaneously.

3. The system of claim 2, wherein said storage registers enable selected results of the processing of previous bytes of the input data stream to be available to complete processing of a current data byte, as needed.

4. The system of claim 3, wherein the data paths and storage registers thereof are arranged such that the selected results of the processing of said previous bytes of the input data stream can be accessed within one clock cycle of said respective processors, at any point in the processing flow of said processors.

5. The system of claim 3, wherein the data paths of the different processors are interconnected such that the data paths represent different levels of a data pipeline formed by that interconnection.

6. The system of claim 2, each processor has a respective input and output and wherein data output from one of said plurality of processors is immediately registered on the input of another of said processors.

7. The system of claim 1, wherein the hash table and dictionary data structures are implemented in separate memory devices thereby enabling simultaneous access to both the hash table and the dictionary data structure by different ones of the first, second, and third processors.

8. The system of claim 7, wherein the separate memory devices each comprise a static random access memory device (SRAM).

9. The system of claim 1, wherein the hash table and dictionary data structures are initialized substantially simultaneously by the first and second processors, respectively.

10. The system of claim 9, wherein initialization data for the hash table is pre-processed and stored in independent read only memory devices associated with the hash table.

11. The system of claim 1, wherein each of said plurality of processors is not programmable, the data paths and respective state machines that comprise each of said processors being hard-coded.

12. The system recited in claim 1 further comprising a forth processor that coordinates and directs the operations of the first, second, and third processors.

13. A system for executing an LZW compression algorithm, the system comprising:
a first processor that performs a hashing function to calculate an index value based upon a byte string value from an input data stream, the index value being used as a hash table address to assign a location in a hash table data structure to a code word representing the byte string value and retrieve the code word value from the assigned location;
a second processor interfaced to the first processor that stores in a dictionary data structure a linked list of byte strings from the input data stream, each byte string stored in the dictionary data structure being associated with a code word, the second processor comparing byte string values and their associated code words received from the first processor with the stored byte string values associated with those code words in the dictionary data structure, the second processor providing at its output, based on at least some of said comparisons, code words representing byte string values that are repeated in the input data stream;
a third processor interfaced to the second processor that assembles the code words output by the second processor to form a compressed output stream;

each of the first, second, and third processors comprising a data path and an associated state machine that controls the flow of data through the data path;

the data paths, under control of the respective state machines, being arranged to provide simultaneous execution of different steps of the LZW compression algorithm on successive bytes of an input stream; and a fourth processor that coordinates and directs the operations of the first, second, and third processors.

14. The system of claim 13, wherein the hash table and dictionary data structures are implemented in separate memory devices thereby enabling simultaneous access to both the hash table and the dictionary data structure by different ones of the first, second, and third processors.

15. The system of claim 14, wherein the separate memory devices each comprise a static random access memory device (SRAM).

16. The system of claim 13, wherein the data paths of the first, second and third processors comprise a plurality of storage registers that enable multiple bytes of the input data stream to be processed by different ones of the first, second, and third processors simultaneously.

17. The system of claim 16, wherein data output from one of the first, second, and third data processors is immediately registered on the input of the next processor.

18. The system of claim 13, wherein said storage registers enable selected results of the processing of previous bytes of the input data stream to be available to complete processing of a current data byte, as needed.

19. The system of claim 18, wherein the data paths and storage registers thereof are arranged such that the selected results of the processing of said previous bytes of the input data stream can be accessed within one clock cycle of said first, second, and third processors, at any point in the processing flow of said processors.

20. The system of claim 13, wherein the hash table and dictionary data structures are initialized substantially simultaneously by the first and second processors, respectively.

21. The system of claim 20, wherein initialization data for the hash table is pre-processed and stored in independent read only memory devices associated with the hash table.

22. The system of claim 13, wherein the interfaces between each of the first, second, and third processors represent different levels of the data pipeline formed by the data paths of the respective processors.

23. The system of claim 22, wherein the data path of each of the first second and third processor defines at least one level of the data pipeline.

24. The system of claim 13, wherein the fourth processor receives commands from an associated microprocessor.

25. The system of claim 24, wherein the commands received from the associated microprocessor comprise one of a software controlled restart command, a command to clear a latched status within the fourth processor and a command to designate one of a software controlled mode or a hardware controlled mode.

26. The system of claim 13, wherein the fourth processor returns a status to a microprocessor.

27. The system of claim 26, wherein the status comprises one of an idle status or an error status.

28. The system of claim 13, wherein the fourth processor outputs a command to one of the first processor, the second processor and the third processor.

29. The system of claim 28, wherein in response to receiving a string compare command from the fourth processor, the first processor, in response to receiving a string byte, determines a hash value for the string byte, and in response to determining that a hash table location associated with the hash value for the string byte is assigned, retrieves a code word for the string byte stored at the hash table location and presents the code word and the byte to the second processor.

30. The system of claim 28, wherein in response to receiving a new hash command from the fourth processor, the first processor calculates the hash index of the next input byte using a specified default value as the initial hash index.

31. The system of claim 28, wherein in response to receiving a rehash command from the fourth processor, the first processor further calculates the hash index of the current input byte using a rehash algorithm.

32. The system of claim 28, wherein in response to receiving a new prefix write command from the fourth processor, the second processor writes a byte received from the first processor and a code word for a current string prefix received from the second processor into the dictionary data structure, returns an newly assigned code word value to the first processor and outputs the code word for a current string prefix to the third processor.

33. The system of claim 28, wherein when a current byte has hashed to an available location in the hash table and the dictionary data structure is not full, a new code word is assigned to a current string prefix and the code word for the current string prefix is output to the third processor.

34. The system of claim 14, wherein the first, second, and third processors are not programmable, the data paths and respective state machines that comprise each of the first, second, and third processors being hard-coded.

35. The system of claim 13, wherein assembling the code words output by the second processor to form a compressed output stream further comprises concatenating the code words into a continuous output stream and segmenting the output data stream into uniform bytes to produce an output file.

* * * * *